(12) United States Patent
Seo et al.

(10) Patent No.: US 9,698,354 B2
(45) Date of Patent: Jul. 4, 2017

(54) LIGHT-EMITTING ELEMENT, LIGHT-EMITTING DEVICE, ELECTRONIC DEVICE, AND LIGHTING DEVICE

(71) Applicant: Semiconductor Energy Laboratory Co., Ltd., Kanagawa-ken (JP)

(72) Inventors: Satoshi Seo, Kanagawa (JP); Tsunenori Suzuki, Kanagawa (JP); Satoko Shitagaki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 890 days.

(21) Appl. No.: 13/941,827

(22) Filed: Jul. 15, 2013

(65) Prior Publication Data

US 2013/0299798 A1  Nov. 14, 2013

Related U.S. Application Data

(62) Division of application No. 12/956,326, filed on Nov. 30, 2010, now Pat. No. 8,486,543.

(30) Foreign Application Priority Data

Dec. 1, 2009 (JP) .................. 2009-273987

(51) Int. Cl.
 *H01L 51/50* (2006.01)
 *H01L 51/00* (2006.01)

(52) U.S. Cl.
 CPC ...... *H01L 51/0071* (2013.01); *H01L 51/0052* (2013.01); *H01L 51/0054* (2013.01);
 (Continued)

(58) Field of Classification Search
 None
 See application file for complete search history.

(56) References Cited

U.S. PATENT DOCUMENTS 6,285,039 B1  9/2001 Kobori et al.
6,566,807 B1  5/2003 Fujita et al.
(Continued)

FOREIGN PATENT DOCUMENTS

CN  001719956 A  1/2006
CN  001851955 A  10/2006
(Continued)

OTHER PUBLICATIONS

Taiwanese Office Action re Application No. TW 099141235, dated Oct. 13, 2015.

(Continued)

*Primary Examiner* — Dawn Garrett
(74) *Attorney, Agent, or Firm* — Husch Blackwell LLP

(57) ABSTRACT

Objects of the present invention are to provide: a light-emitting element having a long lifetime and good emission efficiency and drive voltage. One embodiment of the invention is a light-emitting element including, between an anode and a cathode, at least a stack structure in which a first layer, a second layer, and a light-emitting layer are provided in order from the anode side. The first layer includes a first organic compound and an electron-accepting compound. The second layer includes a second organic compound having a HOMO level differing from the HOMO level of the first organic compound by from −0.2 eV to +0.2 eV. The light-emitting layer includes a third organic compound having a HOMO level differing from the HOMO level of the second organic compound by from −0.2 eV to +0.2 eV and a light-emitting substance having a hole-trapping property with respect to the third organic compound.

31 Claims, 32 Drawing Sheets

(52) U.S. Cl.
CPC ...... *H01L 51/0072* (2013.01); *H01L 51/0073* (2013.01); *H01L 51/0074* (2013.01); *H01L 51/0085* (2013.01); H01L 51/5036 (2013.01); H01L 51/5048 (2013.01); H01L 51/5088 (2013.01); H01L 2251/552 (2013.01)

(56) References Cited

U.S. PATENT DOCUMENTS

| | | | |
|---|---|---|---|
| 6,580,213 | B2 | 6/2003 | Yamazaki |
| 6,603,140 | B2 | 8/2003 | Kobori et al. |
| 6,818,329 | B1 * | 11/2004 | Liao ............... H01L 51/5048 313/504 |
| 6,867,538 | B2 | 3/2005 | Adachi et al. |
| 6,951,694 | B2 | 10/2005 | Thompson et al. |
| 7,158,161 | B2 | 1/2007 | Gyoutoku et al. |
| 7,351,999 | B2 | 4/2008 | Li |
| 7,387,904 | B2 | 6/2008 | Saito et al. |
| 7,462,883 | B2 | 12/2008 | Kumaki et al. |
| 7,521,855 | B2 | 4/2009 | Sakata et al. |
| 7,528,542 | B2 | 5/2009 | Kawamura et al. |
| 7,545,840 | B2 | 6/2009 | Yukawa |
| 7,605,534 | B2 | 10/2009 | Yamazaki et al. |
| 7,615,925 | B2 | 11/2009 | Suzuki et al. |
| 7,626,198 | B2 | 12/2009 | Hirakata et al. |
| 7,649,197 | B2 | 1/2010 | Iwaki et al. |
| 7,649,211 | B2 | 1/2010 | Ohsawa |
| 7,663,304 | B2 | 2/2010 | Fukuoka et al. |
| 7,667,389 | B2 | 2/2010 | Ikeda et al. |
| 7,683,532 | B2 | 3/2010 | Abe et al. |
| 7,700,201 | B2 | 4/2010 | Seo et al. |
| 7,714,501 | B2 | 5/2010 | Nomura et al. |
| 7,732,808 | B2 | 6/2010 | Ikeda et al. |
| 8,053,980 | B2 | 11/2011 | Nomura et al. |
| 8,080,934 | B2 | 12/2011 | Kido et al. |
| 8,101,857 | B2 | 1/2012 | Kido et al. |
| 8,178,869 | B2 | 5/2012 | Ikeda et al. |
| 8,216,696 | B2 | 7/2012 | Kawakami et al. |
| 8,216,875 | B2 | 7/2012 | Ikeda et al. |
| 8,227,982 | B2 | 7/2012 | Iwaki et al. |
| 8,299,458 | B2 | 10/2012 | Terao et al. |
| 8,395,313 | B2 | 3/2013 | Vaufrey et al. |
| 8,436,344 | B2 | 5/2013 | Seo et al. |
| 8,450,727 | B2 | 5/2013 | Kawamura et al. |
| 8,482,193 | B2 | 7/2013 | Kido et al. |
| 8,486,543 | B2 | 7/2013 | Seo et al. |
| 8,507,903 | B2 | 8/2013 | Ikeda et al. |
| 8,679,645 | B2 | 3/2014 | Heil et al. |
| 8,723,025 | B2 | 5/2014 | Kido et al. |
| 9,000,419 | B2 | 4/2015 | Iizumi et al. |
| 9,024,301 | B2 | 5/2015 | Kawamura et al. |
| 9,070,892 | B2 | 6/2015 | Kido |
| 9,224,968 | B2 | 12/2015 | Iwaki et al. |
| 9,466,799 | B2 | 10/2016 | Kido et al. |
| 2002/0093283 | A1 | 7/2002 | Seo et al. |
| 2002/0101154 | A1 | 8/2002 | Seo et al. |
| 2002/0121860 | A1 | 9/2002 | Seo et al. |
| 2002/0139303 | A1 | 10/2002 | Yamazaki et al. |
| 2003/0189401 | A1 | 10/2003 | Kido et al. |
| 2004/0161192 | A1 | 8/2004 | Hamano et al. |
| 2004/0222736 | A1 | 11/2004 | Yoneda |
| 2005/0084712 | A1 | 4/2005 | Kido et al. |
| 2005/0098207 | A1 | 5/2005 | Matsumoto et al. |
| 2005/0116633 | A1 | 6/2005 | Yamazaki et al. |
| 2005/0170208 | A1 | 8/2005 | Yatsunami et al. |
| 2006/0008740 | A1 | 1/2006 | Kido et al. |
| 2006/0043859 | A1 | 3/2006 | Fukuoka et al. |
| 2006/0046096 | A1 | 3/2006 | Nomura et al. |
| 2006/0057427 | A1 | 3/2006 | Tsukahara et al. |
| 2006/0118166 | A1 | 6/2006 | Iwaki |
| 2006/0158104 | A1 | 7/2006 | Iijima et al. |
| 2006/0180812 | A1 | 8/2006 | Sakata et al. |
| 2006/0228822 | A1 | 10/2006 | Hayakawa et al. |
| 2006/0232203 | A1 | 10/2006 | Noda |
| 2006/0243967 | A1 | 11/2006 | Nomura et al. |
| 2006/0250076 | A1 | 11/2006 | Hofmann et al. |
| 2006/0263638 | A1 | 11/2006 | Kawakami et al. |
| 2006/0270066 | A1 | 11/2006 | Imahayashi et al. |
| 2006/0284189 | A1 | 12/2006 | Sakata et al. |
| 2006/0284204 | A1 | 12/2006 | Yamazaki et al. |
| 2006/0292394 | A1 | 12/2006 | Iwaki et al. |
| 2007/0000487 | A1 | 1/2007 | Sakata |
| 2007/0001570 | A1 | 1/2007 | Nomura et al. |
| 2007/0007516 | A1 | 1/2007 | Seo et al. |
| 2007/0013301 | A1 | 1/2007 | Yamazaki et al. |
| 2007/0029929 | A1 | 2/2007 | Nakamura et al. |
| 2007/0075632 | A1 | 4/2007 | Kawakami et al. |
| 2007/0085106 | A1 | 4/2007 | Kawakami et al. |
| 2007/0090756 | A1 | 4/2007 | Okada et al. |
| 2007/0150206 | A1 | 6/2007 | Iwaki et al. |
| 2007/0172699 | A1 | 7/2007 | Nakashima et al. |
| 2007/0182317 | A1 | 8/2007 | Kido et al. |
| 2007/0194306 | A1 | 8/2007 | Yamazaki et al. |
| 2007/0200125 | A1 | 8/2007 | Ikeda et al. |
| 2007/0205713 | A1 | 9/2007 | Okinaka et al. |
| 2007/0210322 | A1 | 9/2007 | Ohsawa et al. |
| 2007/0279560 | A1 | 12/2007 | Ishitani et al. |
| 2008/0006821 | A1 | 1/2008 | Suzuki et al. |
| 2008/0008905 | A1 | 1/2008 | Yamazaki |
| 2008/0017853 | A1 | 1/2008 | Egawa et al. |
| 2008/0057609 | A1 | 3/2008 | Li |
| 2008/0203406 | A1 | 8/2008 | He et al. |
| 2008/0231177 | A1 | 9/2008 | Nomura et al. |
| 2008/0238305 | A1 | 10/2008 | Kondo et al. |
| 2008/0246028 | A1 | 10/2008 | Ikeda et al. |
| 2008/0308794 | A1 | 12/2008 | Ibe et al. |
| 2009/0001879 | A1 | 1/2009 | Ikeda et al. |
| 2009/0001886 | A1 | 1/2009 | Ibe et al. |
| 2009/0004506 | A1 | 1/2009 | Nomura et al. |
| 2009/0015140 | A1 | 1/2009 | Kawakami et al. |
| 2009/0026922 | A1 | 1/2009 | Iwaki et al. |
| 2009/0058261 | A1 | 3/2009 | Kawakami et al. |
| 2009/0058278 | A1 | 3/2009 | Ushikubo et al. |
| 2009/0091246 | A1 | 4/2009 | Tsuji et al. |
| 2009/0102366 | A1 * | 4/2009 | Ushikubo ............... C09K 11/06 313/504 |
| 2009/0102368 | A1 | 4/2009 | Shitagaki et al. |
| 2009/0165854 | A1 | 7/2009 | Yamazaki et al. |
| 2009/0167168 | A1 | 7/2009 | Seo et al. |
| 2009/0200918 | A1 | 8/2009 | Seo et al. |
| 2009/0230847 | A1 | 9/2009 | Iwaki et al. |
| 2009/0236590 | A1 | 9/2009 | Ohsawa |
| 2009/0278445 | A1 | 11/2009 | Jen et al. |
| 2009/0283757 | A1 | 11/2009 | Seo et al. |
| 2009/0284143 | A1 | 11/2009 | Nomura et al. |
| 2010/0059741 | A1 | 3/2010 | Ohsawa et al. |
| 2010/0096622 | A1 | 4/2010 | Iizumi et al. |
| 2010/0123152 | A1 | 5/2010 | Sugisawa et al. |
| 2010/0141129 | A1 | 6/2010 | Fukuoka et al. |
| 2010/0301382 | A1 | 12/2010 | Shitagaki et al. |
| 2010/0301383 | A1 | 12/2010 | Shitagaki et al. |
| 2011/0057171 | A1 | 3/2011 | Adamovich et al. |
| 2011/0057178 | A1 | 3/2011 | Shitagaki et al. |
| 2011/0095678 | A1 | 4/2011 | Ogita et al. |
| 2011/0114928 | A1 | 5/2011 | Suzuki et al. |
| 2013/0299798 | A1 | 11/2013 | Seo et al. |
| 2014/0203215 | A1 | 7/2014 | Heil et al. |
| 2014/0346479 | A1 | 11/2014 | Kido et al. |
| 2015/0249230 | A1 | 9/2015 | Kido |

FOREIGN PATENT DOCUMENTS

| | | |
|---|---|---|
| EP | 1 351 558 A1 | 10/2003 |
| EP | 1 437 395 A2 | 7/2004 |
| EP | 1 617 493 A2 | 1/2006 |
| EP | 1 973 386 A2 | 9/2008 |
| EP | 2067778 A | 6/2009 |
| EP | 2091097 A | 8/2009 |
| EP | 2 117 063 A1 | 11/2009 |
| EP | 2 314 565 A1 | 4/2011 |
| EP | 2 330 102 A1 | 6/2011 |
| EP | 2 330 652 A2 | 6/2011 |
| EP | 2 713 416 A1 | 4/2014 |

(56) References Cited

FOREIGN PATENT DOCUMENTS

| | | |
|---|---|---|
| JP | 9-63771 | 3/1997 |
| JP | 11-307259 | 11/1999 |
| JP | 2003-272860 | 9/2003 |
| JP | 2004-6165 | 1/2004 |
| JP | 2004-204238 A | 7/2004 |
| JP | 2004-235168 | 8/2004 |
| JP | 2005-26121 | 1/2005 |
| JP | 2006-013469 A | 1/2006 |
| JP | 2006-114477 A | 4/2006 |
| JP | 2006-173050 | 6/2006 |
| JP | 2006-173619 A | 6/2006 |
| JP | 2006-279014 | 10/2006 |
| JP | 2007-59848 | 3/2007 |
| JP | 2007-073932 A | 3/2007 |
| JP | 2007-220721 | 8/2007 |
| JP | 2007-220721 A | 8/2007 |
| JP | 2007-294261 | 11/2007 |
| JP | 2008-198801 | 8/2008 |
| JP | 2008-270770 A | 11/2008 |
| JP | 2008-543102 | 11/2008 |
| JP | 2008-545762 | 12/2008 |
| JP | 2009-155323 A | 7/2009 |
| JP | 2009-218581 A | 9/2009 |
| TW | I271119 | 1/2007 |
| TW | I542058 B | 7/2016 |
| WO | WO 2005/031798 A2 | 4/2005 |
| WO | WO 2006/070619 A1 | 7/2006 |
| WO | WO 2006/100889 A1 | 9/2006 |
| WO | WO 2006/115232 A1 | 11/2006 |
| WO | WO 2007/013478 A1 | 2/2007 |
| WO | WO 2008/102644 A1 | 8/2008 |
| WO | WO-2009/069434 | 6/2009 |
| WO | WO 2009/102054 A1 | 8/2009 |
| WO | WO 2009/119591 A1 | 10/2009 |

OTHER PUBLICATIONS

European Office Action re Application No. EP 10193226.7, dated Jul. 7, 2014.
Tang, C.W. et al, "Organic Electroluminescent Diodes," Applied Physics Letters, vol. 51, No. 12, Sep. 21, 1987, pp. 913-915.
Shirota, Y. et al, "Multilayered Organic Electroluminescent Device Using a Novel Starburst Molecule, 4,4',4"-tris(3-Methylphenylphenylamino) Triphenylamine, as a Hole Transport Material," Applied Physics Letters, vol. 65, No. 7, Aug. 15, 1994, pp. 807-809.
Adachi, C. et al, "Molecular Design of Hole Transport Materials for Obtaining High Durability in Organic Electroluminescent Diodes," Applied Physics Letters, vol. 66, No. 20, May 15, 1995, pp. 2679-2681.
Van Slyke, S.A. et al, "Organic Electroluminescent Devices with Improved Stability," Applied Physics Letters, vol. 69, No. 15, Oct. 7, 1996, pp. 2160-2162.
Tsutsui, T. et al., "High Quantum Efficiency in Organic Light-Emitting Devices with Iridium-Complex as a Triplet Emissive Center," Japanese Journal of Applied Physics, vol. 38, part 2, No. 12B, Dec. 15, 1999, pp. L1502-L1504.
Goldsmith, C.R. et al., "C-H Bond Activation by a Ferric Methoxide Complex: Modeling the Rate-Determining Step in the Mechanism of Lipoxygenase," J. Am. Chem. Soc., vol. 124, No. 1, 2002, pp. 83-96.
Onishi.T et al, *High Molecular EL Materials—Development of Light-Emitting High Molecular Compounds*, "A Method of Measuring an Energy Level," Kyoritsu Shuppan, Dec. 25, 2004, pp. 64-67 (with English translation, pp. 1-3).
European Search report re application No. EP 10193226.7, dated Oct. 7, 2011.
Office Action re European application No. EP 10193226.7, dated Sep. 25, 2012.
Taiwanese Office Action re Application No. TW 105113279, dated Apr. 18, 2017.
Chinese Office Action re Application No. CN 201510441091.7, dated May 2, 2017.

* cited by examiner

PRIOR ART

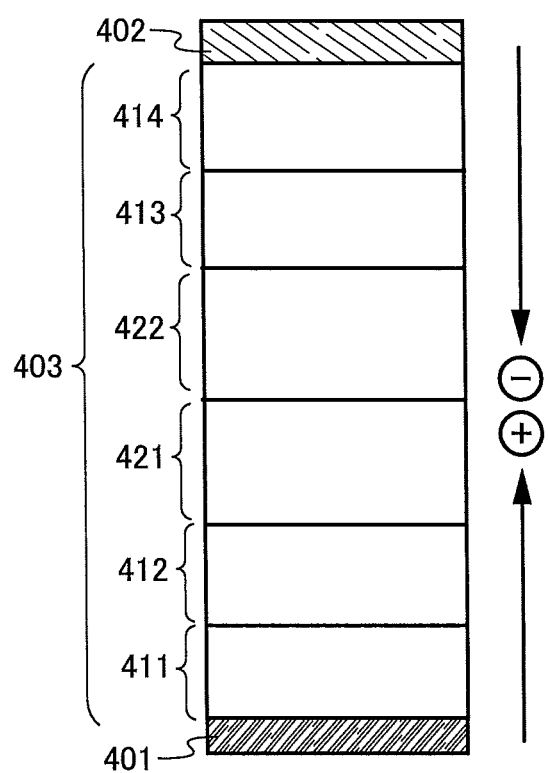

LIGHT-EMITTING ELEMENT, LIGHT-EMITTING DEVICE, ELECTRONIC DEVICE, AND LIGHTING DEVICE

This application is a divisional of copending U.S. application Ser. No. 12/956,326 filed on Nov. 30, 2010 which is incorporated herein by reference.

BACKGROUND OF THE INVENTION

1. Field of the Invention

The present invention relates to a light-emitting element, a light-emitting device, an electronic device, and a lighting device.

2. Description of the Related Art

In recent years, research and development have been extensively conducted on light-emitting elements using electroluminescence (EL). In the basic structure of such a light-emitting element, a layer which contains a substance having a light-emitting property is interposed between a pair of electrodes. By voltage application to this element, the substance having a light-emitting property can emit light.

Since such light-emitting elements are self-luminous elements, they have advantages over liquid crystal displays in having high visibility of pixels and eliminating the need for a backlight, for example, thereby being considered as suitable for flat panel display elements. Also, above-described light-emitting elements have an advantage in that they can be thin and lightweight, and also have a feature of very high speed response.

Furthermore, since such light-emitting elements can be formed in a film form, they make it easy to provide planar light emission, thereby achieving large-area elements utilizing planar light emission. Such a feature is difficult to obtain with point light sources typified by incandescent lamps and LEDs or linear light sources typified by fluorescent lamps. Thus, light-emitting elements can be very effectively used as planar light sources applicable to lightings and the like.

Light-emitting elements using electroluminescence are broadly classified according to whether they use an organic compound or an inorganic compound as a substance having a light-emitting property.

In the case where the substance having a light-emitting property is an organic compound, voltage application to a light-emitting element enables injection of holes from an anode and electrons from a cathode into a layer containing the organic compound having a light-emitting property, so that a current flows. Then, the carriers (electrons and holes) recombine, whereby the organic compound having a light-emitting property is brought into an excited state. When the excited state returns to a ground state, light is emitted. In general, an organic EL element refers to such a light-emitting element which uses an organic compound having a light-emitting property and can be excited with a current.

Excited states of organic compounds can be a singlet state and a triplet state. The ground state of organic compounds that are generally used for organic EL elements is a singlet state. Light emission from a singlet excited state is called fluorescence, while that from a triplet excited state is called phosphorescence.

Proposal of a heterostructure in which layers of different organic compounds are stacked has brought about significant development of such light-emitting elements (see Non-Patent Document 1). That is because adopting a heterostructure increases carrier recombination efficiency and then improves emission efficiency. In Non-Patent Document 1, a hole-transport layer and a light-emitting layer having an electron-transport property are stacked.

Further, considerable researches have been conducted on correlation of the heterostructure with drive voltage or with lifetime. For example, it was reported that, in an element having a hole-transport layer in contact with an anode, the ionization potential of the hole-transport layer affects the lifetime (see Non-Patent Document 2). The element disclosed in Non-Patent Document 2 can have a longer lifetime as the ionization potential of the hole-transport layer decreases. It was also reported that the lifetime of an element is extended by providing a hole-injection layer having a low ionization potential between an anode and a hole-transport layer (see Non-Patent Documents 3 and 4).

REFERENCES

Non-Patent Documents

[Non-Patent Document 1] C. W. Tang et al., Applied Physics Letters, Vol. 51, No. 12, pp. 913-915, 1987.

[Non-Patent Document 2] Chihaya Adachi et al., Applied Physics Letters, Vol. 66, No. 20, pp. 2679-2681, 1995.

[Non-Patent Document 3] Yasuhiko Shirota et al., Applied Physics Letters, Vol. 65, No. 7, pp. 807-809, 1994.

[Non-Patent Document 4] S. A. Van Slyke et al., Applied Physics Letters, Vol. 69, No. 15, pp. 2160-2162, 1996.

SUMMARY OF THE INVENTION

According to Non-Patent Documents 2 to 4, the ionization potential (i.e., HOMO level) of an organic material in a hole-injection layer in contact with an anode is preferably a level that is as close as possible to the work function of the anode. Hence, in the case of a light-emitting element having a stack of a hole-injection layer, a hole-transport layer, and a light-emitting layer, the element is designed such that the work function of an anode and the HOMO levels of the hole-injection layer, the hole-transport layer, and the light-emitting layer have a stepped shape, as illustrated in FIG. 2 in Non-Patent Document 3. In other words, materials of the hole-injection layer and the hole-transport layer are selected such that the work function of the anode and the HOMO levels of the hole-injection layer, the hole-transport layer and the light-emitting layer are arranged in order of slightly decreasing from the work function of the anode to the HOMO level of the light-emitting layer.

Such a design of the stepped shape has been regarded as the standard design of an organic EL element so far. On the basis of the above element design, various materials of a hole-injection layer, a hole-transport layer, and a light-emitting layer have been studied to find the material combination that realizes the most improved lifetime or efficiency. This has been the current of the development of organic EL elements and is still the mainstream.

However, the above design causes difficulty with an increasing difference between the work function of an anode and the HOMO level of a light-emitting layer. This is because a reduction in hole-injection barrier between the anode and light-emitting layer needs many steps of HOMO levels, i.e., needs a large number of layers to be interposed between the anode and the light-emitting layer. Such an element is not practical. Two layers at the most, a hole-injection layer and a hole-transport layer, are included in a light-emitting element usually.

Therefore, a hole-injection barrier between a hole-injection layer and a hole-transport layer or between a hole-transport layer and a light-emitting layer is able to be reduced but difficult to substantially remove. As regards light-emitting elements that emits blue light or phosphorescence-emitting elements in particular, the energy gap of a material (especially the host material) of a light-emitting layer is large, and its HOMO level tends to be considerably low accordingly. This increases the difference between the work function of the anode and the HOMO level of the light-emitting layer, causing a large hole-injection barrier. In many cases, the hole-injection barrier between a hole-transport layer and a light-emitting layer tends to be large.

The present inventors have found that such hole-injection barriers are now becoming a problem to lifetime, through improvements in the material and structure of a light-emitting layer. To be more precise, the inventors recognized that, although a light-emitting layer was a factor of limiting lifetime when Non-Patent Documents 2 to 4 were published, these days when a light-emitting layer is being improved, a hole-injection barrier in the design of a stepped shape is increasingly problematic.

Further, adopting a conventional heterostructure ensures emission efficiency but may increase or significantly decrease lifetime depending on the adopted heterostructure (kinds of the materials). The cause of this phenomenon has not been identified. Thus, such a phenomenon tends to be attributed to merely affinity between materials at present, and a principle in material combination is yet to be established.

Consequently, by designing an element which is unlike a conventional heterostructure, the present inventors have attempted to produce a long lifetime light-emitting element without adversely affecting drive voltage and emission efficiency. The inventors have also conducted detailed researches into material combinations in designing such an element.

Thus, an object of the present invention is to provide a light-emitting element having a long lifetime. Another object is to provide a light-emitting element with good emission efficiency and drive voltage.

Still another object is to provide a light-emitting device having a long lifetime and low power consumption by using the light-emitting element of the present invention, and also an electronic device and a lighting device having a long lifetime and low power consumption.

First, the present inventors have found an element structure where hole-injection barriers between the layers from an anode to a light-emitting layer are substantially removed. The inventors have found through the further detailed studies that, in such an element structure, a substance having a hole-trapping property as a light-emitting substance is added to a light-emitting layer thereby achieving the objects.

One embodiment of the present invention is therefore a light-emitting element including, between an anode and a cathode, at least a stack structure in which a first layer, a second layer, and a light-emitting layer are provided in this order from the anode side. The first layer includes a first organic compound and an electron-accepting compound. The second layer includes a second organic compound having a HOMO level differing from a HOMO level of the first organic compound by greater than or equal to −0.2 eV and less than or equal to +0.2 eV. The light-emitting layer includes a third organic compound having a HOMO level differing from the HOMO level of the second organic compound by greater than or equal to −0.2 eV and less than or equal to +0.2 eV and a light-emitting substance having a hole-trapping property with respect to the third organic compound.

In this specification, an "anode" means an electrode releasing holes and a "cathode" means an electrode receiving holes released from an anode. Also, a "cathode" means an electrode releasing electrons and an "anode" means an electrode receiving electrons released from an anode.

Hole-transport skeletons of organic compounds used for the hole-injection layer, the hole-transport layer, and the light-emitting layer are preferably the same. One embodiment of the present invention is therefore a light-emitting element including, between an anode and a cathode, at least a stack structure in which a first layer, a second layer, and a light-emitting layer are provided in this order from the anode side. The first layer includes a first organic compound having a first hole-transport skeleton and an electron-accepting compound. The second layer includes a second organic compound having a second hole-transport skeleton. The light-emitting layer includes a third organic compound having a third hole-transport skeleton and a light-emitting substance having a hole-trapping property with respect to the third organic compound. The first hole-transport skeleton, the second hole-transport skeleton, and the third hole-transport skeleton are the same.

Here, the present inventors have found that, when particular skeletons are applied to the hole-transport skeletons of organic compounds used for the hole-injection layer, the hole-transport layer, and the light-emitting layer, hole-injection barriers between the layers are reduced. Furthermore, by addition of an electron-accepting compound to the hole-injection layer, the hole-injection barrier between the anode and the hole-injection layer can also be reduced. One embodiment of the present invention is therefore a light-emitting element including, between an anode and a cathode, at least a stack structure in which a first layer, a second layer, and a light-emitting layer are provided in this order from the anode side. The first layer includes a first organic compound having a first hole-transport skeleton and an electron-accepting compound. The second layer includes a second organic compound having a second hole-transport skeleton. The light-emitting layer includes a third organic compound having a third hole-transport skeleton and a light-emitting substance having a hole-trapping property with respect to the third organic compound. The first hole-transport skeleton, the second hole-transport skeleton, and the third hole-transport skeleton each separately include a skeleton of at least any one of a π excessive heteroaromatic ring, a tricyclic condensed aromatic hydrocarbon ring, and a tetracyclic condensed aromatic hydrocarbon ring.

The hole-transport skeleton is preferably a skeleton of at least any one of carbazole, dibenzofuran, dibenzothiophene, and anthracene.

Further, even when any particular one of the above-described skeletons is used as the hole-transport skeletons, the hole-transport skeletons of the organic compounds used for the hole-injection, hole-transport, and light-emitting layers are preferably the same. One embodiment of the present invention is therefore a light-emitting element including, between an anode and a cathode, at least a stack structure in which a first layer, a second layer, and a light-emitting layer are provided in this order from the anode side. The first layer includes a first organic compound having a first hole-transport skeleton and an electron-accepting compound. The second layer includes a second organic compound having the first hole-transport skeleton. The light-emitting layer includes a third organic compound having the first hole-transport skeleton and a light-emitting substance having a hole-trapping property with respect to the third organic compound. The first hole-transport skeleton includes a skeleton of at least any one of a π excessive heteroaromatic ring, a tricyclic condensed aromatic ring, and a tetracyclic condensed aromatic ring.

The hole-transport skeleton is preferably a skeleton of at least any one of carbazole, dibenzofuran, dibenzothiophene, and anthracene.

In the above structures of a light-emitting element, the light-emitting substance is preferably an aromatic amine compound or an organometallic complex, because they each have a high hole-trapping property. In particular, a pyrene diamine compound or an iridium complex is preferable because they each have not only a high hole-trapping property but also high emission efficiency.

The present inventors have found that, in the above-described light-emitting element of one embodiment of the present invention, provision of another light-emitting layer that meets particular conditions further suppresses the phenomenon in which holes pass to the cathode, thereby significantly improving both a lifetime and emission efficiency. One embodiment of the present invention is therefore a light-emitting element including, between an anode and a cathode, at least a stack structure in which a first layer, a second layer, a first light-emitting layer, and a second light-emitting layer are provided in this order from the anode side. The first layer includes a first organic compound and an electron-accepting compound. The second layer includes a second organic compound having a HOMO level differing from a HOMO level of the first organic compound by greater than or equal to −0.2 eV and less than or equal to +0.2 eV. The first light-emitting layer includes a third organic compound having a HOMO level differing from the HOMO level of the second organic compound by greater than or equal to −0.2 eV and less than or equal to +0.2 eV and a first light-emitting substance having a hole-trapping property with respect to the third organic compound. The second light-emitting layer includes: a fourth organic compound having a HOMO level differing from the HOMO level of the third organic compound by greater than or equal to −0.2 eV and less than or equal to +0.2 eV and having a LUMO level differing from a LUMO level of the third organic compound by greater than or equal to −0.2 eV and less than or equal to +0.2 eV; and a second light-emitting substance having a hole-trapping property with respect to the fourth organic compound. The fourth organic compound and the third organic compound are different compounds.

In this specification, "holes pass to the cathode" refers to the phenomenon in which holes injected from the anode pass to the cathode side without recombining with electrons.

Hole-transport skeletons of organic compounds used for the hole-injection layer, the hole-transport layer, the first light-emitting layer, and the second light-emitting layer are preferably the same. Moreover, electron-transport skeletons of the first and second light-emitting layers are preferably the same. One embodiment of the present invention is therefore a light-emitting element including, between an anode and a cathode, at least a stack structure in which a first layer, a second layer, a first light-emitting layer, and a second light-emitting layer are provided in this order from the anode side. The first layer includes a first organic compound having a first hole-transport skeleton and an electron-accepting compound. The second layer includes a second organic compound having a second hole-transport skeleton. The first light-emitting layer includes: a third organic compound having a third hole-transport skeleton and an electron-transport skeleton; and a first light-emitting substance having a hole-trapping property with respect to the third organic compound. The second light-emitting layer includes: a fourth organic compound having a fourth hole-transport skeleton and the electron-transport skeleton; and a second light-emitting substance having a hole-trapping property with respect to the fourth organic compound. The fourth organic compound and the third organic compound are different compounds. The first hole-transport skeleton, the second hole-transport skeleton, the third hole-transport skeleton, and the fourth hole-transport skeleton are the same.

Here, the present inventors have found that, when particular skeletons are applied to hole-transport skeletons of organic compounds used for the hole-injection layer, the hole-transport layer, the first light-emitting layer, and the second light-emitting layer, hole-injection barriers between the layers are reduced. Furthermore, by addition of an electron-accepting compound to the hole-injection layer, the hole-injection barrier between the anode and the hole-injection layer can also be reduced. One embodiment of the present invention is therefore a light-emitting element including, between an anode and a cathode, at least a stack structure in which a first layer, a second layer, a first light-emitting layer, and a second light-emitting layer are provided in this order from the anode side. The first layer includes a first organic compound having a first hole-transport skeleton and an electron-accepting compound. The second layer includes a second organic compound having a second hole-transport skeleton. The first light-emitting layer includes: a third organic compound having a third hole-transport skeleton and an electron-transport skeleton; and a first light-emitting substance having a hole-trapping property with respect to the third organic compound. The second light-emitting layer includes: a fourth organic compound having a fourth hole-transport skeleton and the electron-transport skeleton; and a second light-emitting substance having a hole-trapping property with respect to the fourth organic compound. The fourth organic compound and the third organic compound are different compounds. The first hole-transport skeleton, the second hole-transport skeleton, the third hole-transport skeleton, and the fourth hole-transport skeleton each separately include a skeleton of at least any one of a π excessive heteroaromatic ring, a tricyclic condensed aromatic ring, and a tetracyclic condensed aromatic ring.

The hole-transport skeleton is preferably a skeleton of at least any one of carbazole, dibenzofuran, dibenzothiophene, and anthracene.

Further, even when any particular one of the above-described skeletons is used as the hole-transport skeletons, the hole-transport skeletons of the organic compounds used for the hole-injection, hole-transport, first light-emitting, and second light-emitting layers are preferably the same. One embodiment of the present invention is therefore a light-emitting element including, between an anode and a cathode, at least a stack structure in which a first layer, a second layer, a first light-emitting layer, and a second light-emitting layer are provided in this order from the anode side. The first layer includes a first organic compound having a first hole-transport skeleton and an electron-accepting compound. The second layer includes a second organic compound having the first hole-transport skeleton. The first light-emitting layer includes: a third organic compound having the first hole-transport skeleton and an electron-transport skeleton; and a first light-emitting substance having a hole-trapping property with respect to the third organic compound. The second light-emitting layer includes: a fourth organic compound having the first hole-transport skeleton and the electron-transport skeleton; and a second light-emitting substance having a hole-trapping property with respect to the fourth organic compound. The fourth organic compound and the third organic compound are different compounds. The first hole-transport skeleton includes a skeleton of at least any one of a π excessive heteroaromatic ring, a tricyclic condensed aromatic ring, and a tetracyclic condensed aromatic ring.

The hole-transport skeleton is preferably a skeleton of at least any one of carbazole, dibenzofuran, dibenzothiophene, and anthracene.

Here, for higher carrier recombination efficiency in the structure including the first and second light-emitting layers as described above, it is preferable that the hole-transport property of the first light-emitting layer be higher than that of the second light-emitting layer, and the electron-transport property of the first light-emitting layer be lower than that of the second light-emitting layer.

Preferably, the first light-emitting substance and the second light-emitting substance are each separately an aromatic amine compound or an organometallic complex, because they have a high hole-trapping property. In particular, a pyrene diamine compound or an iridium complex is preferable because they have not only a high hole-trapping property but also high emission efficiency.

One embodiment of the present invention covers the structure where the first light-emitting substance and the second light-emitting substance are the same, because such a structure gives an effect of the present invention.

A feature of the above-described light-emitting element is that the hole-injection layer is formed using an organic compound having a HOMO level close to that of the light-emitting layer, i.e., an organic compound having a HOMO level which is greatly deeper than in a conventional light-emitting element. One embodiment of the present invention is therefore a light-emitting element including the first organic compound having a HOMO level greater than or equal to −6.0 eV and less than or equal to −5.7 eV.

In the above-described light-emitting element, a plurality of stack structures (where the first layer, the second layer, and the light-emitting layer are provided, or where the first layer, the second layer, the first light-emitting layer, and the second light-emitting layer are provided) may be provided between the anode and the cathode.

One embodiment of the present invention is therefore a light-emitting element including, between an anode and a cathode, at least a stack structure in which a first layer, a second layer, and a light-emitting layer are provided in this order from the anode side. The first layer includes a first organic compound and an electron-accepting compound. The second layer includes a second organic compound having a HOMO level differing from a HOMO level of the first organic compound by greater than or equal to −0.2 eV and less than or equal to +0.2 eV. The light-emitting layer includes a third organic compound having a HOMO level differing from the HOMO level of the second organic compound by greater than or equal to −0.2 eV and less than or equal to +0.2 eV, a light-emitting substance having a hole-trapping property with respect to the third organic compound, and a substance having a light-emitting property.

The light-emitting element includes the substance having a light-emitting property having excitation energy lower than or equal to that of the light-emitting substance having a hole-trapping property.

The above-described light-emitting element of one embodiment of the present invention has effectiveness such as its applicability to a variety of light-emitting devices. The present invention therefore also includes a light-emitting device using the above-described light-emitting element which is one embodiment of the present invention. Note that in this specification, the light-emitting device means an image display device, a light-emitting device, or a light source. Further, the category of the light-emitting device of the present invention includes a module including a light-emitting element, to which a connector such as a flexible printed circuit (FPC) or a tape automated bonding (TAB) tape such as an anisotropic conductive film or a tape carrier package (TCP) is attached; a module in which an end of a connector is provided with a printed wiring board; and a module in which an integrated circuit (IC) is directly mounted on a substrate provided with a light-emitting element by a chip on glass (COG) method.

The above-described light-emitting device which is one embodiment of the present invention has effectiveness such as its applicability to display portions, light-emitting portions, light sources, and the like of a variety of electronic devices. The present invention therefore also includes an electronic device having the light-emitting device which is one embodiment of the present invention.

The above light-emitting device which is one embodiment of the present invention has effectiveness in a variety of lighting devices such as light sources. Thus, the present invention also includes a lighting device using the above-described light-emitting device which is one embodiment of the present invention.

By applying the present invention, it is possible to provide a light-emitting element having a long lifetime and also provide a light-emitting element having excellent emission efficiency and drive voltage.

Further, it is possible to provide a light-emitting device having a long lifetime and low power consumption, and an electronic device and a lighting device having a long lifetime and low power consumption.

BRIEF DESCRIPTION OF THE DRAWINGS

FIG. 5 illustrates a light-emitting element according to Example.

DETAILED DESCRIPTION OF THE INVENTION

Embodiments of the present invention will now be described in detail using the accompanying drawings. Note that the invention is not limited to the description below, and it will be easily understood by those skilled in the art that various changes and modifications can be made without departing from the spirit and scope of the invention. Therefore, the invention should not be construed as being limited to the description in the following embodiments.

In this specification, when Substance A is dispersed in a matrix formed of Substance B, Substance B forming the matrix is called a host material and Substance A dispersed in the matrix is called a guest material. Note that Substance A and Substance B may be separately a single substance or a mixture of two or more kinds of substances.

Further, in this specification, the "HOMO level" means a level of the highest occupied molecular orbital, and the "LUMO level" means a level of the lowest unoccupied molecular orbital.

Note that in this specification, "having a high HOMO level or a high LUMO level" means having a high energy level, and "having a low HOMO level or a low LUMO level" means having a low energy level. For example, it can be said that Substance A having a HOMO level of −5.5 eV has a lower HOMO level by 0.3 eV than Substance B having a HOMO level of −5.2 eV and has a higher HOMO level by 0.2 eV than Substance C having a HOMO level of −5.7 eV.

(Embodiment 1)

Embodiment 1 will provide descriptions of a structure of a light-emitting element which is one embodiment of the present invention referring to a material to be used and a fabrication method. In Embodiment 1, a region interposed between an anode and a cathode is called an EL layer.

Figure 1A:
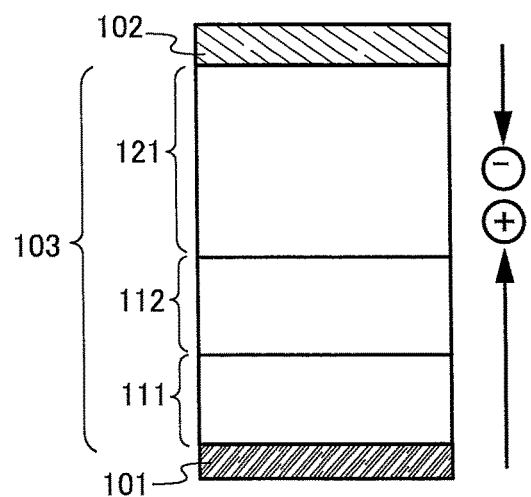
FIGS. 1A and 1B illustrate a light-emitting element according to Embodiment.
Figure 1B:
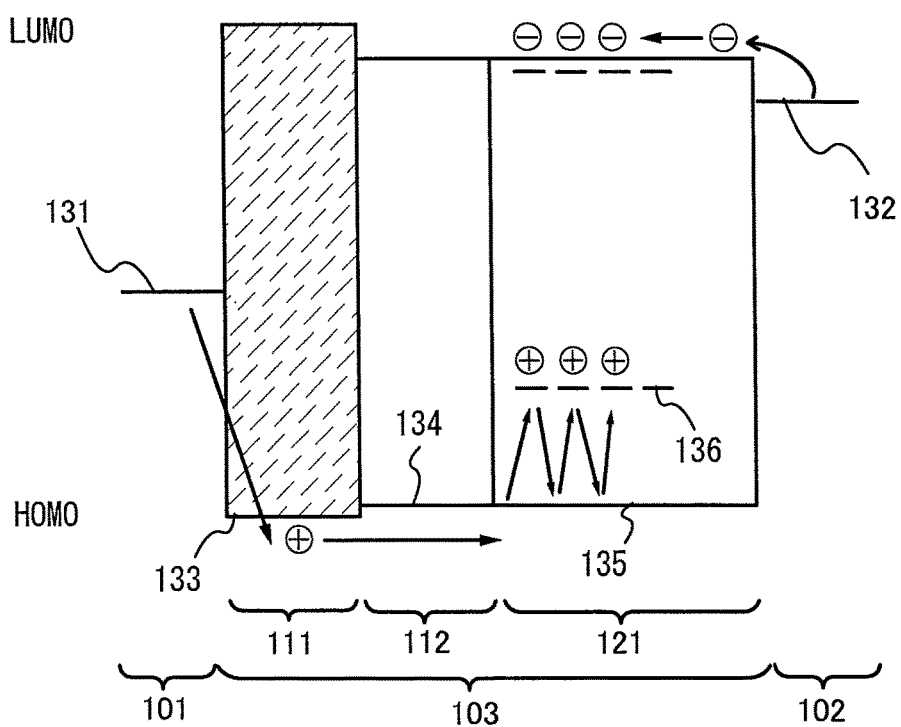

First, FIGS. 1A and 1B illustrate respectively a conceptual element structure and its band diagram of the light-emitting element of one embodiment of the present invention. For comparison, FIGS. 2A and 2B illustrate respectively a conceptual element structure and its band diagram of a conventional light-emitting element.

Figure 2A:
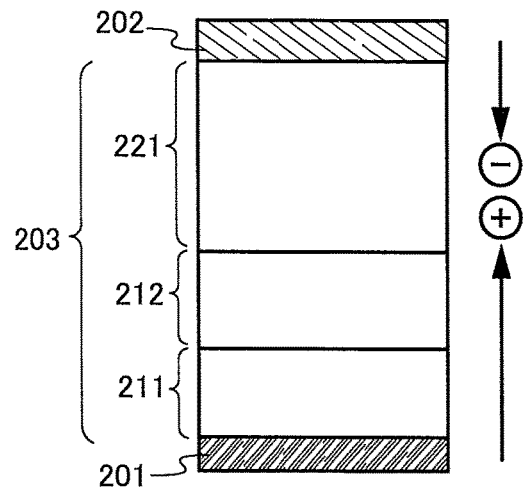
FIGS. 2A and 2B illustrate a conventional light-emitting element.

FIG. 2A illustrates the element structure of the conventional light-emitting element as described in, for instance, Non-Patent Document 3, which has an EL layer 203 provided between an anode 201 and a cathode 202. The EL layer 203 has a stack structure where a hole-injection layer 211, a hole-transport layer 212, and a light-emitting layer 221 are provided in order from the anode 201.

Figure 2B:
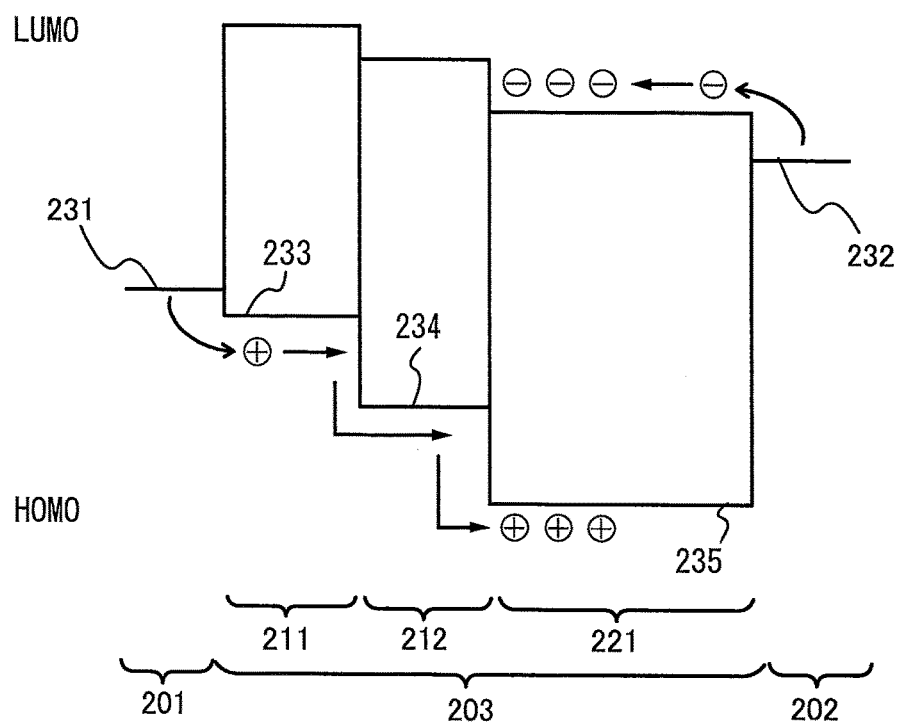

According to a conventional assumption, it has been considered preferable that a HOMO level 233 of the hole-injection layer 211 in contact with the anode 201 be a level as close as possible to a work function 231 of the anode 201, as illustrated in FIG. 2B. Hence, the HOMO level 233 of the hole-injection layer, a HOMO level 234 of the hole-transport layer, and a HOMO level 235 of the light-emitting layer are designed to have a stepped shape in order of decreasing HOMO level. Holes can transport through these HOMO levels and, in the light-emitting layer 221, recombine with electrons injected from the cathode 202, whereby light is emitted. Note that reference numeral 232 denotes the work function of the cathode.

With the increasing energy gap of a material (especially the host material) of the light-emitting layer, the HOMO level 235 of the light-emitting layer tends to decrease. In that case, there is a large difference between the work function 231 of the anode and the HOMO level 235 of the light-emitting layer. Thus, in the conventional light-emitting element, a hole-injection barrier is very large at least either between the HOMO level 233 of the hole-injection layer and the HOMO level 234 of the hole-transport layer or between the HOMO level 234 of the hole-transport layer and the HOMO level 235 of the light-emitting layer. In many cases, the hole-injection barrier between the hole-transport layer 212 and the light-emitting layer 221 tends to be large.

Further, with a conventional light-emitting element, it has been considered important that such a hole-injection barrier is rather utilized in order to accumulate holes and prevent them from passing to the cathode, thereby obtaining high emission efficiency. A means for preventing holes from passing to the cathode which is under thorough consideration is the provision of a hole-blocking layer which generates a large hole-injection barrier between the light-emitting layer and the cathode, for example. Such use of a barrier for higher emission efficiency is the original concept in a conventional light-emitting element that has a heterostructure.

However, the present inventors have recognized such hole-injection barriers as becoming a problem to lifetime as described above, leading to this invention. FIG. 1A illustrates the conceptual element structure of a light-emitting element of one embodiment of the present invention, and an EL layer 103 is provided between an anode 101 and a cathode 102. The EL layer 103 at least has a stack structure where a first layer 111, a second layer 112, and a light-emitting layer 121 are provided in order from the anode 101. Further, the first layer 111 contains a first organic compound and an electron-accepting compound. The second layer 112 contains a second organic compound. The light-emitting layer 121 contains a third organic compound and a light-emitting substance having a hole-trapping property with respect to the third organic compound.

First, the present inventors have considered substantially equalizing a HOMO level 133 of the first organic compound in the first layer and a HOMO level 134 of the second organic compound in the second layer, as illustrated in FIG. 1B. Similarly, the inventors have considered substantially equalizing the HOMO level 134 of the second organic compound in the second layer and a HOMO level 135 of the third organic compound in light-emitting layer. Hence, hole-injection barriers between the first layer 111 and the second layer 112 and between the second layer 112 and the light-emitting layer 121 are each extremely reduced.

In this specification, the HOMO levels that are substantially equalized mean, specifically, HOMO levels that differ from each other by greater than or equal to −0.2 eV and less than or equal to +0.2 eV. This is because electrochemical reaction energies differing by 0.2 eV or less can be regarded as roughly the same electrochemical reaction energy; usually, in the case where the electrochemical reaction energy difference between two kinds of substances is 0.2 eV or less, both two types of electrochemical reactions occur (on the other hand, if the difference greatly exceeds 0.2 eV, only one type of electrochemical reaction occurs selectively). The experiment described later in Example also shows that an effect of the invention can be obtained with a HOMO level difference greater than or equal to −0.2 eV and less than or equal to +0.2 eV. A HOMO level difference greater than or equal to −0.1 eV and less than or equal to +0.1 eV is further preferable to achieve an effect of the invention to a higher extent.

With the increasing energy gap of the third organic compound in the light-emitting layer 121, the HOMO level 135 of the third organic compound tends to decrease. Therefore, when the above structure reduces the hole-injection barriers between the first layer 111 and the second layer 112 and between the second layer 112 and the light-emitting layer 121, all the HOMO levels of the first, second, and third organic compounds become significantly lower than the work function 131 of the anode. Accordingly, a large hole-injection barrier is formed between the work function 131 of the anode and the HOMO level 133 of the first organic compound, which hampers hole injection from the anode 101 to the first layer 111.

Accordingly, as a solution to this barrier at the anode interface, the present inventors have considered adding the electron-accepting compound to the first layer 111. By the addition of the electron-accepting compound to the first layer 111, holes are injected smoothly even when there is a gap between the work function 131 of the anode and the HOMO level 133 of the first organic compound included in the first layer 111; thus, the hole-injection barrier is substantially removed. As the first layer 111, the electron-accepting compound and the first organic compound may be combined, or may be layered in order from the anode.

The above-described structure substantially removes hole-injection barriers between the layers from the anode to the light-emitting layer which have been problematic in a conventional element. However, it has been found that merely adopting such a structure causes holes to easily pass to the cathode, leading to lower emission efficiency. It has been also found that the structure causes an electron-transport layer to emit light in the case where it is provided between the light-emitting layer 121 and the cathode 102.

In order to prevent holes from passing to the cathode without using a barrier (a block to holes), adding a substance having a hole-trapping property is effective. The present inventors have thoroughly examined the kinds of the substance having a hole-trapping property and a region where the substance is to be added. The inventors have accordingly found that, by making a light-emitting substance added to a light-emitting layer have a hole-trapping property, the above problem can be solved without increasing drive voltage. In order that holes be trapped by the light-emitting substance, the third organic compound and the light-emitting substance having a hole-trapping property are preferably a host material and a guest material, respectively. Further, a HOMO level 136 of the light-emitting substance having a hole-trapping property is preferably higher than the HOMO level 135 of the third organic compound by 0.3 eV or more in view of the above-described electrochemical selectivity.

Merely preventing holes from passing to the cathode for higher emission efficiency can be achieved also by adding a material for trapping holes between the anode 101 and the light-emitting layer 121. However, such a technique reduces the speed of hole transport until holes reach the light-emitting layer 121 to emit light, thereby inevitably increasing drive voltage. Further, a carrier recombination region might approach the anode to cause electrons to pass to the anode, thereby lowering emission efficiency. In contrast, in the structure of one embodiment of the present invention illustrated in FIGS. 1A and 1B, holes are transported from the anode 101 to the light-emitting layer 121 without influence of a barrier or a trap, and accordingly the drive voltage increase can be minimized In short, it is preferable that a material having a hole-trapping property be not added to the second layer.

Furthermore, as illustrated in FIG. 1B, the holes that reach the light-emitting layer 121 are trapped at the HOMO level 136 of the light-emitting substance having a hole-trapping property, and the holes suddenly reduce their moving speed in the light-emitting layer 121. Then, these holes reducing their moving speed and electrons injected from the cathode 102 recombine efficiently, resulting in highly efficient light emission. In FIG. 1B, reference numeral 132 denotes the work function of the cathode. Further, electrons need to be transported sufficiently in the light-emitting layer 121 in terms of drive voltage. It is preferable, therefore, that the third organic compound which is the host material of the light-emitting layer 121 have not only a hole-transport property but also an electron-transport property. That is, the third organic compound is preferably a bipolar material.

In this specification, the "bipolar material" means a material that is capable of injecting holes (reaction in which electrons are taken away) and injecting electrons (reaction in which electrons are received) in an EL layer, relatively stable in each reaction, and capable of transporting both holes and electrons sufficiently.

As described above, what is important in the light-emitting element of one embodiment of the present invention is that holes are smoothly transported from the anode to the light-emitting layer without encountering a barrier or a trap and the holes reduce their moving speed in the light-emitting layer without using a barrier thereby leading to highly efficient recombination. Avoiding use of a barrier makes it difficult to cause a phenomenon in which accumulation or concentration of holes or electrons on a small region (the vicinity of the barrier) occurs to promote deterioration, whereby it is possible to contribute to a longer lifetime. Further, there is no substantial hole-injection barrier or hole trap between the layers from the anode to the light-emitting layer, and accordingly, drive voltage can be lowered. Furthermore, since the light-emitting substance having a hole-trapping property is used for the light-emitting layer to reduce the speed of hole transport not outside but inside the light-emitting layer, holes and electrons can efficiently recombine even without using a barrier; thus, a light-emitting element having high emission efficiency as well as a long lifetime can be realized. Moreover, since holes are trapped by the light-emitting substance itself which has a hole-trapping property, holes and electrons can efficiently recombine; thus, a light-emitting element having high emission efficiency can be achieved.

In view of the above, the light-emitting layer 121 preferably has a lower hole-transport property than the second layer 112. To make the hole-transport property of the light-emitting layer 121 lower than that of the second layer 112, for instance, the second organic compound and the third organic compound may be the same compound. By such a technique, the light-emitting layer 121 has a lower hole-transport property than the second layer 112 because the light-emitting layer 121 includes the light-emitting substance having a hole-trapping property.

On the basis of the above points, concepts and specific examples of materials applicable to the first, second, and third organic compounds will be described below.

As described above, one of the points of the present invention is to substantially remove the hole-injection barriers between the first and second organic compounds and between the second and third organic compounds. As one technique therefor, the present inventors have proposed that hole-transport skeletons of the first, second, and third organic compounds be the same.

The "hole-transport skeleton" means a part or the whole of a skeleton of a compound where the HOMO is distributed. Distribution of the HOMO can be found by molecular orbital calculations. When the hole-transport skeletons of the compounds (the first, second, and third organic compounds in Embodiment 1) are the same, the HOMO levels of the compounds are close to one another, whereby electrochemical barriers between the compounds are reduced.

Figure 6A:
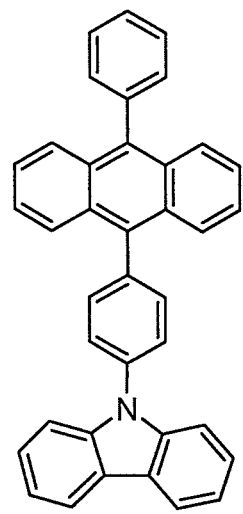
FIGS. 6A to 6C illustrate a compound used for a light-emitting element according to Embodiment.
Figure 6B:
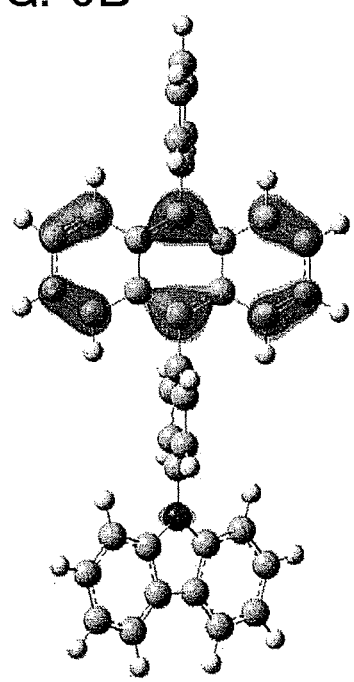
Figure 6C:
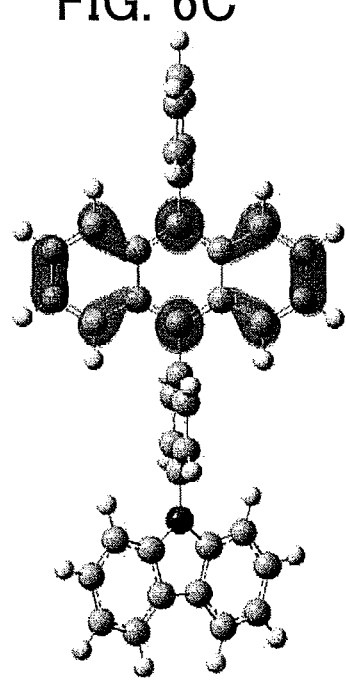
Figure 7A:
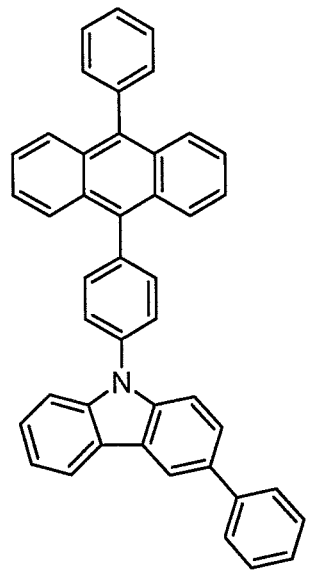
FIGS. 7A to 7C illustrate a compound used for a light-emitting element according to Embodiment.
Figure 7B:
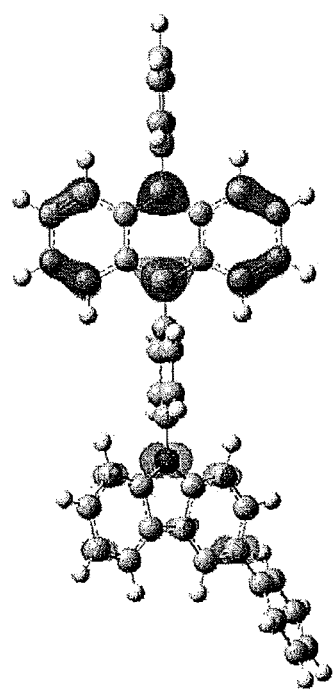
Figure 7C:
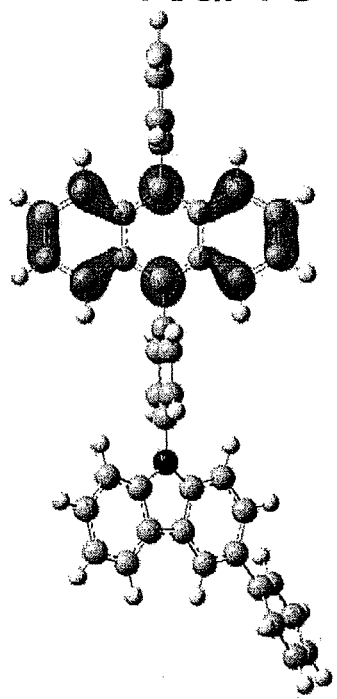
Figure 8A:
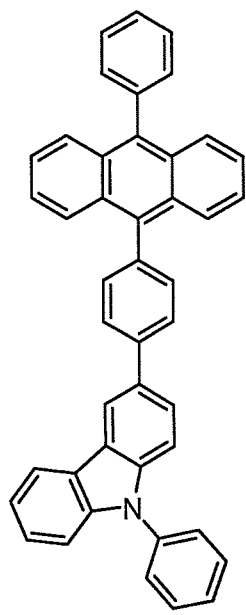
FIGS. 8A to 8C illustrate a compound used for a light-emitting element according to Embodiment.
Figure 8B:
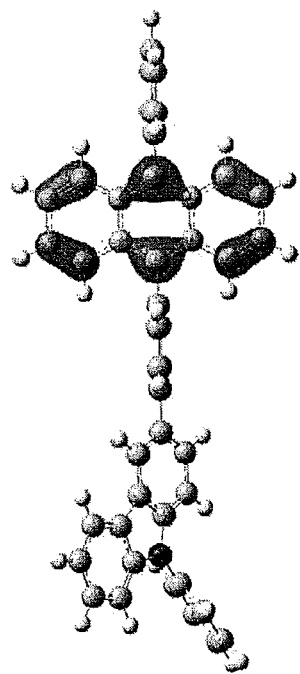
Figure 8C:
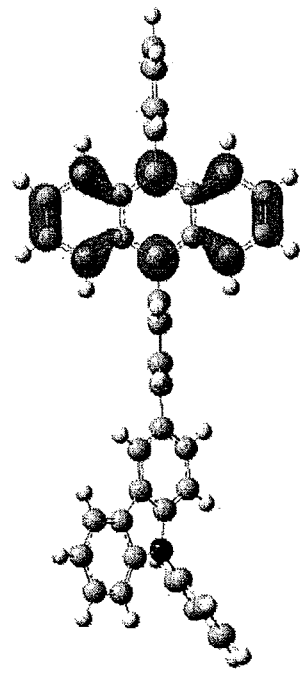
Figure 9A:
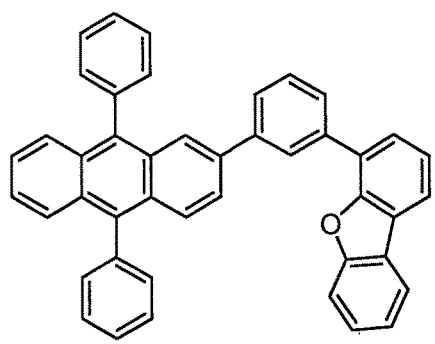
FIGS. 9A to 9C illustrate a compound used for a light-emitting element according to Embodiment.
Figure 9B:
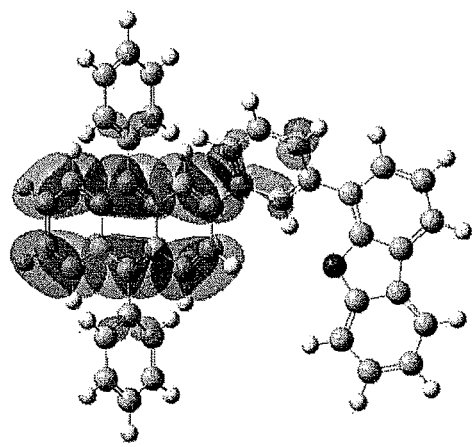
Figure 9C:
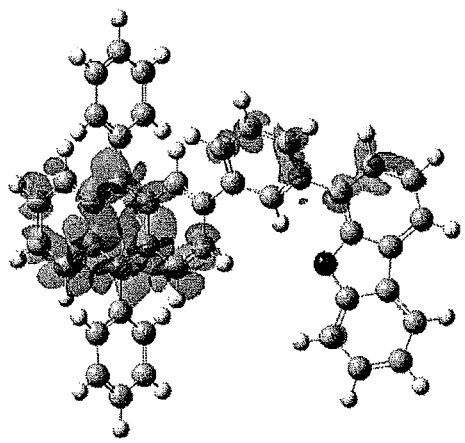
Figure 10A:
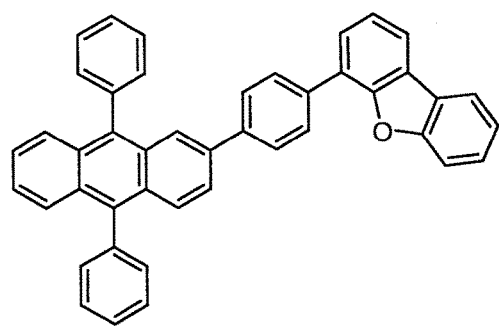
FIGS. 10A to 10C illustrate a compound used for a light-emitting element according to Embodiment.
Figures 10B, 10C:
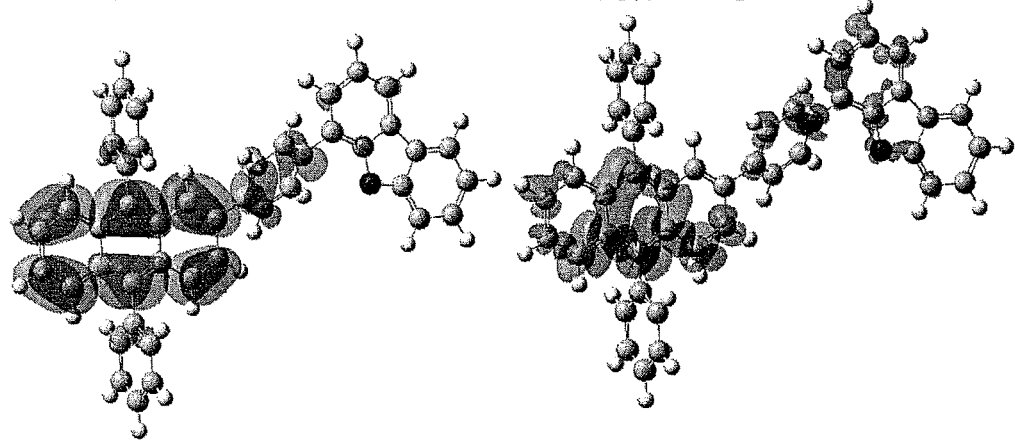

Specific examples of the hole-transport skeleton will be described with reference to FIGS. 6A to 6C, FIGS. 7A to 7C, FIGS. 8A to 8C, FIGS. 9A to 9C, FIGS. 10A to 10C, FIGS. 11A to 11C, FIGS. 12A to 12C, FIGS. 13A to 13C, and FIGS. 14A to 14C. These figures relate to the compounds: FIGS. 6A to 6C relates to 9-[4-(10-phenyl-9-anthryl)phenyl]-9H-carbazole (abbreviation: CzPA); FIGS. 7A to 7C, 3-phenyl-9-[4-(10-phenyl-9-anthryl)phenyl]-9H-carbazole (abbreviation: CzPAP); FIGS. 8A to 8C, 9-phenyl-3-[4-(10-phenyl-9-anthryl)phenyl]-9H-carbazole (abbreviation: PCzPA); FIGS. 9A to 9C, 4-[3-(9,10-diphenyl-2-anthryl)phenyl]dibenzofuran (abbreviation: 2 mPDBFPA-II); FIGS. 10A to 10C, 4-[4-(9,10-diphenyl-2-anthryl)phenyl]dibenzofuran (abbreviation: 2PDBFPA-II); FIGS. 11A to 11C, 4-[3-(triphenylen-2-yl)phenyl]dibenzothiophene (abbreviation: mDBTPTp-II); FIGS. 12A to 12C, 9-[4-(5-phenyl-1,3,4-oxadiazol-2-yl)phenyl]-9H-carbazole (abbreviation: CO11); FIGS. 13A to 13C, 9-[4'''-(5-phenyl-1,3,4-oxadiazol-2-yl)-[1,1':2',1'':2'',1'''] quaterphenyl-4-yl]-9H-carbazole (abbreviation: Z-CzPO11); and FIGS. 14A to 14C, 9-[4'''-(benzoxazol-2-yl)-[1,1':2',1'':2'',1''']quaterphenyl-4-yl]-9H-carbazole (abbreviation: Z-CzPBOx). FIG. 6A, FIG. 7A, FIG. 8A, FIG. 9A, FIG. 10A, FIG. 11A, FIG. 12A, FIG. 13A, and FIG. 14A each illustrate the chemical formula. FIGS. 6B and 6C, FIGS. 7B and 7C, FIGS. 8B and 8C, FIGS. 9B and 9C, FIGS. 10B and 10C, FIGS. 11B and 11C, FIGS. 12B and 12C, FIGS. 13B and 13C, and FIGS. 14B and 14C illustrate the highest occupied molecular orbital (HOMO) and lowest unoccupied molecular orbital (LUMO) which are rendered visible by molecular orbital calculations.

The molecular orbital calculations were carried out by the following steps. First, the optimal molecular structure of each compound in the ground state was calculated using the density functional theory (DFT). In the DFT, the total energy was represented as the sum of potential energy, electrostatic energy between electrons, electronic kinetic energy, and exchange-correlation energy including all the complicated interactions between electrons. Also in the DFT, an exchange-correlation interaction was approximated by a functional (i.e., a function of another function) of one electron potential represented in terms of electron density to enable high-speed and highly-accurate calculations. Here, B3LYP, which is a hybrid functional, was used to specify the weight of each parameter related to exchange-correlation energy. In addition, as a basis function, 6-311 (a basis function of a triple-split valence basis set using three contraction functions for each valence orbital) was applied to all the atoms. By the above basis function, for example, orbitals of 1s to 3s were considered in the case of hydrogen atoms while orbitals of is to 4s and 2p to 4p were considered in the case of carbon atoms. Furthermore, to improve calculation accuracy, the p function and the d function as polarization basis sets were added respectively to hydrogen atoms and atoms other than hydrogen atoms. Note that Gaussian 03 was used as a quantum chemistry computational program. A high performance computer (manufactured by SGI Japan, Ltd., Altix 4700) was used for the calculations.

The calculated HOMO and LUMO in the optimal molecular structures of the compounds which are made visible by Gauss View 4.1 are illustrated in FIGS. 6B and 6C, FIGS. 7B and 7C, FIGS. 8B and 8C, FIGS. 9B and 9C, FIGS. 10B and 10C, FIGS. 11B and 11C, FIGS. 12B and 12C, FIGS. 13B and 13C, and FIGS. 14B and 14C. In these figures, the spheres represent atoms forming each compound, and the cloud-like objects around the atoms represent the HOMO or LUMO. According to these figures, the skeleton where a HOMO exists can be regarded as a hole-transport skeleton.

As illustrated in FIGS. 6A to 6C, FIGS. 7A to 7C, and FIGS. 8A to 8C, CzPA, CzPAP and PCzPA are each a compound in which an anthracene skeleton and a carbazole skeleton are combined. In CzPA and PCzPA, the HOMO is distributed over the anthracene skeleton, and the anthracene skeleton can therefore be considered as a hole-transport skeleton. On the other hand, in CzPAP, the HOMO is distributed mainly around the anthracene skeleton while the carbazole skeleton makes a slight contribution to the HOMO. Both the anthracene skeleton and the carbazole skeleton can therefore be considered as hole-transport skeletons (note that the contribution by the anthracene skeleton is larger).

As illustrated in FIGS. 9A to 9C and FIGS. 10A to 10C, 2 mPDBFPA-II and 2PDBFPA-II are each a compound in which an anthracene skeleton and a dibenzofuran skeleton are combined. In 2 mPDBFPA-II, the HOMO is distributed around the anthracene skeleton, and the anthracene skeleton can therefore be considered as a hole-transport skeleton. On the other hand, in 2PDBFPA-II, the HOMO is distributed mainly over the anthracene skeleton while the dibenzofuran skeleton makes a little contribution to the HOMO. Both the anthracene skeleton and the dibenzofuran skeleton can therefore be considered as hole-transport skeletons (note that the contribution by the anthracene skeleton is larger).

Figure 11A:
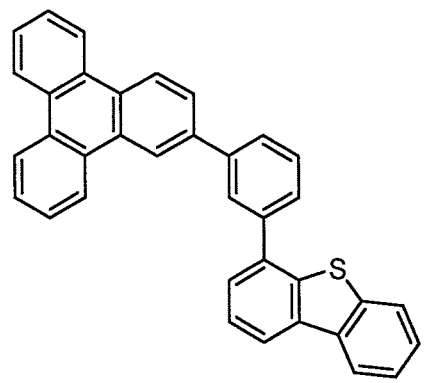
FIGS. 11A to 11C illustrate a compound used for a light-emitting element according to Embodiment.
Figures 11B, 11C:
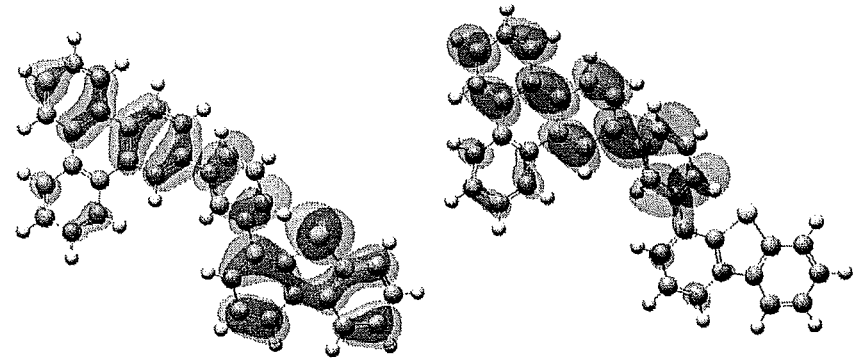
Figure 12A:
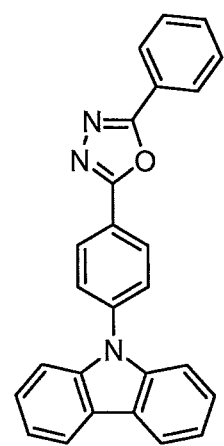
FIGS. 12A to 12C illustrate a compound used for a light-emitting element according to Embodiment.
Figure 12B:
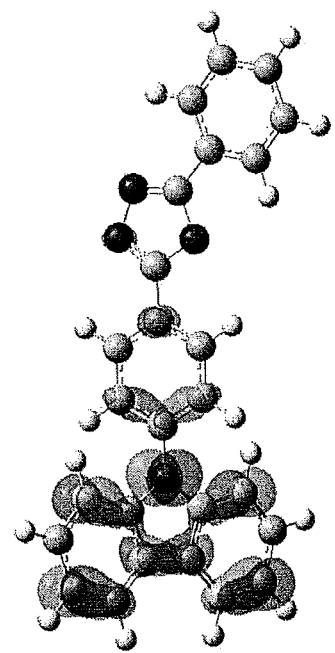
Figure 12C:
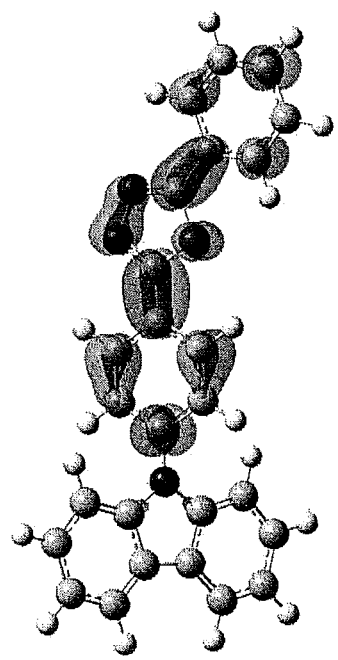
Figure 13A:
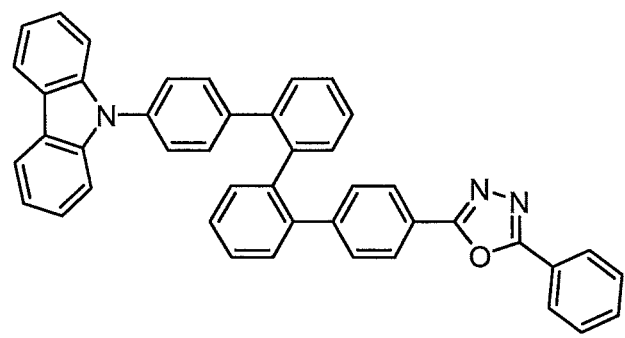
FIGS. 13A to 13C illustrate a compound used for a light-emitting element according to Embodiment.
Figure 13B:
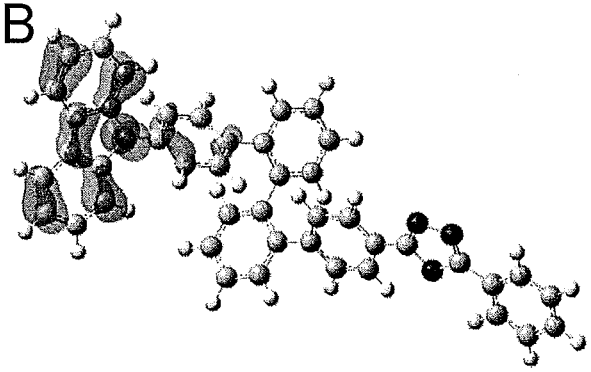
Figure 13C:
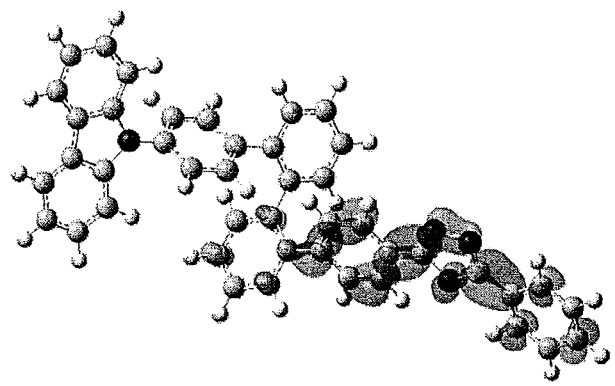

As illustrated in FIGS. 11A to 11C, mDBTPTp-II is a compound in which a triphenylene skeleton and a dibenzothiophene skeleton are combined. In mDBTPTp-II, the HOMO is distributed around both the triphenylene skeleton and the dibenzothiophene skeleton, and both these skeletons can therefore be considered as hole-transport skeletons (both contribute to their respective HOMOs to the same degree).

As illustrated in FIGS. 12A to 12C and FIGS. 13A to 13C, CO11 and Z-CzPO11 are each a compound in which a 1,3,4-oxadiazole skeleton and a carbazole skeleton are combined. In each compound, the HOMO is localized around the carbazole skeleton, and the carbazole skeleton can therefore be considered as a hole-transport skeleton.

Figure 14A:
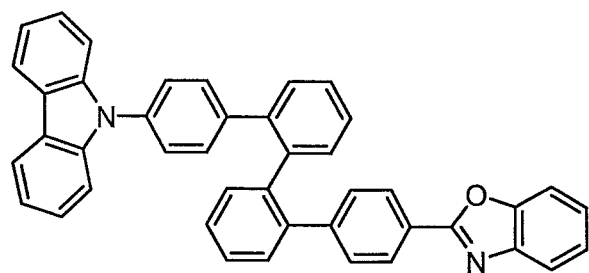
FIGS. 14A to 14C illustrate a compound used for a light-emitting element according to Embodiment.
Figure 14B:
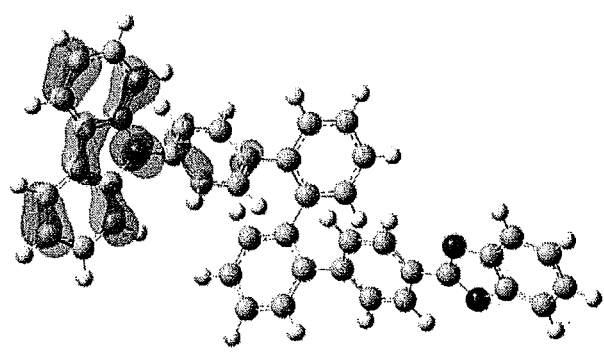
Figure 14C:
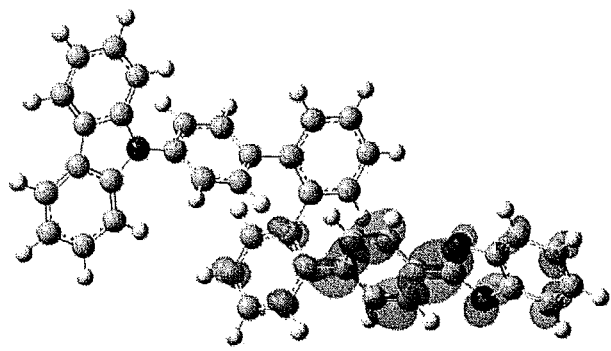

As illustrated in FIGS. 14A to 14C, Z-CzPBOx is a compound in which a benzoxazole skeleton and a carbazole skeleton are combined. In Z-CzPBOx, the HOMO is localized around the carbazole skeleton, and the carbazole skeleton can therefore be considered as a hole-transport skeleton.

As described above, the hole-transport skeleton can be estimated by molecular orbital calculations. According to one embodiment of the present invention, the first, second, and third organic compounds have the same hole-transport skeleton.

The hole-transport skeleton is preferably a skeleton having a high electron-donating property; typically, an aromatic amine skeleton is well known. Alternatively, a π excessive heteroaromatic ring or a condensed aromatic hydrocarbon ring is effective. Note that the "π excessive heteroaromatic ring" means a monohetero five-membered aromatic ring (e.g., pyrrole, furan, or thiophene) or a skeleton having a monohetero five-membered aromatic ring obtained by ring-fusing of an aromatic ring (typically, a benzene ring).

Further, the present inventors have found the following combination as a technique for reducing the hole-injection barriers between the first and second organic compounds and between the second and third organic compounds. Namely, the technique provides the structure where the hole-transport skeleton of the first organic compound (first hole-transport skeleton), that of the second organic compound (second hole-transport skeleton), and that of the third organic compound (third hole-transport skeleton) each separately include a skeleton of at least one of a π excessive heteroaromatic ring, a tricyclic condensed aromatic hydrocarbon ring, and a tetracyclic condensed aromatic hydrocarbon ring. The present inventors have found experimentally that the hole-injection barriers can be substantially removed in this case even if the first, second, and third hole-transport skeletons are different from one another. Thus, one embodiment of the present invention covers such a combination as well.

Specific examples of the π excessive heteroaromatic ring include skeletons of pyrrole, furan, thiophene, indole, isoindole, benzofuran, isobenzofuran, benzothiophene, isobenzothiophene, carbazole, dibenzofuran, and dibenzothiophene. Further, as the tricyclic condensed aromatic hydrocarbon ring and the tetracyclic condensed aromatic hydrocarbon ring, the skeleton of any one of phenanthrene, anthracene, pyrene, chrysene, and triphenylene is specifically given.

In particular, the hole-transport skeleton preferably includes the skeleton of at least any one of carbazole, dibenzofuran, dibenzothiophene and anthracene. This is because these skeletons not only solve a problem of the hole-injection barrier but also have very high electrochemical stability and also an excellent hole-transport property.

The hole-transport skeletons of the first, second, and third organic compounds are preferably the same, also in the case where these skeletons have the skeleton of at least any one of the above π excessive heteroaromatic ring (preferably, the skeleton of carbazole, dibenzofuran or dibenzothiophene) and the above tricyclic and tetracyclic condensed aromatic hydrocarbon rings (preferably, the skeleton of anthracene). This is because an electrochemical barrier between skeletons is reduced as long as the skeletons are the same, as already described.

In the above light-emitting element of one embodiment of the present invention, the first, second, and third organic compounds are preferably the same compound. This is because, by making the compounds themselves the same as well as their hole-transport skeletons, overlap of molecular orbitals easily occurs thereby greatly facilitating hole transport. Furthermore, film formation can be successively performed with the same compound, and accordingly, fabrication of the element is also simplified.

Compounds preferable as the first, second, and third organic compounds will be specifically given below. As mentioned above, an effective hole-transport skeleton is an aromatic amine skeleton or the skeleton having any one of the π excessive heteroaromatic ring and the condensed aromatic hydrocarbon ring.

Specific examples of the compounds having an aromatic amine skeleton as a hole-transport skeleton include 4,4'-bis[N-(1-naphthyl)-N-phenylamino]biphenyl (abbreviation: NPB or α-NPD), 4-(10-phenyl-9-anthryl)triphenylamine (abbreviation: DPhPA), NnN-diphenyl-9-[4-(10-phenyl-9-anthryl)phenyl]-9H-carbazol-3-amine (abbreviation: CzA1PA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 4,4'-(quinoxaline-2,3-diyl)bis(N,N-diphenylaniline) (abbreviation: TPAQn), N,N'-(quinoxaline-2,3-diyldi-4,1-phenylene)bis(N-phenyl-1,1'-biphenyl-4-amine) (abbreviation: BPAPQ), N,N'-(quinoxaline-2,3-diyldi-4,1-phenylene)bis[bis(1,1'-biphenyl-4-yl)amine] (abbreviation: BBAPQ), 4,4'-(quinoxaline-2,3-diyl)bis{N-[4-(9H-carbazol-9-yl)phenyl]-N-phenylaniline}(abbreviation: YGAPQ), N,N'-(quinoxaline-2,3-diyldi-4,1-phenylene)bis(N,9-diphenyl-9H-carbazol-3-amine) (abbreviation: PCAPQ), 4-(9H-carbazol-9-yl)-4'-(3-phenylquinoxalin-2-yl)triphenylamine (abbreviation: YGA1PQ), N,9-diphenyl-N-[4-(3-phenylquinoxalin-2-yl)phenyl]-9H-carbazol-3-amine (abbreviation: PCA1PQ), N,N,N'-triphenyl-N'-[4-(3-phenylquinoxalin-2-yl)phenyl]-1,4-phenylenediamine (abbreviation: DPA1PQ), 4-(9H-carbazol-9-yl)-4'-(5-phenyl-1,3,4-oxadiazol-2-yl)triphenylamine (abbreviation: YGAO11), N,9-diphenyl-N-[4-(5-phenyl-1,3,4-oxadiazol-2-yl)phenyl]-9H-carbazol-3-amine (abbreviation: PCAO11), N,N,N'-triphenyl-N'-[4-(5-phenyl-1,3,4-oxadiazol-2-yl)phenyl]-1,4-phenylenediamine (abbreviation: DPAO11), 4-(9H-carbazol-9-yl)-4'-(4,5-diphenyl-4H-1,2,4-triazol-3-yl)triphenylamine (abbreviation: YGATAZ1), 4-(9H-carbazol-9-yl)-4'-(3,5-diphenyl-4H-1,2,4-triazol-4-yl)triphenylamine (abbreviation: YGATAZ2), and the like.

Specific examples of the compounds having a π excessive heteroaromatic ring and/or condensed aromatic hydrocarbon ring as a hole-transport skeleton include 1,1',1''-(benzene-1,3,5-triyl)tripyrene, 9,10-diphenylanthracene (abbreviation: DPAnth), 9-(2-naphthyl)-10-[4-(1-naphthyl)phenyl]anthracene, 9-[4-(10-phenyl-9-anthryl)phenyl]-9H-carbazole (abbreviation: CzPA), 3-phenyl-9-[4-(10-phenyl-9-anthryl)

phenyl]-9H-carbazole (abbreviation: CzPAP), 3,6-diphenyl-9-[4-(10-phenyl-9-anthryl)phenyl]-9H-carbazole (abbreviation: DPCzPA), 3-(1-naphthyl)-9-[4-(10-phenyl-9-anthryl)phenyl]-9H-carbazole (abbreviation: CzPAαN), 3-(biphenyl-3-yl)-9-[4-(10-phenyl-9-anthryl)phenyl]-9H-carbazole (abbreviation: CzPAmB), 3-[4-(1-naphthyl)phenyl]-9-[4-(10-phenyl-9-anthryl)phenyl]-9H-carbazole (abbreviation: CzPAαNP), 9-phenyl-3-[4-(10-phenyl-9-anthryl)phenyl]-9H-carbazole (abbreviation: PCzPA), 9-(9,10-diphenyl-2-anthryl)-9H-carbazole (abbreviation: 2CzPA), 9-[4-(9,10-diphenyl-2-anthryl)phenyl]-9H-carbazole (abbreviation: 2CzPPA), 4-[3-(9,10-diphenyl-2-anthryl)phenyl]dibenzofuran (abbreviation: 2 mPDBFPA-II), 4-[4-(9,10-diphenyl-2-anthryl)phenyl]dibenzofuran (abbreviation: 2PDBFPA-II), 4-{3-[10-(2-naphthyl)-9-anthryl]phenyl}dibenzofuran, 4-[3-(9,10-diphenyl-2-anthryl)phenyl]dibenzothiophene (abbreviation: 2 mPDB TPA-II), 4-[3-(triphenylen-2-yl)phenyl]dibenzothiophene (abbreviation: mDBTPTp-II), 9-[4-(5-phenyl-1,3,4-oxadiazol-2-yl)phenyl]-9H-carbazole (abbreviation: CO11), 9-[4-(5-phenyl-1,3,4-oxadiazol-2-yl)phenyl]-3-phenyl-9H-carbazole (abbreviation: CO11-II), 9-[4-(5-phenyl-1,3,4-oxadiazol-2-yl)phenyl]-3,6-diphenyl-9H-carbazole (abbreviation: CO11-III), 9-[4'''-(5-phenyl-1,3,4-oxadiazol-2-yl)-[1,1':2',1'':2''',1''']quaterphenyl-4-yl]-9H-carbazole (abbreviation: Z-CzPO11), 9-[4-(benzoxazol-2-yl)phenyl]-3-phenyl-9H-carbazole (abbreviation: CzBOx-II), 9-[4-(benzoxazol-2-yl)phenyl]-3,6-diphenyl-9H-carbazole (abbreviation: CzBOx-III), 9-[4'''-(benzoxazol-2-yl)-[1,1':2',1'':2''',1''']quaterphenyl-4-yl]-9H-carbazole (abbreviation: Z-CzPBOx), and the like.

The compounds given above are all bipolar compounds and particularly preferred as the third organic compound.

Next, the light-emitting substance having a hole-trapping property included in the light-emitting layer 121 will be described. There is no limitation on the light-emitting substance having a hole-trapping property, as long as it has a hole-trapping property with respect to the third organic compound included in the light-emitting layer 121. In other words, the light-emitting substance is capable of reducing the hole mobility of the third organic compound when added to the light-emitting layer 121. Specifically, the substance preferably has a HOMO level higher than the third organic compound by 0.3 eV or more.

Here, the present inventors have found that, since a light-emitting substance including an aromatic amine compound or an organometallic complex has a hole-trapping property with respect to many organic compounds, such a substance is preferred as the light-emitting substance in the present invention. A pyrene diamine compound or an iridium complex has been found to be particularly preferable because of their high hole-trapping property.

A pyrene diamine compound and an iridium complex have been found to have a very high hole-trapping property with respect to a compound in which its hole-transport skeleton has a skeleton of at least any one of anthracene, carbazole, dibenzofuran, and dibenzothiophene. Hence, the third organic compound having such a skeleton is preferably combined with the light-emitting substance including a pyrene diamine compound or an iridium complex.

A pyrene diamine compound has been experimentally found to have a higher hole-trapping property (capability of greatly reducing the hole mobility of a light-emitting layer when added to the light-emitting layer) than other aromatic amine compounds which have substantially the same HOMO level as a pyrene diamine compound. Consequently, a pyrene diamine compound is particularly preferred as the light-emitting substance in the present invention.

Substances preferred as the light-emitting substance will be given below. As described above, an aromatic amine compound or an organometallic complex is preferable as the light-emitting substance. Examples of the aromatic amine compound include N,N'-bis[4-(9H-carbazol-9-yl)phenyl]-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetramine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), 4-(10-phenyl-9-anthryl)-4'-(9-phenyl-9H-fluoren-9-yl)triphenylamine (abbreviation: FLPAPA), N,N,N',N'-tetraphenylpyrene-1,6-diamine, N,N'-(3-methylphenyl)-N,N'-diphenylpyrene-1,6-diamine, N,N'-bis[4-(9-phenyl-9H-fluoren-9-yl)phenyl]-N,N'-diphenylpyrene-1,6-diamine (abbreviation: 1,6FLPAPrn), N,N'-bis(4-tert-butylphenyl)-N,N'-bis[4-(9-phenyl-9H-fluoren-9-yl)phenyl]-pyrene-1,6-diamine (abbreviation: 1,6tBu-FLPAPm), and the like.

Examples of the organometallic complex include bis[2-(4',6'-difluorophenyl)pyridinato-N,C$^{2'}$]iridium(III) acetylacetonate (abbreviation: FIracac), tris(2-phenylpyridinato-N, C$^{2'}$)iridium(III) (abbreviation: Ir(ppy)$_3$), bis[2-phenylpyridinato-N,C$^{2'}$]iridium(III) acetylacetonate (abbreviation: Ir(ppy)$_2$(acac)), tris(benzo[h]quinolinato)iridium(III) (abbreviation: Ir(bzq)$_3$), bis(benzo[h]quinolinato)iridium(III) acetylacetonate (abbreviation: Ir(bzq)$_2$(acac)), bis(2,4-diphenyl-1,3-oxazolato-N,C$^{2'}$)iridium(III) acetylacetonate (abbreviation: Ir(dpo)$_2$(acac)), bis(2-phenylbenzothiazolato-N,C$^{2'}$)iridium(III) acetylacetonate (abbreviation: Ir(bt)$_2$(acac)), bis[2-(2'-benzo[4,5-α]thienyl)pyridinato-N,C$^{3'}$]iridium(III) acetylacetonate (abbreviation: Ir(btp)$_2$(acac)), tris(1-phenylisoquinolinato-N, C$^{2'}$)iridium(III) (abbreviation: Ir(piq)$_3$), bis(1-phenylisoquinolinato-N, C$^{2'}$)iridium(III) acetylacetonate (abbreviation: Ir(piq)$_2$(acac)), 2,3,7,8,12,13,17,18-octaethyl-21H,23H-porphyrinplatinum(II) (abbreviation: PtOEP), and the like.

Next, the electron-accepting compound included in the first layer 111 will be described. The electron-accepting compound receives electrons from the first organic compound merely by being mixed (in contact) with the first organic compound or easily by application of an electric field. For example, a transition metal oxide and an oxide of a metal belonging to any of Groups 4 to 8 of the periodic table are given. Specifically, vanadium oxide, niobium oxide, tantalum oxide, chromium oxide, molybdenum oxide, tungsten oxide, manganese oxide, and rhenium oxide are preferable since their electron-accepting property is high. In particular, molybdenum oxide is preferable because it has a low hygroscopic property. In addition, organic compounds such as 7,7,8,8-tetracyano-2,3,5,6-tetrafluoroquinodimethane (abbreviation: $F_4$-TCNQ) and chloranil can be given.

Preferably, the electron-accepting compound is added to the first layer 111 so that the mass ratio of the electron-accepting compound to the first organic compound is from 1:0.1 to 1:4.0 inclusive.

In the case where the electron-accepting compound receives electrons from the first organic compound by merely being mixed (in contact) with the first organic compound, a charge-transfer complex is formed in the first layer. As this time, absorption in the infrared region due to charge transfer interaction occurs. When the first organic compound is an aromatic amine compound, absorption in the visible light region also occurs in many cases, which is disadvantageous in terms of transmittance. For example, in Japanese Published Patent Application No. 2003-272860, a mixture of vanadium oxide and a compound having an aromatic amine skeleton causes absorption at around 500 nm and around 1300 nm. Further, a mixture of $F_4$-TCNQ and a compound having an aromatic amine skeleton causes absorption at around 700 nm, around 900 nm, and around 1200 nm. In this case, an absorption peak particularly in the visible light region is a cause of a reduction in emission efficiency.

The present inventors have found that, despite no occurrence of the absorption due to charge transfer interaction, a barrier to hole injection from the anode is substantially removed in the case where the first layer is formed using the electron-accepting compound and the first organic compound which has a π excessive heteroaromatic ring (preferably, the skeleton of carbazole, dibenzofuran or dibenzothiophene) or the above tricyclic or tetracyclic condensed aromatic hydrocarbon ring (preferably, the skeleton of anthracene) as the hole-transport skeleton. Hence, the first layer which does not have an absorption peak in the visible light region can be easily formed, whereby a reduction in emission efficiency caused by a transmittance decrease can be prevented.

The above structure brings about effects described below. A change in the thickness of the EL layer 103 for optical designing is carried out preferably by increasing the thickness of the first layer 111 which less causes a variation in drive voltage and by decreasing the thicknesses of the other layers. However, if the first layer is a layer that exhibits an absorption spectrum peak in the visible light region and its thickness is increased, the first layer 111 absorbs light emitted from the light-emitting layer 121, which engenders a reduction in emission efficiency. The first layer 111 which does not cause the absorption due to charge transfer interaction as described above is therefore used, thereby optimizing the emission efficiency. The increase in the thickness of the first layer 111 is also effective in preventing a short circuit in the light-emitting element.

Thus, from the viewpoint of combination with the electron-accepting compound, the hole-transport skeleton of the first organic compound preferably has a skeleton including a π excessive heteroaromatic ring or a tricyclic or tetracyclic condensed aromatic hydrocarbon ring. In particular, carbazole, dibenzofuran, dibenzothiophene, or anthracene is preferred since they have very high electrochemical stability and an excellent hole-transport property.

Note that in the case where the first organic compound has an aromatic amine skeleton, the hole-transport skeleton of the first organic compound is the aromatic amine skeleton in many cases. In this case, the above-mentioned absorption due to charge transfer interaction occurs. Hence, it is preferable that the first organic compound do not have an aromatic amine skeleton.

Further, a conventional assumption has been that, if the ionization potential of an organic compound is 5.7 eV or more (the HOMO level is −5.7 eV or less), oxidation-reduction reaction is difficult to cause between the organic compound and an electron-accepting compound (e.g., see Japanese Published Patent Application No. 2003-272860). Therefore, as an organic compound for causing the oxidation reduction reaction with an electron-accepting compound, it has been considered necessary to use a substance having an ionization potential less than 5.7 eV (a HOMO level more than −5.7 eV), specifically a substance having a high electron-donating property such as aromatic amine. Nevertheless, in one embodiment of the present invention, when the first organic compound has a HOMO level of at least greater than or equal to −6.0 eV and less than or equal to −5.7 eV even without including an aromatic amine skeleton, the first layer can function despite no absorption due to charge transfer interaction with the electron-accepting compound, according to experimental findings of the present inventors.

Thus, in the above light-emitting element of one embodiment of the present invention, the HOMO level of the first organic compound is preferably greater than or equal to −6.0 eV and less than or equal to −5.7 eV. This structure makes it easy to embody a concept of the present invention even when the energy gap of the light-emitting layer is large and the HOMO of the first organic compound is low.

Preferred examples of the compounds having no aromatic amine skeleton includes, as given above, 9,10-diphenylanthracene (abbreviation: DPAnth), 9-(2-naphthyl)-10-[4-(1-naphthyl)phenyl]anthracene, 9-[4-(10-phenyl-9-anthryl)phenyl]-9H-carbazole (abbreviation: CzPA), 3-phenyl-9-[4-(10-phenyl-9-anthryl)phenyl]-9H-carbazole (abbreviation: CzPAP), 3,6-diphenyl-9-[4-(10-phenyl-9-anthryl)phenyl]-9H-carbazole (abbreviation: DPCzPA), 3-(1-naphthyl)-9-[4-(10-phenyl-9-anthryl)phenyl]-9H-carbazole (abbreviation: CzPAαN), 3-(biphenyl-3-yl)-9-[4-(10-phenyl-9-anthryl)phenyl]-9H-carbazole (abbreviation: CzPAmB), 3-[4-(1-naphthyl)phenyl]-9-[4-(10-phenyl-9-anthryl)phenyl]-9H-carbazole (abbreviation: CzPAαNP), 9-phenyl-3-[4-(10-phenyl-9-anthryl)phenyl]-9H-carbazole (abbreviation: PCzPA), 9-(9,10-diphenyl-2-anthryl)-9H-carbazole (abbreviation: 2CzPA), 9-[4-(9,10-diphenyl-2-anthryl)phenyl]-9H-carbazole (abbreviation: 2CzPPA), 4-[3-(9,10-diphenyl-2-anthryl)phenyl]dibenzofuran (abbreviation: 2 mPDBFPA-II), 4-[4-(9,10-diphenyl-2-anthryl)phenyl]dibenzofuran (abbreviation: 2PDBFPA-II), 4-{3-[10-(2-naphthyl)-9-anthryl]phenyl}dibenzofuran, 4-[3-(9,10-diphenyl-2-anthryl)phenyl]dibenzothiophene (abbreviation: 2 mPDBTPA-II), 4-[3-(triphenylen-2-yl)phenyl]dibenzothiophene (abbreviation: mDBTPTp-II), 9-[4-(5-phenyl-1,3,4-oxadiazol-2-yl)phenyl]-9H-carbazole (abbreviation: CO11), 9-[4-(5-phenyl-1,3,4-oxadiazol-2-yl)phenyl]-3-phenyl-9H-carbazole (abbreviation: CO11-II), 9-[4-(5-phenyl-1,3,4-oxadiazol-2-yl)phenyl]-3,6-diphenyl-9H-carbazole (abbreviation: CO11-III), 9-[4'''-(5-phenyl-1,3,4-oxadiazol-2-yl)-[1,1':2',1'':2'',1''']quaterphenyl-4-yl]-9H-carbazole (abbreviation: Z-CzPO11), 9-[4-(benzoxazol-2-yl)phenyl]-3-phenyl-9H-carbazole (abbreviation: CzBOx-II), 9-[4-(benzoxazol-2-yl)phenyl]-3,6-diphenyl-9H-carbazole (abbreviation: CzBOx-III), and 9-[4'''-(benzoxazol-2-yl)-[1,1':2',1'':2'' quaterphenyl-4-yl]-9H-carbazole (abbreviation: Z-CzPBOx). Alternatively, a polymer of a carbazole derivative such as poly(N-vinylcarbazole) (abbreviation: PVK) may be used.

The specific structure of the EL layer 103 is described above. The anode 101 and the cathode 102 will be described below.

For the anode 101, a metal, an alloy, an electrically conductive compound, a mixture thereof, or the like having a high work function (specifically, a work function of 4.0 eV or more is preferable) is preferably used. For example, indium oxide-tin oxide (ITO: indium tin oxide), indium oxide-tin oxide containing silicon or silicon oxide, indium oxide-zinc oxide (IZO: Indium Zinc Oxide), indium oxide containing tungsten oxide and zinc oxide (IWZO), and the like are given. Such conductive metal oxide films are generally deposited by a sputtering method, but may be formed by an inkjet method, a spin coating method, or the like by applying a sol-gel method or the like. For example, indium oxide-zinc oxide (IZO) can be formed by a sputtering method using indium oxide into which 1 wt % to 20 wt % of zinc oxide is added, as a target. Moreover, indium oxide (IWZO) containing tungsten oxide and zinc oxide can be formed by a sputtering method using a target in which 0.5 wt % to 5 wt % of tungsten oxide and 0.1 wt % to 1 wt % of zinc oxide with respect to indium oxide are included. Further, the following can be given: gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (e.g., titanium nitride), molybdenum oxide, vanadium oxide, ruthenium oxide, tungsten oxide, manganese oxide, titanium oxide, and the like. Alternatively, a conductive polymer such as poly (3,4-ethylenedioxythiophene)/poly(styrenesulfonic acid) (PEDOT/PSS) or polyaniline/poly(styrenesulfonic acid) (PAni/PSS) may be used.

For the cathode 102, a metal, an alloy, an electrically-conductive compound, a mixture thereof, or the like having a low work function (specifically, a work function of 3.8 eV or less) can be used. As a typical example of such a cathode material, an element belonging to Group 1 or 2 in the periodic table, i.e., an alkali metal such as lithium (Li) or cesium (Cs), or an alkaline earth metal such as magnesium (Mg), calcium (Ca), or strontium (Sr); an alloy containing any of these (such as MgAg or AlLi); a rare earth metal such as europium (Eu) or ytterbium (Yb); an alloy containing such a rare earth metal; or the like can be used. Alternatively, the cathode can be formed using a stack of a thin film of an alkali metal compound, an alkaline earth metal compound, or a rare-earth metal compound (e.g., lithium fluoride (LiF), lithium oxide (LiOx), cesium fluoride (CsF), calcium fluoride ($CaF_2$), or erbium fluoride ($ErF_3$)) and a film of a metal such as aluminum. A film of an alkali metal, an alkaline earth metal, or an alloy including these metals can be formed by a vacuum evaporation method. An alloy film containing an alkali metal or an alkaline earth metal can also be formed by sputtering. Further alternatively, a film can be formed of a silver paste by an inkjet method or the like.

Note that in the light-emitting element of one embodiment of the present invention, at least one of the anode and the cathode has a light-transmitting property. The light-transmitting property can be ensured by using a transparent electrode such as ITO or by reducing the thickness of the electrode.

Further, a substrate used for forming the light-emitting element of one embodiment of the present invention may be provided on either the anode 101 side or the cathode 102 side. The kinds of the substrate can be, for example, glass, plastic, metal, or the like. Note that other kinds of materials can be used as long as they can function as a support of the light-emitting element. In the case where light from the light-emitting element is extracted outside through the substrate, the substrate preferably has a light-transmitting property.

Figure 3:
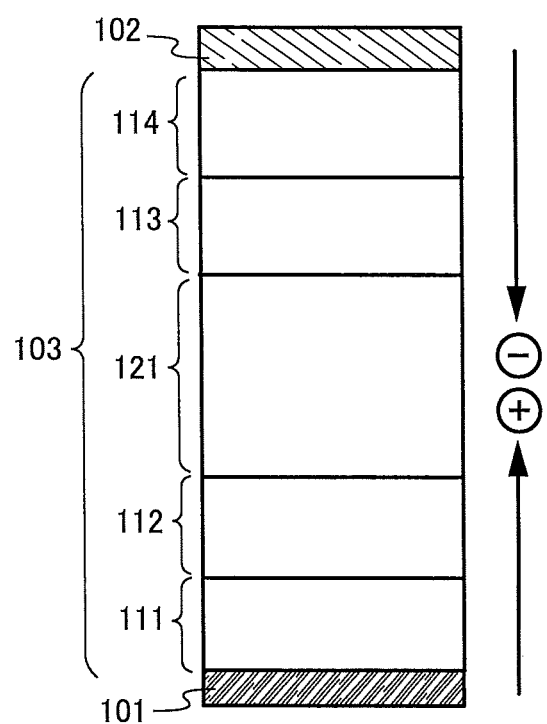
FIG. 3 illustrates a light-emitting element according to Embodiment.

With the structure described above, the light-emitting element of one embodiment of the present invention can be manufactured. Note that the EL layer 103 may still include another layer. Specifically, as illustrated in FIG. 3, the element structure may include an electron-transport layer 113 and an electron-injection layer 114.

The electron-transport layer 113 contains, for example, a metal complex having a quinoline skeleton or a benzoquinoline skeleton, such as tris(8-quinolinolato)aluminum (abbreviation: Alq), tris(4-methyl-8-quinolinolato)aluminum (abbreviation: $Almq_3$), bis(10-hydroxybenzo[h]-quinolinato)beryllium (abbreviation: $BeBq_2$), or bis(2-methyl-8-quinolinolato)(4-phenylphenolato)aluminum (abbreviation: BAlq). Alternatively, a metal complex having an oxazole-based or thiazole-based ligand, such as bis[2-(2-hydroxyphenyl)benzoxazolato]zinc (abbreviation: $Zn(BOX)_2$) or bis [2-(2-hydroxyphenyl)benzothiazolato]zinc (abbreviation: $Zn(BTZ)_2$), or the like can be used. Instead of metal complexes, 2-(4-biphenylyl)-5-(4-tert-butylphenyl)-1,3,4-oxadiazole (abbreviation: PBD), 1,3-bis[5-(p-tert-butylphenyl)-1, 3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances mentioned here are mainly ones that have an electron mobility of $10^{-6}$ $cm^2/V·s$ or more. Note that a substance other than the above may be used for the electron-transport layer as long as it has an electron-transport property higher than its hole-transport property. Furthermore, the electron-transport layer is not limited to a single layer and may be a stack of two or more layers containing any of the above substances.

Alternatively, high molecular compounds can be used. For example, poly[(9,9-dihexylfluorene-2,7-diyl)-co-(pyridine-3,5-diyl)] (abbreviation: PF-Py), poly[(9,9-dioctylfluorene-2,7-diyl)-co-(2,2'-bipyridin-6,6'-diyl)] (abbreviation: PF-BPy), or the like can be used.

For the electron-injection layer 114, an alkali metal, an alkaline earth metal, or a compound thereof, such as lithium, calcium, magnesium, lithium fluoride (LiF), lithium oxide ($LiO_x$), cesium fluoride (CsF), or calcium fluoride ($CaF_2$), can be used.

Alternatively, a layer including an electron-transport substance and an alkali metal, an alkaline earth metal, or a compound thereof, specifically, a layer including Alq and magnesium (Mg), or the like may be used. Note that in this case, electrons can be more efficiently injected from the cathode 102.

Next is described a method of manufacturing a light-emitting element of one embodiment of the present invention. As the manufacturing method, a dry process typified by a vacuum evaporation method is preferably employed. This is because a dry process more easily forms separate regions to stack the first layer, the second layer, and the light-emitting layer in the light-emitting element of one embodiment of the present invention. In terms of this, the first organic compound, the second organic compound, the third organic compound, and the light-emitting substance are preferably low molecular compounds.

However, any of a variety of methods may be employed to form the light-emitting element of one embodiment of the present invention regardless of whether the method is a dry process or a wet process. Typical examples of wet processes include, but not limited to, an inkjet method, a spin coating method, and the like.

Thus, by applying the present invention, it is possible to provide a light-emitting element having a long lifetime and also provide a light-emitting element having excellent emission efficiency and drive voltage.

(Embodiment 2)

Embodiment 2 will provide descriptions of a structure preferred for higher carrier recombination efficiency of the light-emitting element which is one embodiment of the present invention, referring to a material to be used and a fabrication method. In Embodiment 2, a region interposed between an anode and a cathode is called an EL layer.

Figure 4A:
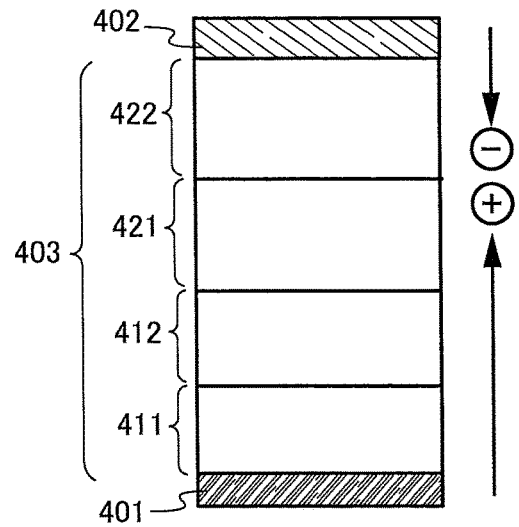
FIGS. 4A and 4B illustrate a light-emitting element according to Embodiment.
Figure 4B:
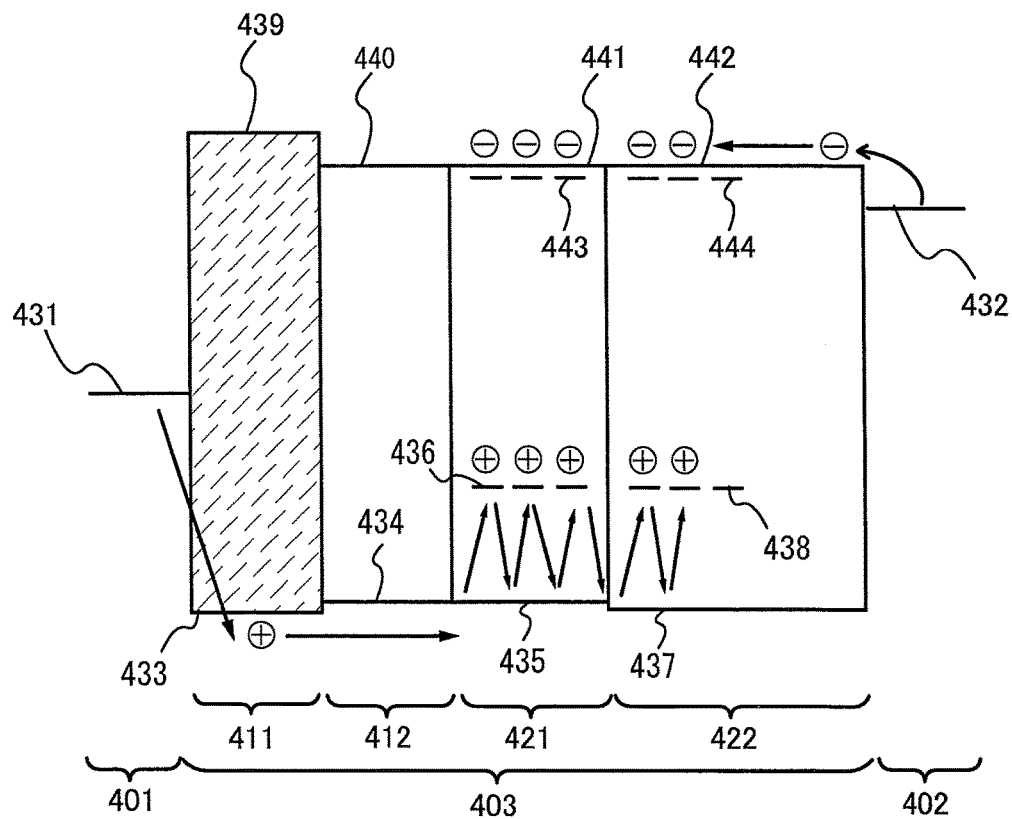

FIGS. 4A and 4B illustrate respectively a conceptual element structure and its band diagram of the light-emitting element of one embodiment of the present invention in Embodiment 2. As illustrated in FIG. 4A, in a light-emitting element of one embodiment of the present invention, an EL layer 403 is provided between an anode 401 and a cathode 402. The EL layer 403 at least has a stack structure where a first layer 411, a second layer 412, a first light-emitting layer 421, and a second light-emitting layer 422 are provided in order from the anode 401. Further, the first layer 411 contains the first organic compound and the electron-accepting compound. The second layer 412 contains a second organic compound. The first light-emitting layer 421 contains the third organic compound and a first light-emitting substance having a hole-trapping property with respect to the third organic compound. The second light-emitting layer 422 contains a fourth organic compound and a second light-emitting substance having a hole-trapping property with respect to the fourth organic compound. The fourth organic compound is a compound different from the third organic compound.

First, the present inventors have considered substantially equalizing a HOMO level 433 of the first organic compound in the first layer and a HOMO level 434 of the second organic compound in the second layer, as illustrated in FIG. 4B. Similarly, the inventors have considered substantially equalizing the HOMO level 434 of the second organic compound in the second layer and a HOMO level 435 of the third organic compound in the first light-emitting layer. Further, the inventors have considered substantially equalizing the HOMO level 435 of the third organic compound in the first light-emitting layer and a HOMO level 437 of the fourth organic compound in the second light-emitting layer. Hence, hole-injection barriers are extremely reduced between the first layer 411 and the second layer 412, between the second layer 412 and the first light-emitting layer 421, and between the first light-emitting layer 421 and the second light-emitting layer 422.

In view of the electrochemical selectivity described in Embodiment 1, in this specification, the HOMO levels that are substantially equalized mean, specifically, HOMO levels that differ from each other by from −0.2 eV to +0.2 eV inclusive.

As described in Embodiment 1, even when there is a gap between a work function 431 of the anode and the HOMO level 433 of the first organic compound included in the first layer 411, holes are smoothly injected by the addition of the electron-accepting compound to the first layer 411; thus, the hole-injection barrier is substantially removed. As the first layer 411, the electron-accepting compound and the first organic compound may be combined, or may be layered in order from the anode.

The above-described structure substantially removes the hole-injection barriers between the layers from the anode to the first and second light-emitting layers.

Further, a light-emitting substance having a hole-trapping property is added to each light-emitting layer for the same reason as in Embodiment 1. Specifically, in the first light-emitting layer 421, the first light-emitting substance having a hole-trapping property with respect to the third organic compound included in the first light-emitting layer 421 is added. In the second light-emitting layer 422, the second light-emitting substance having a hole-trapping property with respect to the fourth organic compound included in the second light-emitting layer 422 is added. Accordingly, without increasing drive voltage, holes can be prevented from passing to the cathode.

In order that holes be trapped by the light-emitting substances, the third organic compound and the first light-emitting substance having a hole-trapping property are preferably a host material and a guest material, respectively, in the first light-emitting layer 421. Also, the fourth organic compound and the second light-emitting substance having a hole-trapping property are preferably a host material and a guest material, respectively, in the second light-emitting layer 422.

A HOMO level 436 of the first light-emitting substance having a hole-trapping property is preferably higher than the HOMO level 435 of the third organic compound by 0.3 eV or more in view of the above-described electrochemical selectivity. Further, a HOMO level 438 of the second light-emitting substance having a hole-trapping property is preferably higher than the HOMO level 437 of the fourth organic compound by 0.3 eV or more in view of the above-described electrochemical selectivity.

Merely preventing holes from passing to the cathode for higher emission efficiency can be achieved also by adding a material for trapping holes between the anode 401 and the first light-emitting layer 421. However, such a technique reduces the speed of hole transport until holes reach the first light-emitting layer 421 to emit light, thereby inevitably increasing drive voltage. In contrast, in the structure of one embodiment of the present invention illustrated in FIGS. 4A and 4B, holes are transported from the anode 401 to the first light-emitting layer 421 without influence of a barrier or a trap, and accordingly the drive voltage increase can be minimized In short, it is preferable that a material having a hole-trapping property be not added to the second layer.

Furthermore, as illustrated in FIG. 4B, the holes that reach the first light-emitting layer 421 and the second light-emitting layer 422 are trapped at the HOMO level 436 of the first light-emitting substance having a hole-trapping property and the HOMO level 438 of the second light-emitting substance having a hole-trapping property, and the holes suddenly reduce their moving speed in the first light-emitting layer 421 and the second light-emitting layer 422. Then, these holes that are slowed down and electrons injected from the cathode 402 recombine efficiently, resulting in highly efficient light emission. In FIG. 4B, reference numeral 432 denotes the work function of the cathode. Further, electrons need to be transported sufficiently in the first light-emitting layer 421 and the second light-emitting layer 422 in terms of drive voltage. It is preferable, therefore, that both the third organic compound, which is the host material of the first light-emitting layer 421, and the fourth organic compound, which is the host material of the second light-emitting layer 422, have not only a hole-transport property but also an electron-transport property. That is, the third and fourth organic compounds are preferably bipolar materials.

In this specification, the "bipolar material" means a material that is capable of injecting holes (reaction in which electrons are taken away) and electron-injection (reaction in which electrons are received) in an EL layer, relatively stable in each reaction, and capable of transporting both holes and electrons sufficiently.

Note that reference numeral 439 denotes the LUMO level of the first organic compound included in first layer 411; reference numeral 440, the LUMO level of the second organic compound in the second layer; reference numeral 443, the LUMO level of the first light-emitting substance having a hole-trapping property; and reference numeral 444, the LUMO level of the second light-emitting substance.

The characteristic scheme to enhance the recombination efficiency in the light-emitting layers which does not use a barrier is that the first light-emitting layer 421 including the third organic compound and the second light-emitting layer 422 including the fourth organic compound are stacked and the third and fourth organic compounds are intentionally different compounds in Embodiment 2.

As described above, there is no substantial electrochemical hole-injection barrier between the third and fourth organic compounds (their HOMO levels are substantially equalized). However, hole transport between different kinds of substances is somewhat slower than between the same kind of substances.

As to electrons, in one embodiment of the present invention illustrated in FIGS. 4A and 4B, a LUMO level 441 of the third organic compound and a LUMO level 442 of the fourth organic compound are substantially equalized, and therefore there is no substantial electrochemical barrier to electron injection from the fourth organic compound to the third organic compound. However, since the third and fourth organic compounds are different compounds, electron transport between them is somewhat suppressed as compared with that between the same kind of substances. In view of electrochemical selectivity, the LUMO levels that are substantially equalized mean, specifically, LUMO levels differ by from −0.2 eV to +0.2 eV inclusive.

Thus, transport of both holes and electrons is suppressed at an interface between the first light-emitting layer 421 and the second light-emitting layer 422. Since there is no electrochemical barrier at this interface, the effect of such suppression is not quite large. Nevertheless, the effect influences both holes and electrons, and accordingly, a carrier recombination region is formed centered in this interface. Moreover, since the recombination is not attributed to use of a barrier, the recombination region is not localized, thereby making it difficult to cause the phenomenon in which accumulation or concentration of holes or electrons on a small region (the vicinity of the barrier) occurs to promote deterioration.

The present inventors have found that the above design enables carriers to recombine mainly inside the light-emitting layers (in the vicinity of the interface between the first light-emitting layer 421 and the second light-emitting layer 422) without using a barrier. Thus, the idea that different bipolar materials, each of which transports both holes and electrons, are combined and included in light-emitting layers forming a junction to generate carrier recombination is a new concept that can be called a "bipolar hetero junction," and is one of the important ideas of the present invention. This can increase emission efficiency as well as prevent deterioration caused by a barrier.

As described above, what is important in the light-emitting element of one embodiment of the present invention is that holes are smoothly transported from the anode to the light-emitting layers without encountering a barrier or a trap, and the moving speed of electrons as well as that of the holes is controlled in the light-emitting layers without using a barrier thereby leading to highly efficient recombination. Avoiding use of a barrier makes it difficult to cause a phenomenon in which accumulation or concentration of holes or electrons on a small region (the vicinity of the barrier) occurs to promote deterioration, whereby it is possible to contribute to a longer lifetime. Further, there is no substantial hole-injection barrier or hole trap between the layers from the anode to the light-emitting layer, and accordingly, drive voltage can be lowered. Furthermore, since the light-emitting substances having a hole-trapping property are used in the light-emitting layers and also the bipolar hetero junction is employed, holes and electrons can efficiently recombine even without using a barrier. Thus, a light-emitting element having high emission efficiency as well as a long lifetime can be realized.

In view of the above, the first light-emitting layer 421 preferably has a lower hole-transport property than the second layer 412. To make the hole-transport property of the first light-emitting layer 421 lower than that of the second layer 412, for instance, the second organic compound and the third organic compound may be the same compound. By such a technique, the first light-emitting layer 421 has a lower hole-transport property than the second layer 412 because the first light-emitting layer 421 includes the first light-emitting substance having a hole-trapping property.

On the basis of the above points, concepts and specific examples of materials applicable to the first, second, third, and fourth organic compounds will be described below.

As in Embodiment 1, the hole-transport skeletons of the first, second, third, and fourth organic compounds are preferably the same. Description of the hole-transport skeletons can be found in Embodiment 1 with reference to FIGS. 6A to 6C, FIGS. 7A to 7C, FIGS. 8A to 8C, FIGS. 9A to 9C, FIGS. 10A to 10C, FIGS. 11A to 11C, FIGS. 12A to 12C, FIGS. 13A to 13C, and FIGS. 14A to 14C.

Further, one of the points of Embodiment 2 is to substantially remove the electron-injection barrier between the third and fourth organic compounds. As one technique therefor, the present inventors have proposed that electron-transport skeletons of the third organic compound and the fourth organic compound be the same.

The "electron-transport skeleton" means a part or the whole of a skeleton of a compound where the LUMO is distributed. Distribution of the LUMO can be found by molecular orbital calculations. When the electron-transport skeletons of compounds (the third and fourth organic compounds in Embodiment 2) are the same, the LUMO levels of the compounds are close to each another, whereby electrochemical barriers between the compounds are reduced.

Specific examples of the electron-transport skeleton will be described with reference to FIGS. 6A to 6C, FIGS. 7A to 7C, FIGS. 8A to 8C, FIGS. 9A to 9C, FIGS. 10A to 10C, FIGS. 11A to 11C, FIGS. 12A to 12C, FIGS. 13A to 13C, and FIGS. 14A to 14C. As illustrated in FIGS. 6A to 6C, FIGS. 7A to 7C, and FIGS. 8A to 8C, CzPA, CzPAP and PCzPA are each a compound in which an anthracene skeleton and a carbazole skeleton are combined. In each compound, the LUMO is distributed around the anthracene skeleton, and the anthracene skeleton can therefore be considered as an electron-transport skeleton.

As illustrated in FIGS. 9A to 9C and FIGS. 10A to 10C, 2 mPDBFPA-II and 2PDBFPA-II are each a compound in which an anthracene skeleton and a dibenzofuran skeleton are combined. In each compound, the LUMO is distributed mainly around the anthracene skeleton while the dibenzofuran skeleton makes a slight contribution to the LUMO. Both the anthracene skeleton and the dibenzofuran skeleton can therefore be considered as electron-transport skeletons (note that the contribution by the anthracene skeleton is larger).

As illustrated in FIGS. 11A to 11C, mDBTPTp-II is a compound in which a triphenylene skeleton and a dibenzothiophene skeleton are combined. In mDBTPTp-II, the LUMO is distributed mainly around the triphenylene skeleton while the dibenzothiophene skeleton makes a little contribution to the LUMO, and therefore both the triphenylene skeleton and the dibenzothiophene skeleton can be considered as electron-transport skeletons (note that the contribution by the triphenylene skeleton is larger than that by the triphenylene skeleton).

As illustrated in FIGS. 12A to 12C and FIGS. 13A to 13C, CO11 and Z-CzPO11 are each a compound in which a 1,3,4-oxadiazole skeleton and a carbazole skeleton are combined. In each compound, the LUMO is distributed centering around the 1,3,4-oxadiazole skeleton, and therefore the 1,3,4-oxadiazole skeleton can be considered as an electron-transport skeleton.

As illustrated in FIGS. 14A to 14C, Z-CzPBOx is a compound in which a benzoxazole skeleton and a carbazole skeleton are combined. In Z-CzPBOx, the LUMO is distributed centering around the benzoxazole skeleton, and therefore the benzoxazole skeleton can be considered as an electron-transport skeleton.

As described above, a hole-transport skeleton and an electron-transport skeleton can be estimated by molecular orbital calculations. According to one embodiment of the present invention, the first, second, third, and fourth organic compounds have the same hole-transport skeleton, and also the third and fourth organic compounds have the same electron-transport skeleton.

The hole-transport skeleton is preferably a skeleton having a high electron-donating property; typically, an aromatic amine skeleton is well known. Alternatively, a π excessive heteroaromatic ring or a condensed aromatic hydrocarbon ring is effective. Note that the "π excessive heteroaromatic ring" means a monohetero five-membered aromatic ring (e.g., pyrrole, furan, or thiophene) or a skeleton having a monohetero five-membered aromatic ring obtained by ring-fusing of an aromatic ring (typically, a benzene ring).

Further, the present inventors have found the following combination as a technique for reducing the hole-injection barriers between the first and second organic compounds, between the second and third organic compounds, and between the third and fourth organic compounds. Namely, the technique provides the structure where the hole-transport skeleton of the first organic compound (first hole-transport skeleton), that of the second organic compound (second hole-transport skeleton), that of the third organic compound (third hole-transport skeleton), and that of the fourth organic compound (fourth hole-transport skeleton) each separately include a skeleton of at least any one of a π excessive heteroaromatic ring, a tricyclic condensed aromatic hydrocarbon ring, and a tetracyclic condensed aromatic hydrocarbon ring. The present inventors have found experimentally that the hole-injection barriers can be substantially removed in this case even if the first, second, third, and fourth hole-transport skeletons are different from one another. Thus, one embodiment of the present invention covers such a combination as well.

Specific examples and preferred examples of a π excessive heteroaromatic ring, a tricyclic condensed aromatic hydrocarbon ring, and a tetracyclic condensed aromatic hydrocarbon ring are the same as in Embodiment 1.

The hole-transport skeletons of the first, second, third, and fourth organic compounds are preferably the same, also in the case where these skeletons have the skeleton of at least any one of a π excessive heteroaromatic ring and tricyclic and tetracyclic condensed aromatic hydrocarbon rings. This is because an electrochemical barrier between skeletons is reduced as long as the skeletons are the same, as already described.

In the above light-emitting element of one embodiment of the present invention, the first, second, and third organic compounds are preferably the same compound. This is because, by making the compounds themselves the same as well as their hole-transport skeletons, overlap of molecular orbitals easily occurs thereby greatly facilitating hole transport. Furthermore, film formation can be successively performed with the same compound, and accordingly, fabrication of the element is also simplified. Note that the fourth organic compound is a compound different from the first, second, and third organic compounds in order to form the above-described bipolar heterojunction (to control the carrier recombination region without using a barrier).

Note that specific examples of the compounds preferred as the first, second, third, and fourth organic compounds include the compound having an aromatic amine skeleton as a hole-transport skeleton and the compound having a π excessive heteroaromatic ring and/or a condensed aromatic hydrocarbon ring as a hole-transport skeleton, which are given in Embodiment 1.

To increase the recombination efficiency in the light-emitting layers, it is preferable that the first light-emitting layer 421 have a higher hole-transport property and a lower electron-transport property than the second light-emitting layer 422. The bipolar heterojunction having such a combination is also one feature of the present invention.

The above feature can be realized with, for example, the first light-emitting layer in which 5 wt % of 1,6-FLPAPrn (having a HOMO level of −5.40 eV) is added as the first light-emitting substance to PCzPA (having a HOMO level of −5.79 eV according to CV measurement) and the second light-emitting layer in which 5 wt % of 1,6-FLPAPm, which is the same light-emitting substance as in the first light-emitting layer, is added as the second light-emitting substance to CzPA (having a HOMO level of −5.79 eV).

The first and second light-emitting substances are preferably the same compound as described above, because they make it easy to control the hole- and electron-transport properties of the first and second light-emitting layers.

The first and second light-emitting substances may be light-emitting substances differing in their emission color so that light with a mixture of the emission colors can be emitted. For instance, the emission color of the first light-emitting substance is yellow and that of the second light-emitting substance is blue, whereby white light can be emitted.

Next are described the first light-emitting substance having a hole-trapping property which is included in the first light-emitting layer 421 and the second light-emitting substance having a hole-trapping property which is included in the second light-emitting layer 422.

There is no limitation on the first light-emitting substance, as long as it has a hole-trapping property with respect to the third organic compound included in the first light-emitting layer 421. In other words, the light-emitting substance needs to be capable of reducing the hole mobility of the third organic compound when added to the first light-emitting layer 421. Specifically, the substance preferably has a HOMO level higher than the third organic compound by 0.3 eV or more.

Similarly, there is no limitation on the second light-emitting substance, as long as it has a hole-trapping property with respect to the fourth organic compound included in the second light-emitting layer 422. In other words, when added to the second light-emitting layer 422, the light-emitting substance having a hole-trapping property needs to be capable of reducing the hole mobility of the fourth organic compound. Specifically, the substance preferably has a HOMO level higher than the fourth organic compound by 0.3 eV or more.

As in Embodiment 1, the first and second light-emitting substances are preferably any of a light-emitting substance including an aromatic amine compound or an organometallic complex, especially preferably a pyrene diamine compound or an iridium complex. A pyrene diamine compound and an iridium complex have been found to have a very high hole-trapping property with respect to a compound in which its hole-transport skeleton has a skeleton of at least any one of anthracene, carbazole, dibenzofuran, and dibenzothiophene. Hence, each of the third and fourth organic compounds preferably has such a hole-transport skeleton.

A pyrene diamine compound has been experimentally found to have a higher hole-trapping property (capability of greatly reducing the hole mobility of a light-emitting layer when added to the light-emitting layer) than other aromatic amine compounds which have substantially the same HOMO level as a pyrene diamine compound. Consequently, a pyrene diamine compound is particularly preferred as the first light-emitting substance and/or the second light-emitting substance in the present invention.

Specific examples of the first and second light-emitting substances can be the same as those of the light-emitting substance having a hole-trapping property given in Embodiment 1.

Next, the electron-accepting compound included in the first layer 411 will be described. The electron-accepting compound can also be the same compound as in Embodiment 1. Preferably, the electron-accepting compound is included in the first layer 411 so that the mass ratio of the electron-accepting compound to the first organic compound is from 1:0.1 to 1:4.0 inclusive.

Also as in Embodiment 1, it is preferable that the first organic compound in the first light-emitting layer 411 be a compound having no aromatic amine skeleton and have a HOMO level of from −6.0 eV to −5.7 eV inclusive.

The specific structure of the EL layer 403 is described above. The anode 401 and the cathode 402 will be described below.

Specific structures of the anode 401 and the cathode 402 can be the same as those in Embodiment 1. Note that in the light-emitting element of one embodiment of the present invention, at least one of the anode and the cathode has a light-transmitting property. The light-transmitting property can be ensured by using a transparent electrode such as ITO or by reducing the thickness of the electrode.

Further, a substrate used for forming the light-emitting element of one embodiment of the present invention may be provided on either the anode 401 side or the cathode 402 side. The kinds of the substrate can be, for example, glass, plastic, metal, or the like. Note that other kinds of materials can be used as long as they can function as a support of the light-emitting element. In the case where light from the light-emitting element is extracted outside through the substrate, the substrate preferably has a light-transmitting property.

With the structure described above, the light-emitting element of one embodiment of the present invention can be manufactured. Note that the EL layer 403 may still include another layer. Specifically, as illustrated in FIG. 5, the element structure may include an electron-transport layer 413 and an electron-injection layer 414. Structures of the electron-transport layer 413 and the electron-injection layer 414 can be the same as those in Embodiment 1.

Next is described a method of manufacturing a light-emitting element of one embodiment of the present invention. As the manufacturing method, a dry process typified by a vacuum evaporation method is preferably employed. This is because a dry process more easily forms separate regions to stack the first layer, the second layer, the first light-emitting layer, and the second light-emitting layer in the light-emitting element of one embodiment of the present invention. In terms of this, the first organic compound, the second organic compound, the third organic compound, the fourth organic compound, the first light-emitting substance, and the second light-emitting substance are preferably low molecular compounds.

However, any of a variety of methods may be employed to form the light-emitting element of one embodiment of the present invention regardless of whether the method is a dry process or a wet process. Typical examples of wet processes include, but not limited to, an inkjet method, a spin coating method, and the like.

Thus, by applying the present invention, it is possible to provide a light-emitting element having a long lifetime and also provide a light-emitting element with excellent emission efficiency and drive voltage.

This embodiment can be combined with any of the other embodiments and examples.

(Embodiment 3)

This embodiment will provide descriptions of a structure of the light-emitting layer, which is different from those in Embodiments 1 and 2. Note that a structure of a light-emitting element will be described using FIGS. 1A and 1B.

In FIGS. 1A and 1B, although the light-emitting layer 121 includes the third organic compound and the light-emitting substance having a hole-trapping property with respect to the third organic compound according to Embodiment 1, the light-emitting layer 121 includes a light-emitting substance capable of emitting light (a substance having a light-emitting property) which is different from the light-emitting substance having a hole-trapping property according to Embodiment 3. That is, the light-emitting layer 121 of this embodiment includes the substance having a light-emitting property in addition to the light-emitting substance having a hole-trapping property.

Since the structure in FIGS. 1A and 1B according to Embodiment 3, which is except for the light-emitting layer 121, is described in Embodiment 1 and will not be detailed here.

The light-emitting layer 121 includes the substance having a light-emitting property, as well as the third organic compound and the light-emitting substance having a hole-trapping property with respect to the third organic compound which are described in Embodiment 1.

As the substance having a light-emitting property, a substance having excitation energy lower than or equal to that of the light-emitting substance having a hole-trapping property can be used.

As the substance having a light-emitting property, a fluorescent material or a phosphorescent material can be used. Specifically, any of the following can be used as appropriate: organometallic complexes such as N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), rubrene, 5,12-bis(1,1'-biphenyl-4-yl)-6,11-diphenyltetracene (abbreviation: BPT), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), bis[2-(2'-benzo[4,5-α]thienyl)pyridinato-N,C$^{3'}$]iridium(III) acetylacetonate (abbreviation: Ir(btp)$_2$(acac)), bis(1-phenylisoquinolinato-N, C$^{2'}$)iridium(III) acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), and 2,3,7,8,12,13,17,18-octaethyl-21H,23H-porphyrinplatinum(II) (abbreviation: PtOEP); compounds having an arylamine skeleton such as perylene, 2,5,8,11-tetra(tert-butyl)perylene (abbreviation: TBP), 4,4'-bis(2,2-diphenylvinyl)biphenyl (abbreviation: DPVBi), 4,4'-bis[2-(N-ethylcarbazol-3-yl)vinyl]biphenyl (abbreviation: BCzVBi), bis(2-methyl-8-quinolinolato)(4-phenylphenolato)aluminum (abbreviation: BAlq), bis(2-methyl-8-quinolinolato)gallium chloride (abbreviation: Gamq2Cl), bis[2-(3',5'-bis(trifluoromethyl)phenyl)pyridinato-N,C$^{2'}$]iridium(III) picolinate (abbreviation: Ir(CF$_3$ ppy)$_2$(pic)), bis[2-(4',6'-difluorophenyl)pyridinato-N,C$^{2'}$]iridium(III)acetylacetonate (abbreviation: FIr(acac)), bis[2-(4',6'-difluorophenyl)pyridinato-N,C$^{2'}$]iridium(III)picolinate (abbreviation: FIrpic), bis[2-(4',6'-difluorophenyl)pyridinato-N,C$^{2'}$]iridium(III)tetra(1-pyrazolyborate (abbreviation: FIr$_6$), 2,3-bis(4-diphenylaminophenyl)quinoxaline (abbreviation: TPAQn), and 4,4'-bis[N-(1-naphthyl)-N-phenylamino]biphenyl (abbreviation: NPB); carbazole derivatives such as 4,4'-di(N-carbazolyl)biphenyl (abbreviation: CBP) and 4,4',4''-tris(N-carbazolyl)triphenylamine (abbreviation: TCTA); metal complexes such as bis[2-(2-hydroxyphenyl)pyridinato]zinc (abbreviation: Znpp$_2$), bis[2-(2-hydroxyphenyl)benzoxazolato]zinc (abbreviation: ZnBOX), bis(2-methyl-8-quinolinolato)(4-phenylphenolato)aluminum (abbreviation: BAlq), and tris(8-quinolinolato)aluminum(III) (abbreviation: Alq$_3$); and high molecular compounds such as poly(N-vinylcarbazole) (abbreviation: PVK); and the like.

When such light-emitting layers of this embodiment are used to fabricate light-emitting elements for emitting light with different colors over one substrate, the materials and processes for forming the first layer 111 and the second layer 112 can be the same for both the elements, whereby the process can be simplified.

For instance, when light with two colors is intended to be emitted over one substrate, materials of the first layer 111 and the second layer 112 are determined by the HOMO level and LUMO level of the light-emitting substance having a hole-trapping property in each of a light-emitting element for emitting light with a first color and a light-emitting element for emitting light with a second color. Consequently, if a light-emitting substance having a hole-trapping property which emit light with the first color and a light-emitting substance having a hole-trapping property which emits light with the second color are used, the materials of the first layer 111 and the second layer 112 need to differ between a light-emitting element including the light-emitting substance having a hole-trapping property which emits light with the first color and a light-emitting element including the light-emitting substance having a hole-trapping property which emits light with the second color; thus, the process is complicated.

In contrast, when the light-emitting layer includes the substance having a light-emitting property in addition to the light-emitting substance having a hole-trapping property like the light-emitting layer of this embodiment, the materials of the first layer 111 and the second layer 112 can be the same regardless of emission colors.

What is important in the light-emitting element of one embodiment of the present invention is that holes are smoothly transported from the anode to the light-emitting layer without encountering a barrier or a trap and the holes reduce their moving speed in the light-emitting layer without using a barrier thereby leading to highly efficient recombination. The light-emitting substance having a hole-trapping property therefore determines the HOMO level and LUMO level of the third organic compound in the light-emitting layer. The materials of the first layer 111 and the second layer 112 are also determined accordingly. In the conventional case where light with two colors is intended to be emitted over one substrate, the HOMO level and LUMO level of the third organic compound in the light-emitting layer differ between the light-emitting element for emitting light with a first color and the light-emitting element for emitting light with a second color, and consequently, the materials of the first layer 111 and the second layer 112 need to differ between the elements.

In contrast, with the light-emitting element for emitting light with the first color and the light-emitting element for emitting light with the second color each of which include the light-emitting layer of this embodiment, the materials for the first layer 111, the second layer 112, and the third organic compound and the light-emitting substance having a hole-trapping property with respect to the third organic compound which are included in the light-emitting layer 121 can be the same for both the elements. The substance having a light-emitting property added to the light-emitting layer 121 is made to differ between the light-emitting element for emitting light with the first color and the light-emitting element for emitting light with the second color, and accordingly, it is possible to provide light emission with color differing between these elements.

In this case, although the light-emitting layer of this embodiment is used for the light-emitting element for emitting light with the first color and the light-emitting element for emitting light with the second color, the light-emitting layer of Embodiment 1 may be used for either one of the elements. In other words, the light-emitting elements for emitting light with the first and second colors may be a combination of a light-emitting element using the light-emitting layer of Embodiment 3 and a light-emitting element using the light-emitting layer of Embodiment 1.

In FIGS. 4A and 4B as well, the light-emitting layer of this Embodiment 3 can be applied. In this case, the light-emitting layer of this embodiment can be applied to one or both of the first light-emitting layer 421 and the second light-emitting layer 422.

In this case, the same effect as in FIGS. 1A and 1B can be obtained in fabricating a light-emitting element for emitting light with different colors over one substrate as described above. Further, as described above, light-emitting layers of light-emitting elements for emitting light with different colors may be a combination of a light-emitting element using the light-emitting layer of Embodiment 3 and a light-emitting element using the light-emitting layer of Embodiment 1. Furthermore, a plurality of light-emitting substances in one light-emitting layer may be made to emit light.

Although the above description gives the case where light emission with two colors over one substrate is intended, there is no limitation on this case. The present invention may be applied to the case where light emission with two or more colors over one substrate is intended or the structure where light with a single color such as white is obtained by light emission with two or more colors over one substrate.

This embodiment can be combined with any of the other embodiments and examples.

(Embodiment 4)

A structure of a light-emitting element which is one embodiment of the present invention will be described in Embodiment 4. Note that Embodiment 4 will provide descriptions of light-emitting elements in each of which a plurality of EL layers like those described in Embodiments 1 and 2 is provided between an anode and a cathode (hereinafter, called a tandem light-emitting element) referring to FIGS. 15A and 15B.

Figure 15A:
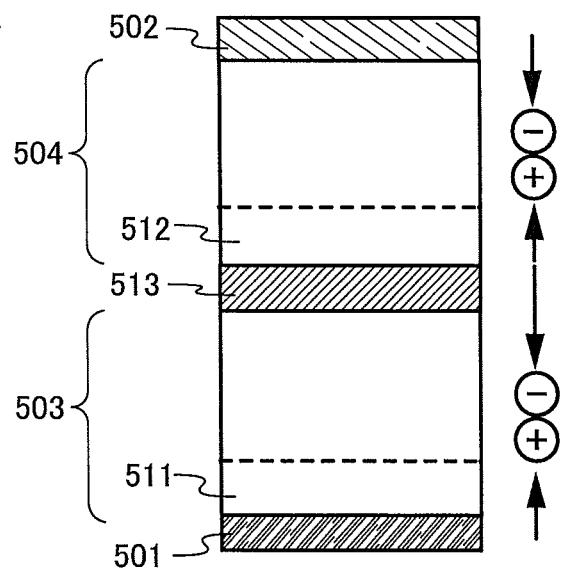
FIGS. 15A and 15B each illustrate a light-emitting element according to Embodiment.

FIG. 15A illustrates an example of the tandem light-emitting element in which two EL layers, i.e., a first EL layer 503 and a second EL layer 504 are stacked between an anode 501 and a cathode 502. The EL layer described in Embodiment 1 or 2 can be applied to the first EL layer 503 and the second EL layer 504.

As described in Embodiments 1 and 2, a region on the anode side of each EL layer (the first layer in Embodiments 1 and 2) includes an electron-accepting compound. This region (denoted by reference numerals 511 and 512 in FIGS. 15A and 15B) including an electron-accepting compound functions as a charge generation layer. An appropriate electron-injection layer 513 is provided as a portion connecting the EL layers, and accordingly the first EL layer 503 and the second EL layer 504 are connected in series; thus, the element functions as a tandem light-emitting element. The kind of the electron-injection layer 513 may be the same as the electron-injection layer of Embodiment 1.

Figure 15B:
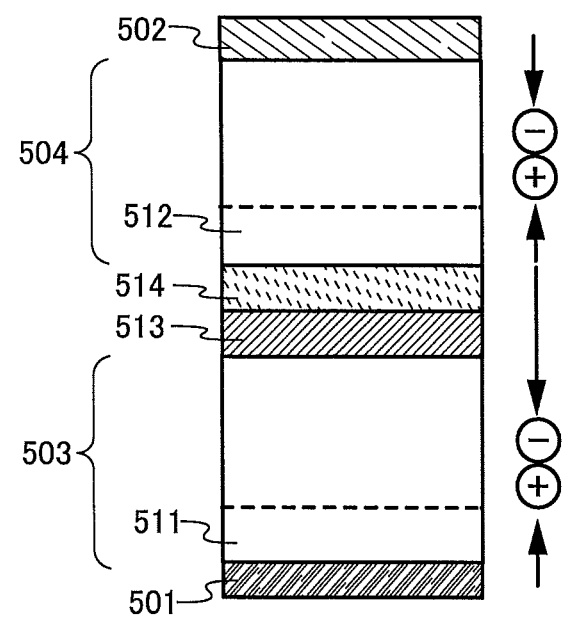

As illustrated in FIG. 15B, an auxiliary layer 514 may be further provided between the electron-injection layer 513 and the EL layer (the second EL layer 504 in FIG. 15B). As the auxiliary layer 514, for instance, a transparent conductive film of ITO or the like may be formed so as to perform optical adjustment. Alternatively, a film of an electron-accepting compound typified by molybdenum oxide may be formed. Further alternatively, an electron-relay layer described below may be provided as the auxiliary layer 514.

The electron-relay layer refers to a layer capable of immediately receiving electrons drawn by the electron-accepting compound in the charge generation layer (a region 512 including the electron-accepting compound in FIG. 15B). Thus, the electron-relay layer is a layer that contains a substance having a high electron-transport property, and preferably formed using a material having a LUMO level between the acceptor level of the electron-accepting compound and the LUMO level of the first EL layer 503. Specifically, the material preferably has a LUMO level greater than or equal to about −5.0 eV, more preferably a LUMO level greater than or equal to about −5.0 eV and less than or equal to −3.0 eV. As the substance used for the electron-relay layer, for example, perylene derivatives and nitrogen-containing condensed aromatic compounds can be given. Nitrogen-containing condensed aromatic compounds are preferably used for the electron-relay layer because of its stability. Among nitrogen-containing condensed aromatic compounds, a compound having an electron-withdrawing group such as a cyano group or a fluoro group is preferably used because such a compound further facilitates reception of electrons in the electron-relay layer.

Specific examples of the perylene derivative that can be used for the electron-relay layer include 3,4,9,10-perylenetetracarboxylic dianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), and the like. As specific examples of the nitrogen-containing condensed aromatic compound, the following can be given: pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: $HAT(CN)_6$), 2,3-diphenylpyrido[2,3-b]pyrazine (abbreviation: 2PYPR), 2,3-bis(4-fluorophenyl)pyrido[2,3-b]pyrazine (abbreviation: F2PYPR), and the like. Further, any of the following materials can be used for the electron-relay layer: perfluoropentacene, 7,7,8,8-tetracyanoquinodimethane (abbreviation: TCNQ), 1,4,5,8-naphthalenetetracarboxylic dianhydride (abbreviation: NTCDA), copper hexadecafluorophthalocyanine (abbreviation: $F_{16}CuPc$), N,N'-bis(2,2,3,3,4,4,5,5,6,6,7,7,8,8,8-pentadecafluorooctyl)-1,4,5,8-naphthalenetetracarboxylic diimide (abbreviation: NTCDI-C8F), 3',4'-dibutyl-5,5''-bis(dicyanomethylene)-5,5''-dihydro-2,2':5',2''-terthiophene (abbreviation: DCMT), methanofullerenes (e.g., [6,6]-phenyl $C_{61}$ butyric acid methyl ester (abbreviation: PCBM)), and the like.

The electron-relay layer may include an electron-donating compound. The electron-donating compound can be an alkali metal, an alkaline earth metal, a rare earth metal, or a compound of an alkali metal, an alkaline earth metal, or a rare earth metal (including an oxide, a halide, and a carbonate). Specific examples include metals such as lithium (Li), cesium (Cs), magnesium (Mg), calcium (Ca), strontium (Sr), europium (Eu), and ytterbium (Yb) and compounds thereof. These metals or metal compounds are preferable because their electron-injection property is high.

Although the light-emitting elements having the two EL layers are described in this embodiment, the present invention can be similarly applied to a light-emitting element in which three or more EL layers are stacked. Such a tandem light-emitting element is capable of emitting light in a high luminance region while the current density is kept low; thus, an element having a long lifetime can be realized. When the light-emitting element is applied for illumination, for example, a voltage drop due to resistance of an electrode material can be suppressed, thereby achieving uniform light emission in a large area. In addition, a light-emitting device having reduced power consumption can be realized. Thus, a tandem light-emitting element is fabricated using the EL layers having the structure described in Embodiment 1 or 2, thereby creating a synergistic effect on lifetime and power consumption.

Further, by making emission colors of the EL layers different from each other, light with a desired color can be emitted from the light-emitting element as a whole. For instance, by making emission colors of the first and second EL layers complementary colors, white light can be emitted from a light-emitting element having two EL layers as a whole. Note that the term "complementary" means color relationship in which an achromatic color is obtained when colors are mixed. That is, white light emission can be obtained by mixture of light from substances whose emission colors are complementary colors. This is applied to a light-emitting element having three or more light-emitting units: for example, when the emission colors of the first, second, and third EL layers are respectively red, green, and blue, white light can be emitted from the light-emitting element as a whole.

This embodiment can be combined with any of the other embodiments and examples.

(Embodiment 5)

Embodiment 5 will provide descriptions of a passive matrix light-emitting device and an active matrix light-emitting device which are examples of a light-emitting device manufactured using the light-emitting element described in the above embodiments.

FIGS. 26A to 26D and FIG. 27 illustrate examples of passive matrix light-emitting devices.

In a passive-matrix (also called simple-matrix) light-emitting device, a plurality of anodes arranged in stripes (in stripe form) is provided to be perpendicular to a plurality of cathodes arranged in stripes. A light-emitting layer is interposed at each intersection. Therefore, a pixel at an intersection of an anode selected (to which voltage is applied) and a cathode selected emits light.

Figure 26A:
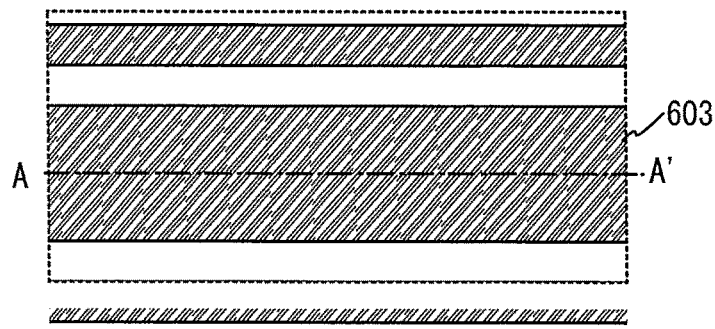
FIGS. 26A to 26D illustrate a light-emitting device according to Embodiment.
Figure 26B:
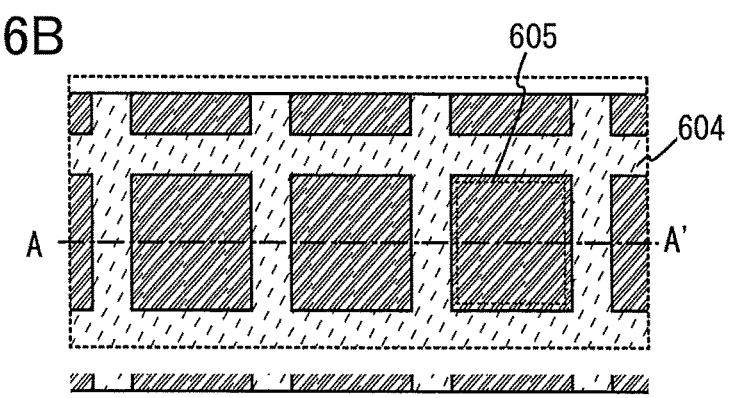
Figure 26C:
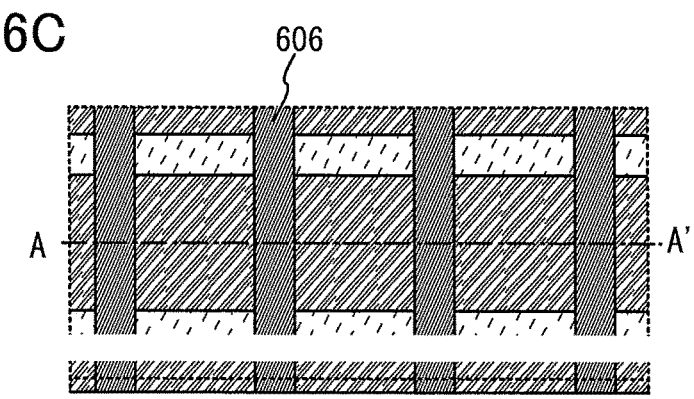
Figure 26D:
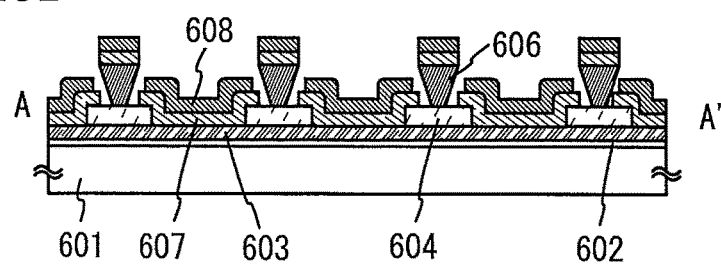

FIGS. 26A to 26C are top views of a pixel portion before sealing, and FIG. 26D is a cross-sectional view taken along chain line A-A' in FIGS. 26A to 26C.

Over a substrate 601, an insulating layer 602 is formed as a base insulating layer. Note that the insulating layer 602 may be omitted when unnecessary. Over the insulating layer 602, a plurality of first electrodes 603 is arranged in stripes at regular intervals (FIG. 26A). The first electrodes 603 described in this embodiment correspond to the anode or cathode in this specification.

In addition, a partition 604 having openings 605 in regions corresponding to pixels is provided over the first electrodes 603. The partition 604 is formed using an insulating material. For example, polyimide, acrylic, polyamide, polyimide amide, a resist, a photosensitive or non-photosensitive organic material such as benzocyclobutene, or an SOG film such as an $SiO_x$ film that contains an alkyl group can be used as the insulating material. An opening 605 corresponding to each pixel is a light-emitting region (FIG. 26B).

Over the partition 604 having openings, a plurality of partitions 606 is provided to intersect with the first electrodes 603 (FIG. 26C). The plurality of partitions 606 is formed in parallel to each other, and inversely tapered.

Over the first electrodes 603 and the partitions 604, an EL layer 607 and a second electrode 608 are sequentially stacked (FIG. 26D). Note that the second electrode 608 in this embodiment corresponds to the anode or cathode in this specification. The total height of the partition 604 and the partition 606 is larger than the total thickness of the EL layer 607 and the second electrode 608; therefore, the EL layer 607 and the second electrode 608 are divided into a plurality of regions as illustrated in FIG. 26D. Note that the plurality of divided regions is electrically isolated from one another.

The second electrodes 608 are formed in stripes and extend in the direction in which they intersect with the first electrodes 603. Note that part of a layer forming the EL layer 607 and part of a conductive layer forming the second electrodes 608 are formed over the inversely tapered partitions 606; however, they are separated from the EL layer 607 and the second electrodes 608.

In addition, when necessary, a sealing material such as a sealing can or a glass substrate may be attached to the substrate 601 by an adhesive agent for sealing so that the light-emitting element can be disposed in the sealed space. Thus, deterioration of the light-emitting element can be prevented. The sealed space may be filled with filler or a dry inert gas. Further, a desiccant or the like is preferably put between the substrate and the sealing material to prevent deterioration of the light-emitting element due to moisture or the like. The desiccant removes a minute amount of moisture, thereby achieving sufficient desiccation. As the desiccant, oxide of an alkaline earth metal such as calcium oxide or barium oxide, zeolite, or silicagel can be used. Oxide of an alkaline earth metal adsorbs moisture by chemical adsorption, and zeolite and silicagel adsorb moisture by physical adsorption.

Figure 27:
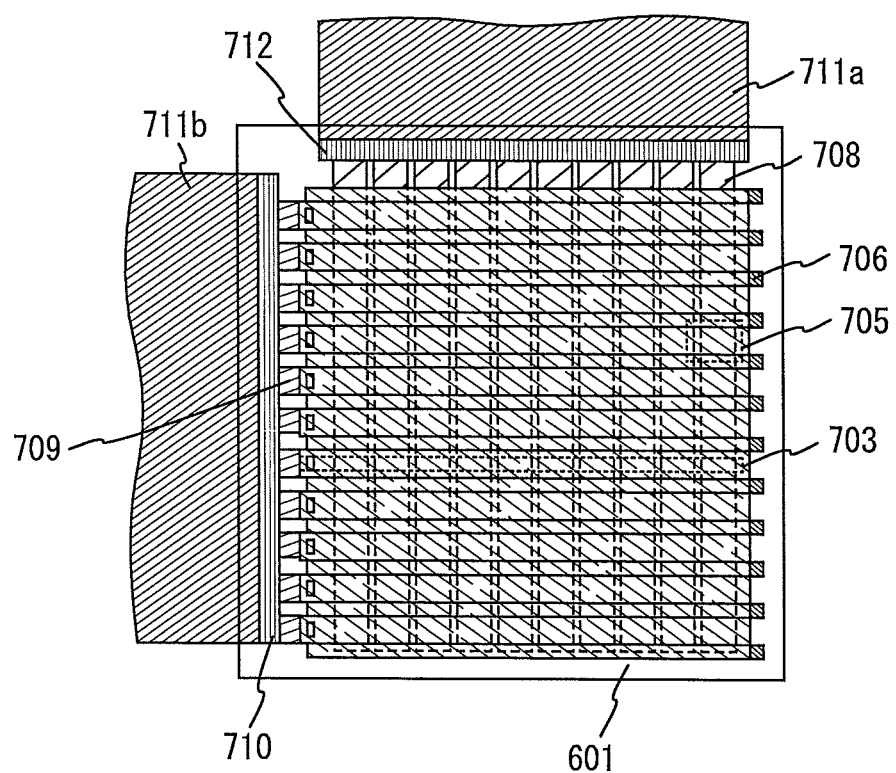
FIG. 27 illustrates a light-emitting device according to Embodiment.

FIG. 27 is a top view of the passive-matrix light-emitting device illustrated in FIGS. 26A to 26D that is provided with a flexible printed circuit (an FPC) or the like.

As illustrated in FIG. 27, in a pixel portion forming an image display, scanning lines and data lines are arranged to intersect with each other so that the scanning lines and the data lines are perpendicular to each other.

The first electrodes 603 in FIGS. 26A to 26D correspond to scan lines 703 in FIG. 27; the second electrodes 608 in FIGS. 26A to 26D correspond to data lines 708 in FIG. 27; and the inversely-tapered partitions 606 correspond to partitions 706. The EL layer 607 illustrated in FIG. 26D are interposed between the data lines 708 and the scanning lines 703, and an intersection indicated by a region 705 corresponds to one pixel.

The scanning lines 703 are electrically connected at their ends to connection wirings 709, and the connection wirings 709 are connected to an FPC 711b via an input terminal 710. In addition, the data lines 708 are connected to an FPC 711a via an input terminal 712.

An optical film such as a polarizing plate, a circularly polarizing plate (including an elliptically polarizing plate), a retardation plate (a quarter-wave plate or a half-wave plate), or a color filter may be provided as needed. Further, an anti-reflection film may be provided in addition to the polarizing plate or the circularly polarizing plate. By providing the anti-reflection film, anti-glare treatment may be carried out by which reflected light can be scattered by roughness of a surface so as to reduce reflection.

Although FIG. 27 illustrates the example in which a driver circuit is not provided over the substrate, an IC chip including a driver circuit may be mounted on the substrate.

When the IC chip is mounted, a data line side IC and a scanning line side IC, in each of which the driver circuit for transmitting a signal to a pixel portion is formed, are mounted on the periphery of (outside) the pixel portion. As a method for mounting an IC chip, a COG method, TCP, a wire bonding method, or the like can be used. The TCP is a TAB tape mounted with the IC, and the TAB tape is connected to a wiring over an element formation substrate to mount the IC. The data line side IC and the scanning line side IC may be formed using a silicon substrate, a silicon on insulator (SOI) substrate, a glass substrate, a quartz substrate, or a plastic substrate.

Figure 28A:
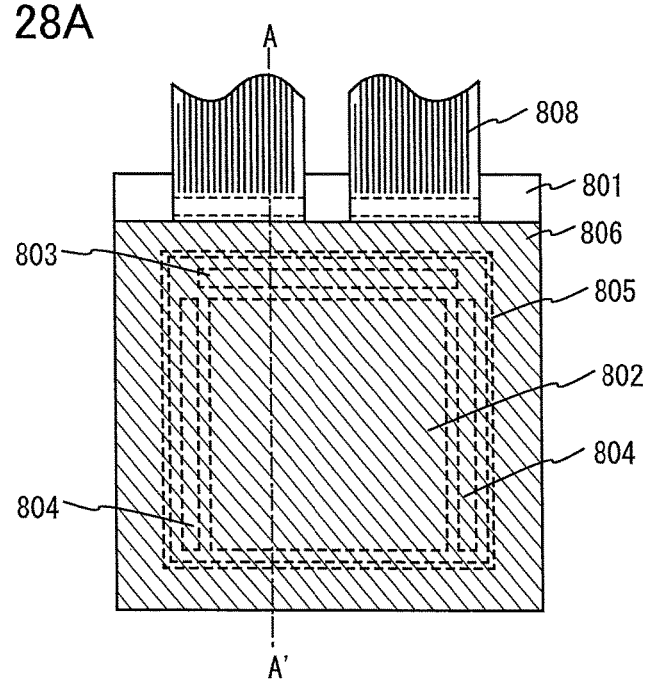
FIGS. 28A and 28B illustrate a display device according to Embodiment.
Figure 28B:
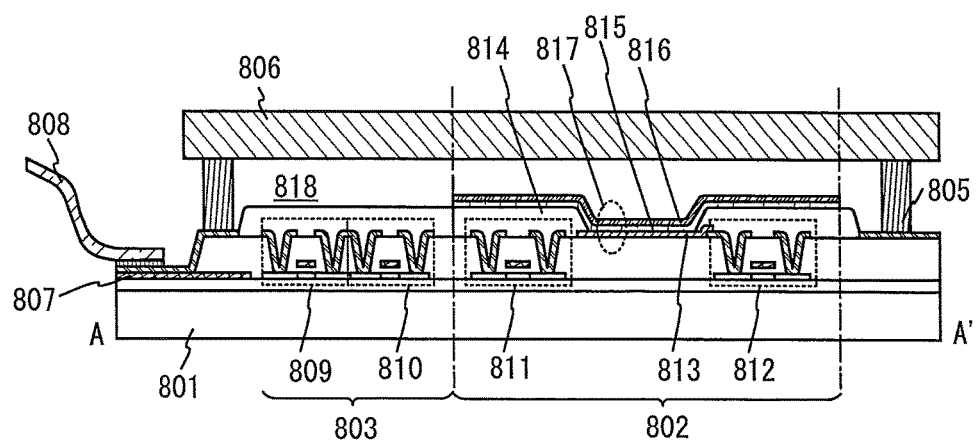

Next, an example of the active-matrix light-emitting device is described with reference to FIGS. 28A and 28B. FIG. 28A is a top view illustrating a light-emitting device and FIG. 28B is a cross-sectional view taken along dashed line A-N in FIG. 28A. The active-matrix light-emitting device of this embodiment includes a pixel portion 802 provided over an element substrate 801, a driver circuit portion (a source-side driver circuit) 803, and a driver circuit portion (a gate-side driver circuit) 804. The pixel portion 802, the driver circuit portion 803 and the driver circuit portion 804 are sealed between the element substrate 801 and the sealing substrate 806 by the sealing material 805.

Over the element substrate 801, a lead wiring 807 for connecting an external input terminal through which a signal (e.g., a video signal, a clock signal, a start signal, a reset signal, or the like) or electric potential from the outside is transmitted to the driver circuit portion 803 and the driver circuit portion 804 is provided. Here, an example is described in which an FPC 808 is provided as the external input terminal. Note that although only an FPC is illustrated here, a printed wiring board (PWB) may be attached thereto. In this specification, the light-emitting device includes in its category the light-emitting device itself and the light-emitting device on which the FPC or the PWB is mounted.

Next, a cross-sectional structure of the active-matrix light-emitting device is described with reference to FIG. 28B. Although the driver circuit portion 803, the driver circuit portion 804, and the pixel portion 802 are formed over the element substrate 801, the pixel portion 802 and the driver circuit portion 803 which is the source side driver circuit are illustrated in FIG. 28B.

In the driver circuit portion 803, an example including a CMOS circuit includes an n-channel TFT 809 and a p-channel TFT 810 is illustrated. Note that a circuit included in the driver circuit portion can be formed using various types of circuits such as a CMOS circuit, a PMOS circuit, or an NMOS circuit. In this embodiment, a driver-integrated type in which a driver circuit and the pixel portion are formed over the same substrate is described; however, the present invention is not limited to this structure, and a driver circuit can be formed over a substrate that is different from the substrate over which a pixel portion is formed.

The pixel portion 802 has a plurality of pixels, each including a switching TFT 811, a current-controlling TFT 812, and an anode 813 electrically connected to a wiring (a source electrode or a drain electrode) of the current-controlling TFT 812. An insulator 814 is formed so as to cover an end portion of the anode 813. In this embodiment, the insulator 814 is formed using a positive photosensitive acrylic resin. Note that there is no particular limitation on structures of the TFTs such as the switching TFT 811 and the current-controlling TFT 812. For example, a staggered TFT or an inverted-staggered TFT may be used. A top-gate TFT or a bottom-gate TFT may also be used. There is no particular limitation also on materials of a semiconductor used for the TFTs, and silicon or an oxide semiconductor such as oxide including indium, gallium, and zinc may be used. In addition, there is no particular limitation also on crystallinity of a semiconductor used for the TFTs, and an amorphous semiconductor or a crystalline semiconductor may be used.

A light-emitting element 817 includes an anode 813, an EL layer 815, and a cathode 816. Since the structure and materials for the light-emitting element is described in any of the above embodiments, a detailed description is omitted in this embodiment. Note that the anode 813, the EL layer 815, and the cathode 816 in FIGS. 28A and 28B correspond to respectively the anode 101, the EL layer 103, and the cathode 102 in FIGS. 1A and 1B and FIG. 3. Although not illustrated, the cathode 816 is electrically connected to the FPC 808 which is an external input terminal.

The insulator 814 is provided at an end portion of the anode 813. In addition, in order that the cathode 816 which is formed over the insulator 814 at least favorably cover the insulator 814, the insulator 814 is preferably formed so as to have a curved surface with curvature at an upper end portion or a lower end portion. For example, it is preferable that the upper end portion or the lower end portion of the insulator 814 have a curved surface with a radius of curvature (0.2 μm to 3 μm). The insulator 814 can be formed using an organic compound such as a negative photosensitive resin which becomes insoluble in an etchant by light or a positive photosensitive resin which becomes soluble in an etchant by light, or an inorganic compound such as silicon oxide or silicon oxynitride can be used.

Although the cross-sectional view of FIG. 28B illustrates only one light-emitting element 817, a plurality of light-emitting elements is arranged in matrix in the pixel portion 802. For example, light-emitting elements that emit light of three kinds of colors (R, Q, and B) are formed in the pixel portion 802, so that a light-emitting device capable of full color display can be obtained. Alternatively, a light-emitting device which is capable of full color display may be manufactured by a combination with color filters.

The light-emitting element 817 is formed in a space 818 that is surrounded by the element substrate 801, the sealing substrate 806, and the sealing material 805. The space 818 may be filled with a rare gas, a nitrogen gas, or the sealing material 805.

It is preferable to use as the sealing material 805, a material that transmits as little moisture and oxygen as possible, such as an epoxy-based resin. As the sealing substrate 806, a glass substrate, a quartz substrate, a plastic substrate formed of fiberglass-reinforced plastics (FRP), polyvinyl fluoride (PVF), polyester, acrylic, or the like can be used.

In the above-described manner, an active-matrix light-emitting device can be obtained.

This embodiment can be combined with any of the other embodiments and examples.

(Embodiment 6)

Embodiment 6 will give specific examples of electronic devices and lighting devices each of which is manufactured using a light-emitting device described in any of the above embodiments referring to FIGS. 29A to 29E and FIG. 30.

Examples of electronic devices that can be applied to the present invention include a television set (also referred to as a television or a television receiver), a monitor of a computer, a digital camera, a digital video camera, a digital photo frame, a mobile phone, a portable game machine, a portable information terminal, an audio reproducing device, a game machine (e.g., a pachinko machine or a slot machine), and the like. Some specific examples of these electronic devices and lighting devices are illustrated in FIGS. 29A to 29E and FIG. 30.

Figure 29A:
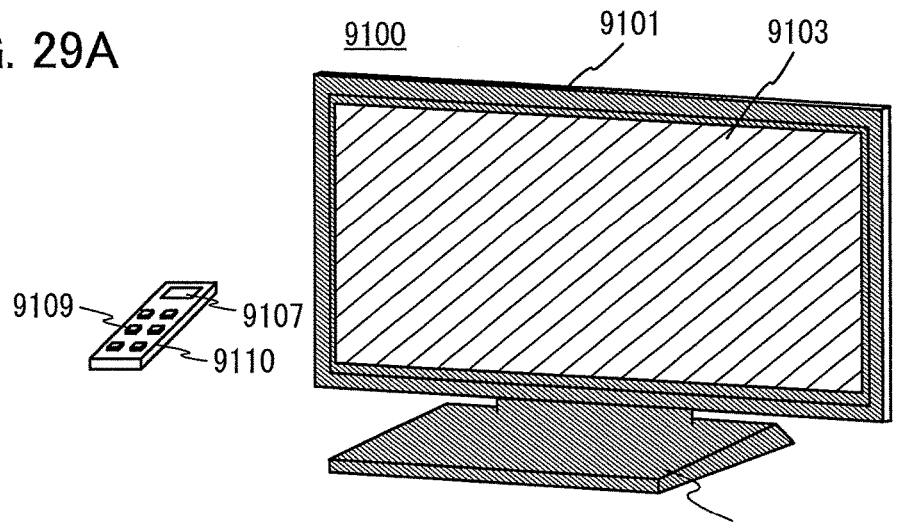
FIGS. 29A to 29E each illustrate an electronic device according to Embodiment.

FIG. 29A illustrates a television set 9100. In the television set 9100, a display portion 9103 is incorporated in a housing 9101. A light-emitting device manufactured using one embodiment of the present invention can be used in the display portion 9103, so that an image can be displayed on the display portion 9103. Note that the housing 9101 is supported by a stand 9105 here.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television set 9100 illustrated in FIG. 29A is provided with a receiver, a modem, and the like. With the receiver, the television set 9100 can receive a general television broadcast. Further, when the television set 9100 is connected to a communication network by wired or wireless connection via the modem, one-way (from a transmitter to a receiver) or two-way (between a transmitter and a receiver or between receivers) data communication can be performed.

Since a light-emitting device manufactured using one embodiment of the present invention has high emission efficiency and a long lifetime, the display portion 9103 including the light-emitting device in the television set 9100 can display an image with improved image quality as compared with conventional images.

Figure 29B:
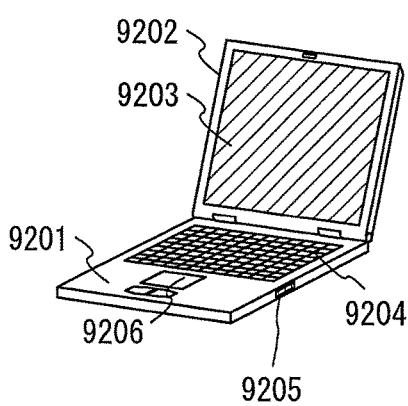

FIG. 29B illustrates a computer including a main body 9201, a housing 9202, a display portion 9203, a keyboard 9204, an external connection port 9205, a pointing device 9206, and the like. The computer is manufactured using a light-emitting device manufactured using one embodiment of the present invention for the display portion 9203.

Since a light-emitting device manufactured using one embodiment of the present invention has high emission efficiency and a long lifetime, the display portion 9203 including the light-emitting device in the computer can display an image with improved image quality as compared with conventional images.

Figure 29C:
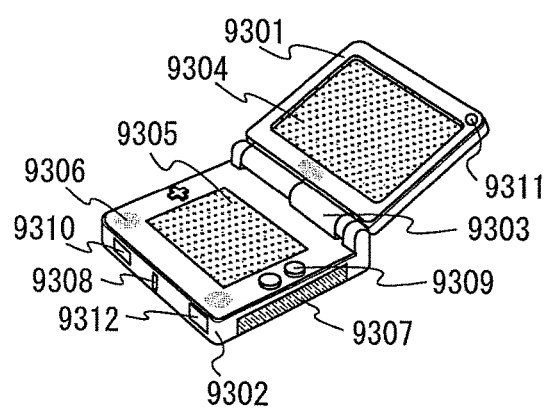

FIG. 29C illustrates a portable game machine including two housings, a housing 9301 and a housing 9302 which are jointed with a connector 9303 so as to be opened and closed. A display portion 9304 is incorporated in the housing 9301, and a display portion 9305 is incorporated in the housing 9302. In addition, the portable game machine illustrated in FIG. 29C includes an operation key 9309, a connection terminal 9310, a sensor 9311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 9312. The portable game machine may further be provided with a speaker portion 9306, a recording medium insertion portion 9307, an LED lamp 9308, and the like. Needless to say, the structure of the portable amusement machine is not limited to the above, and it is acceptable as long as the light-emitting device manufactured using any of the above embodiments is used for one or both of the display portion 9304 and the display portion 9305.

The portable game machine illustrated in FIG. 29C has a function of reading a program or data stored in a recording medium to display it on the display portion, and a function of sharing information with another portable game machine by wireless communication. Note that a function of the portable game machine illustrated in FIG. 29C is not limited to the above, and the portable game machine can have a variety of functions.

Since a light-emitting device manufactured using one embodiment of the present invention has high emission efficiency and a long lifetime, the display portions (9304 and 9305) including the light-emitting device in the portable game machine can display an image with improved image quality as compared with conventional images.

Figure 29D:
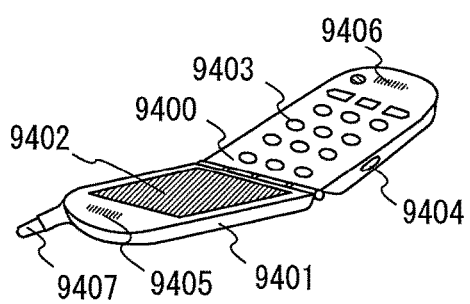

FIG. 29D illustrates an example of a mobile phone. A mobile phone 9400 is provided with a display portion 9402 incorporated in a housing 9401, operation buttons 9403, an external connection port 9404, a speaker 9405, a microphone 9406, an antenna 9407, and the like. Note that the mobile phone 9400 is manufactured using a light-emitting device manufactured using one embodiment of the present invention for the display portion 9402.

Users can input data, make a call, or text messaging by touching the display portion 9402 of the mobile phone 9400 illustrated in FIG. 29D with their fingers or the like.

There are mainly three screen modes for the display portion 9402. The first mode is a display mode mainly for displaying images. The second mode is an input mode mainly for inputting data such as text. The third mode is a display-and-input mode in which two modes of the display mode and the input mode are combined.

For example, in the case of making a call or text messaging, an input mode mainly for inputting text is selected for the display portion 9402 so that characters displayed on a screen can be input. In this case, it is preferable to display a keyboard or number buttons on almost the entire screen of the display portion 9402.

By providing a detection device which includes a sensor for detecting inclination, such as a gyroscope or an acceleration sensor, inside the mobile phone 9400, the direction of the mobile phone 9400 (whether the mobile phone 9400 is placed horizontally or vertically for a landscape mode or a portrait mode) is determined so that display on the screen of the display portion 9402 can be automatically switched.

In addition, the screen mode is switched by touching the display portion 9402 or operating the operation buttons 9403 of the housing 9401. Alternatively, the screen mode can be switched depending on kinds of images displayed on the display portion 9402. For example, when a signal of an image displayed on the display portion is a signal of moving image data, the screen mode is switched to the display mode. When the signal is a signal of text data, the screen mode is switched to the input mode.

Furthermore, in the input mode, when input by touching the display portion 9402 is not performed for a certain period while a signal is detected by the optical sensor in the display portion 9402, the screen mode may be controlled so as to be switched from the input mode to the display mode.

The display portion 9402 can also function as an image sensor. For example, an image of a palm print, a fingerprint, or the like is taken by touching the display portion 9402 with the palm or the finger, whereby personal authentication can be performed. Further, by providing a backlight or a sensing light source which emits a near-infrared light in the display portion, an image of a finger vein, a palm vein, or the like can be taken.

Since a light-emitting device manufactured using one embodiment of the present invention has high emission efficiency and a long lifetime, the display portion 9402 including the light-emitting device in the mobile phone can display an image with improved image quality as compared with conventional images.

Figure 29E:
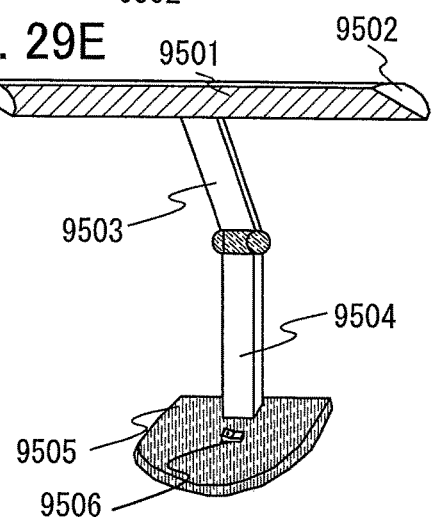

FIG. 29E illustrates a tabletop lighting device including a lighting portion 9501, a shade 9502, an adjustable arm 9503, a support 9504, a base 9505, and a power supply switch 9506. The tabletop lighting device is manufactured using a light-emitting device manufactured using one embodiment of the present invention for the lighting portion 9501. Note that the modes of the lighting device is not limited to tabletop lighting devices, but include ceiling-fixed lighting devices, wall-hanging lighting devices, portable lighting devices, and the like.

Figure 30:
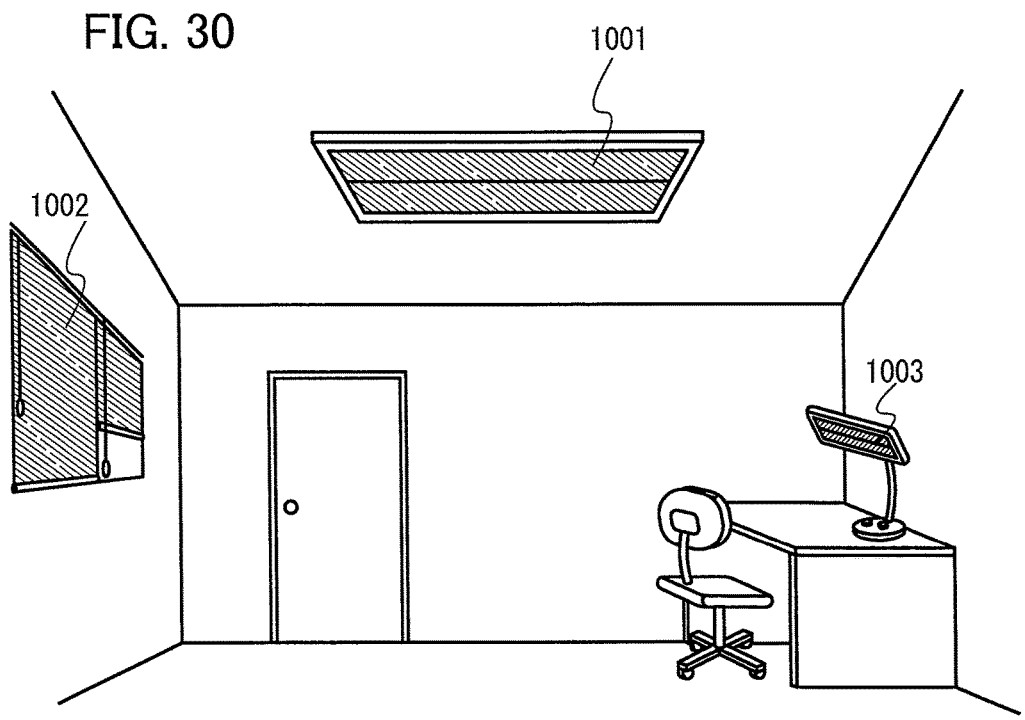
FIG. 30 illustrates lighting devices according to Embodiment.

FIG. 30 illustrates an example in which the light-emitting device manufactured using one embodiment of the present invention is used for an indoor lighting device 1001. Since the light-emitting device manufactured using one embodiment of the present invention can have a large area, the light-emitting device can be used as a lighting apparatus having a large area. In addition, the light-emitting device described in any of the above embodiments can be made thin, and thus can be used as a roll-up type lighting device 1002. As illustrated in FIG. 30, a tabletop lighting device 1003 illustrated in FIG. 29E may be used in a room provided with the indoor lighting device 1001.

Figure 31:
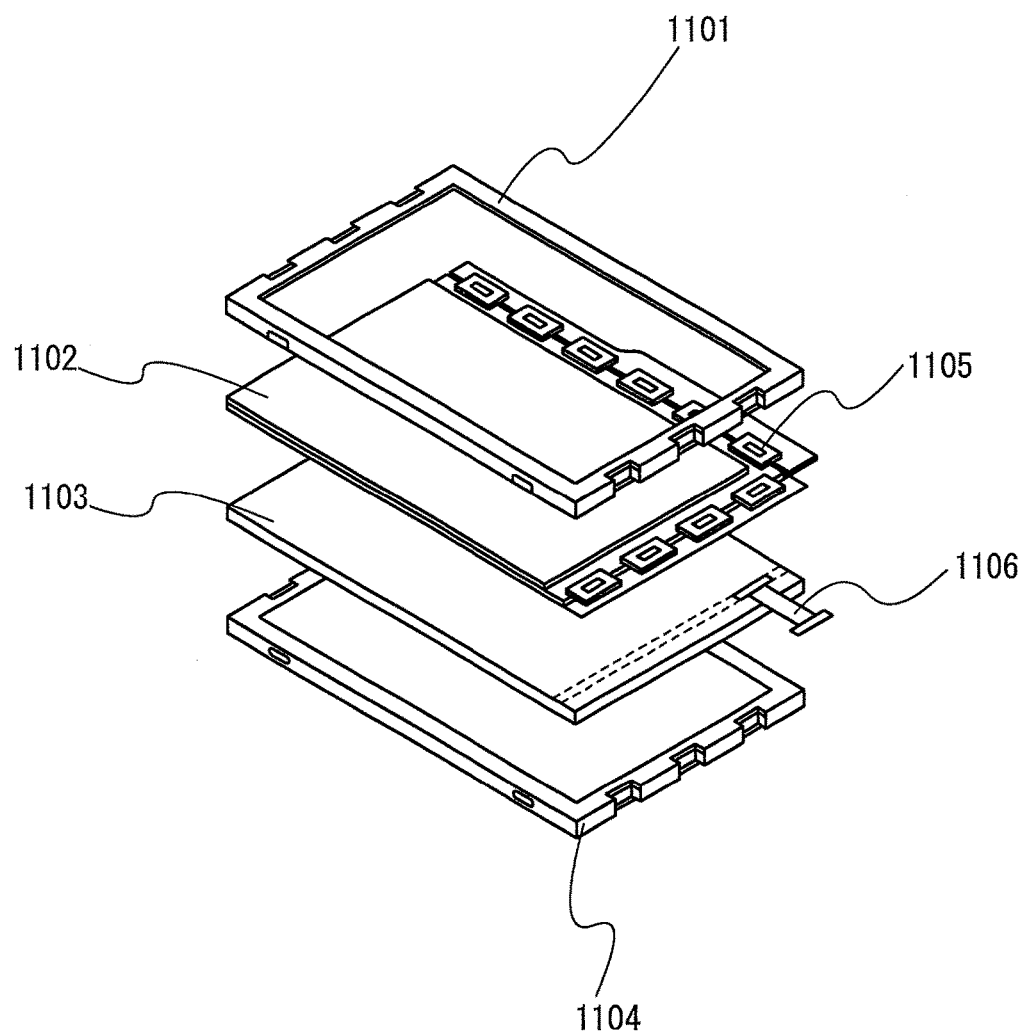
FIG. 31 illustrates a display device according to Embodiment.

The light-emitting device of one embodiment of the present invention can also be used as a lighting device. FIG. 31 illustrates an example of a liquid crystal display device using the light-emitting device of one embodiment of the present invention as a backlight. The display device illustrated in FIG. 31 includes a housing 1101, a liquid crystal layer 1102, a backlight 1103, and a housing 1104. The liquid crystal layer 1102 is electrically connected to a driver IC 1105. The light-emitting device of one embodiment of the present invention is used as the backlight 1103, and current is supplied to the backlight 1103 through a terminal 1106.

By using the light-emitting device of one embodiment of the present invention as a backlight of a liquid crystal display device in this manner, a backlight with low power consumption can be obtained. Moreover, since the light-emitting device of one embodiment of the present invention is a lighting device for surface light emission and the enlargement of the light-emitting device is possible, the backlight can be made larger. Accordingly, a larger-area liquid crystal display device having low power consumption can be obtained.

This embodiment can be combined with any of the other embodiments and examples.

In the above-described manner, electronic devices and lighting devices can be provided using a lighting device manufactured using one embodiment of the present invention. The scope of application of the light-emitting device manufactured using one embodiment of the present invention is so wide that it can be applied to a variety of fields of electronic devices.

EXAMPLE 1

Example 1 will give a measurement example of the HOMO levels of compounds that are preferred as the first, second, third, and fourth organic compounds in the light-emitting element of one embodiment of the present invention. Note that the HOMO levels were examined by cyclic voltammetry (CV) measurement, and an electrochemical analyzer (ALS model 600A or 600C, manufactured by BAS Inc.) was used for the measurements.

Further, the 25 kinds of compounds that were measured will be illustrated below. Compounds 1 and 2 each have anthracene as a skeleton, which is a tricyclic condensed aromatic ring. Compounds 3 and 4 each have carbazole as a skeleton, which is a π excessive heteroaromatic ring. Compounds 5 to 12 each have both anthracene and carbazole as skeletons. Compounds 13 to 15 each have, as skeletons, both anthracene and dibenzofuran which is a π excessive heteroaromatic ring. Compound 16 has, as skeletons, both anthracene and dibenzothiophene which is a π excessive heteroaromatic ring. Compound 17 is pyrene which is a tetracyclic condensed aromatic ring. Compounds 18 to 24 each have carbazole as a skeleton.

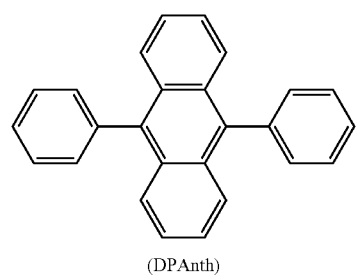

(DPAnth)

1

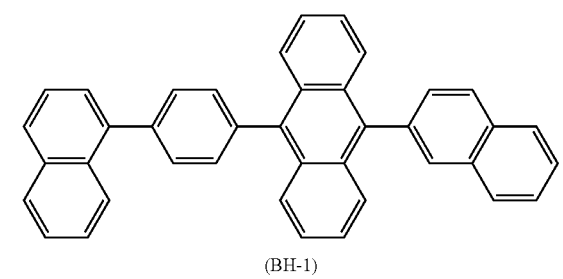

(BH-1)

2

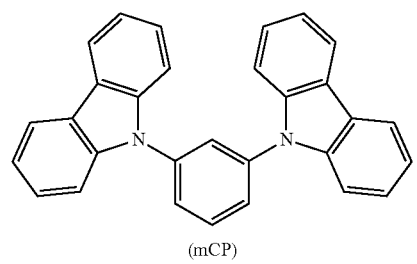

(mCP)

3

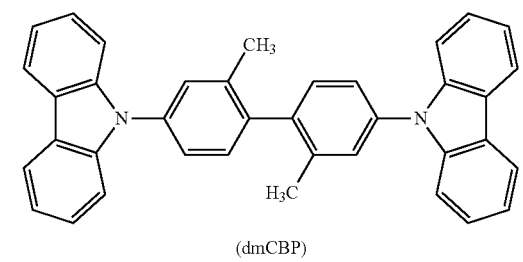

(dmCBP)

4

-continued
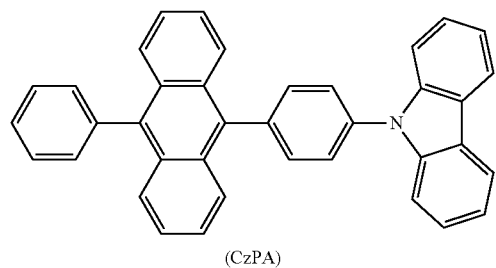
(CzPA)
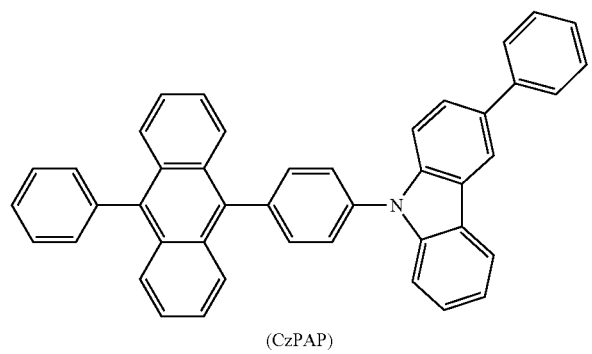
(CzPAP)
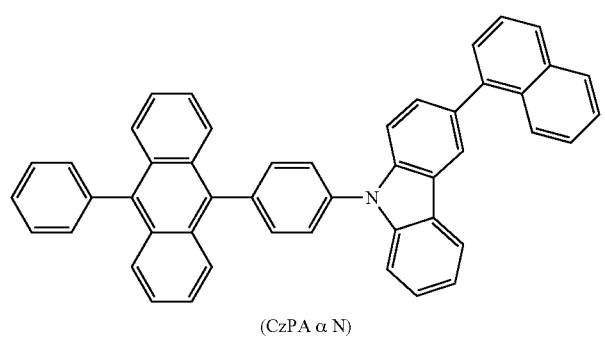
(CzPA α N)
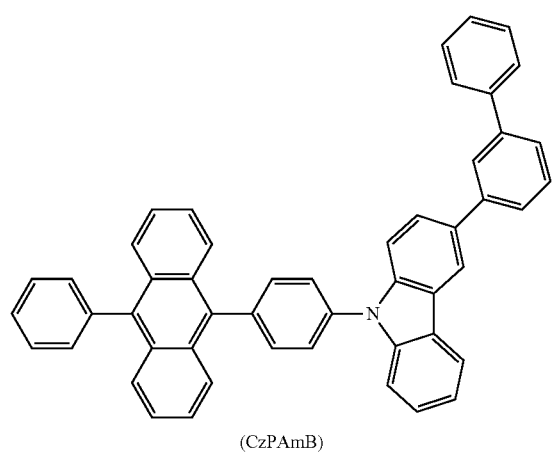
(CzPAmB)
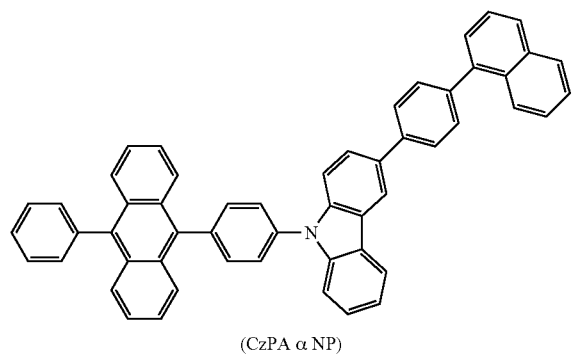
(CzPA α NP)
(PCzPA)
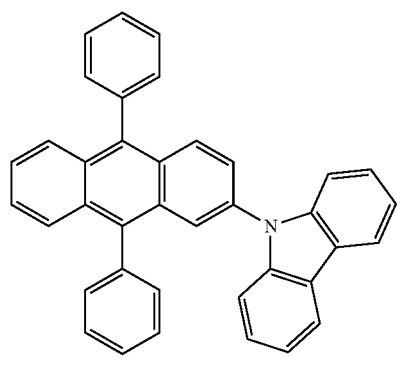
(2CzPA)
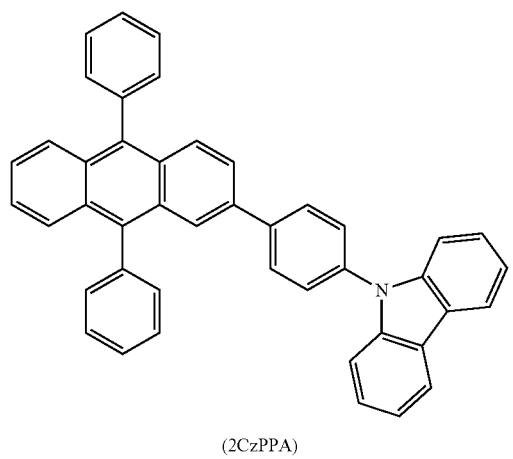
(2CzPPA)

-continued
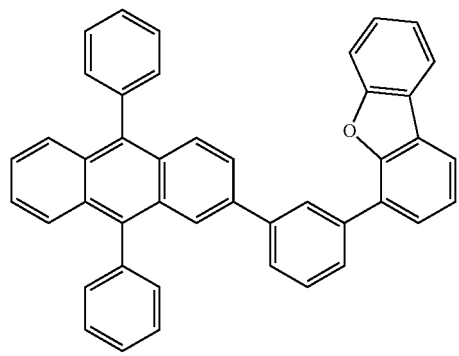
(2mPDBFPA-II)
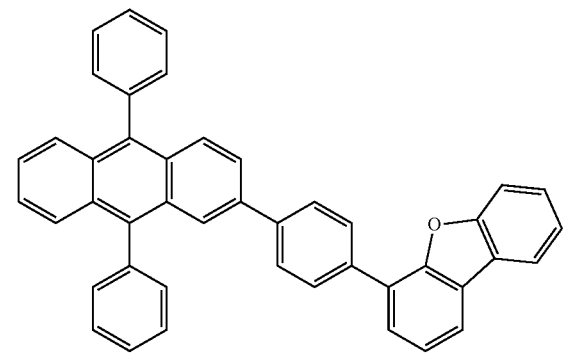
(2PDBFPA-II)
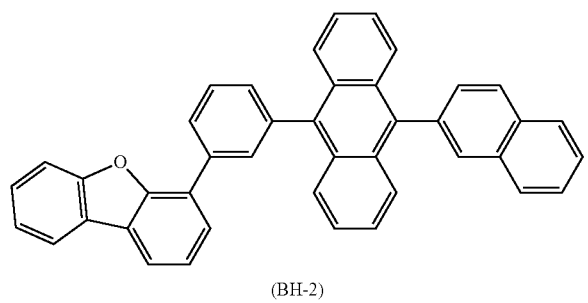
(BH-2)
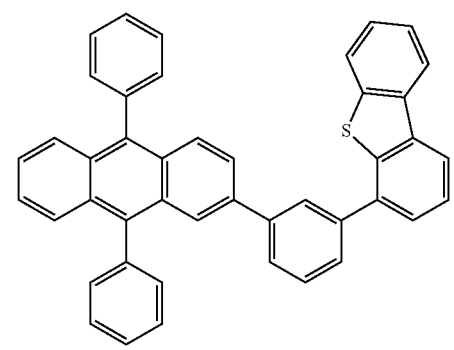
(2mPDBTPA-II)
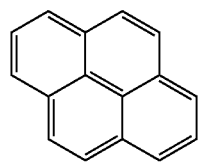
Pyrene
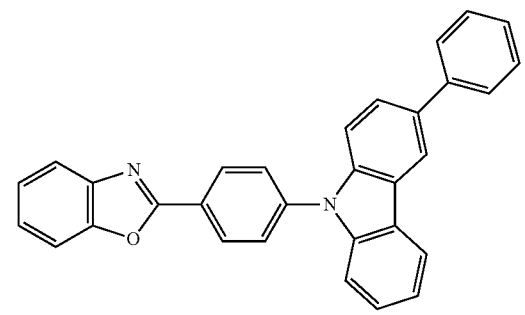
(CzBOx-II)
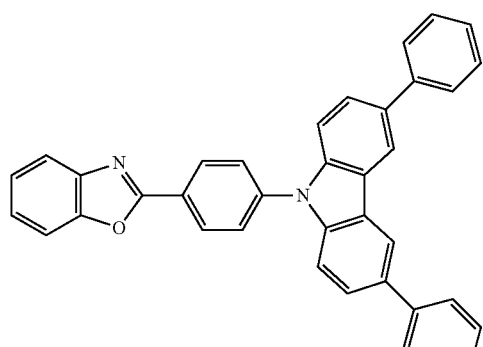
(CzBOx-III)
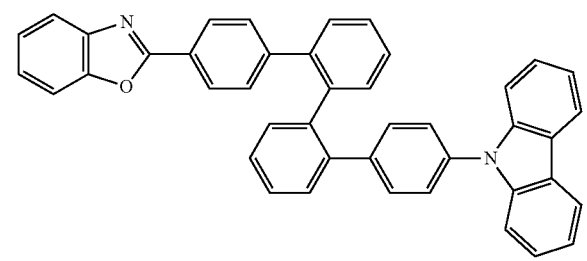
(Z-CzPBOx)

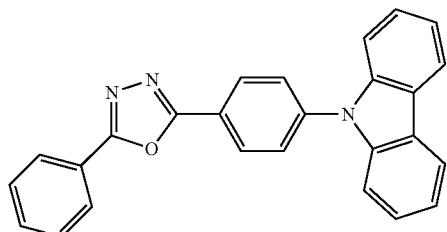

(CO11)

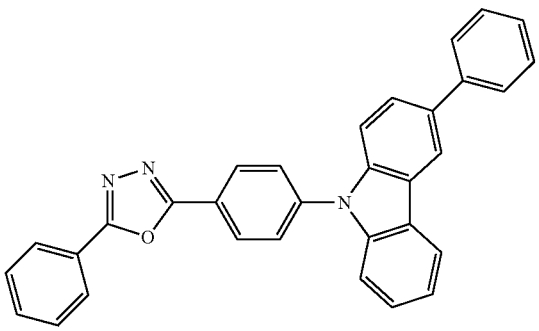

(CO11-II)

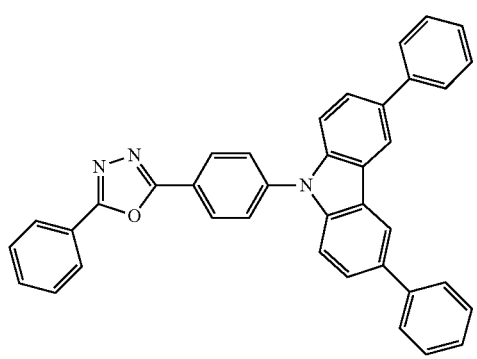

(CO11-III)

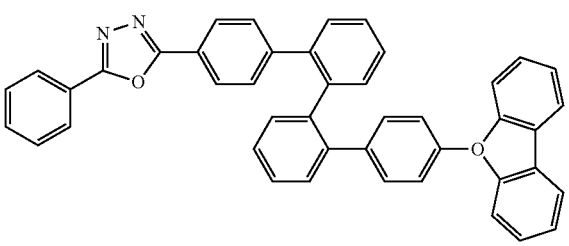

(Z-CzPO11)

First, the measurement method will be specifically described. A solution used for the CV measurement was prepared as follows: with use of dehydrated dimethylformamide (DMF, product of Sigma-Aldrich Inc., 99.8%, catalog No. 22705-6) as a solvent, tetra-n-butylammonium perchlorate (n-Bu$_4$NClO$_4$, product of Tokyo Chemical Industry Co., Ltd., catalog No. T0836), which was a supporting electrolyte, was dissolved in the solvent to give a concentration of 100 mmol/L, and the object to be measured was further dissolved therein to give a concentration of 2 mmol/L. Note that as for a compound which has a low solubility and cannot be dissolved at a concentration of 2 mmol/L, the undissolved portion was removed by filtration and then the filtrate was used for the measurement. A platinum electrode (manufactured by BAS Inc., PTE platinum electrode) was used as a working electrode, a platinum electrode (manufactured by BAS Inc., Pt counter electrode for VC-3, (5 cm)) was used as an auxiliary electrode, and an Ag/Ag$^+$ electrode (manufactured by BAS Inc., RE7 reference electrode for nonaqueous solvent) was used as a reference electrode. The measurements were conducted at room temperature (20° C. to 25° C.). In addition, the scan rate in CV was set to 0.1 V/sec in all the measurements.

[Calculation of Potential Energy of Reference Electrode with Respect to Vacuum Level]

First, the potential energy (eV) of the reference electrode (an Ag/Ag$^+$ electrode), which was used in Example 1, with respect to the vacuum level was calculated. That is, the Fermi level of the Ag/Ag$^+$ electrode was calculated. It is known that the oxidation-reduction potential of ferrocene in methanol is +0.610 [V vs. SHE] with respect to the normal hydrogen electrode (Reference: Christian R. Goldsmith et al., J. Am. Chem. Soc., Vol. 124, No. 1, 83-96, 2002). On the other hand, using the reference electrode used in Example 1, the oxidation-reduction potential of ferrocene in methanol was calculated to be +0.11 V [vs. Ag/Ag$^+$]. Thus, it was found that the potential energy of the reference electrode used in Example 1 was lower than that of the standard hydrogen electrode by 0.50 [eV].

Here, it is known that the potential energy of the normal hydrogen electrode from the vacuum level is −4.44 eV (Reference: Toshihiro Ohnishi and Tamami Koyama, High molecular EL material, Kyoritsu shuppan, pp. 64-67). Accordingly, the potential energy of the reference electrode used in this example with respect to the vacuum level can be calculated as follows: −4.44−0.50=−4.94 [eV].

[Measurement Example of Compound 1 (DPAnth)]

A method of calculating a HOMO level will be described taking an example of Compound 1 (DPAnth). First, with the solution of the object to be measured, the potential was scanned from −0.20 V to 1.30 V and then from 1.30 V to −0.20 V. As a result, an oxidation peak potential $E_{pa}$ of 0.97 V and a reduction peak potential $E_{pc}$ of 0.83 V were observed. Therefore, the half-wave potential (potential intermediate between $E_{pc}$ and $E_{pa}$) can be calculated to be 0.90 V. This shows that DPAnth is oxidized by electric energy of 0.90 [V vs. Ag/Ag$^+$], and this energy corresponds to the HOMO level. Here, since the potential energy of the reference electrode, which was used in this example, with respect to the vacuum level is −4.94 [eV] as described above, the HOMO level of DPAnth was calculated as follows: −4.94−(0.90)=−5.84 [eV].

[Measurement Results]

Figure 16:
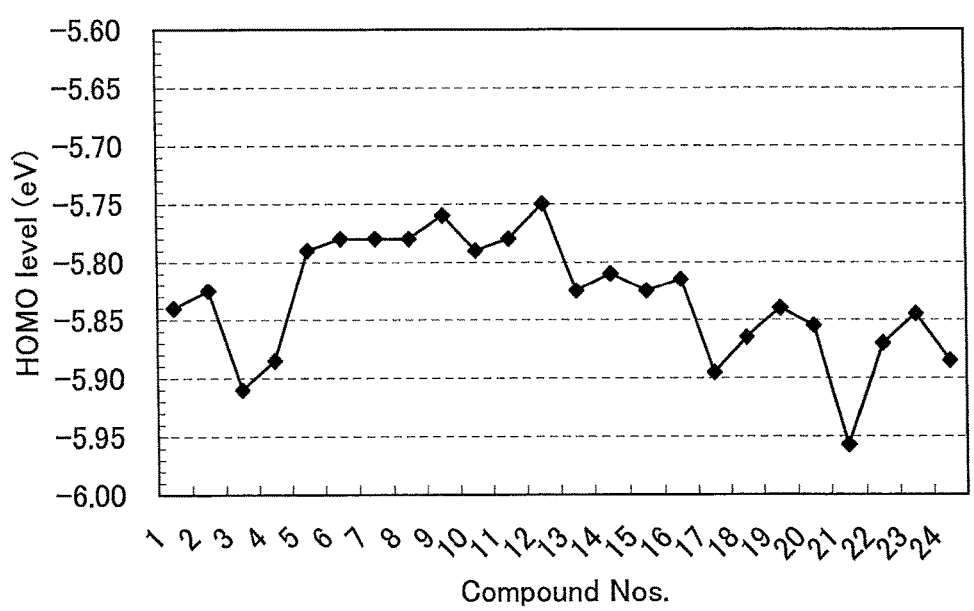
FIG. 16 is a diagram for describing compounds used for light-emitting elements according to Example.

As for Compounds 2 to 24, the HOMO levels were examined by the same measurements. The measurement results are illustrated in FIG. 16. FIG. 16 reveals that the HOMO level difference is roughly 0.2 eV or less among the compounds having a π excessive heteroaromatic ring, those having a tricyclic condensed aromatic hydrocarbon ring, and those having a tetracyclic condensed aromatic hydrocarbon ring. In addition, the HOMO level of each compound is from −5.7 eV to −6.0 eV inclusive (the second decimal place is rounded off). These results indicate that there is no substantial hole-injection barrier between compounds each having a skeleton selected from the above skeletons as a hole-transport skeleton.

Thus, the hole-transport skeletons of the first, second, third, and fourth organic compounds in the present invention each separately include at least any of compounds having a π excessive heteroaromatic ring (carbazole, dibenzofuran, or dibenzothiophene, in particular), those having a tricyclic aromatic hydrocarbon ring and those having a tetracyclic condensed (particularly, anthracene), whereby a preferred embodiment of the present invention can be realized.

EXAMPLE 2

Example 2 will provide descriptions of fabrication examples and characteristics of light-emitting elements which are embodiments of the present invention together with reference examples. Structural Formulae of materials used in Example 2 will be illustrated below.

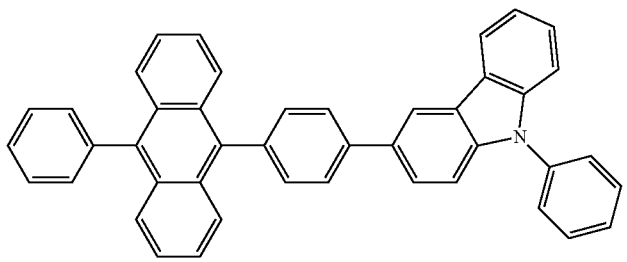

PCzPA

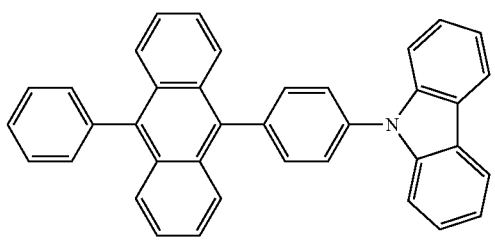

CzPA

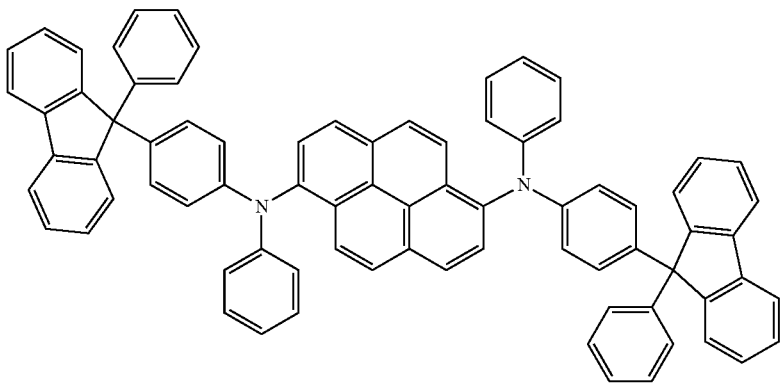

1,6-FLPAPm

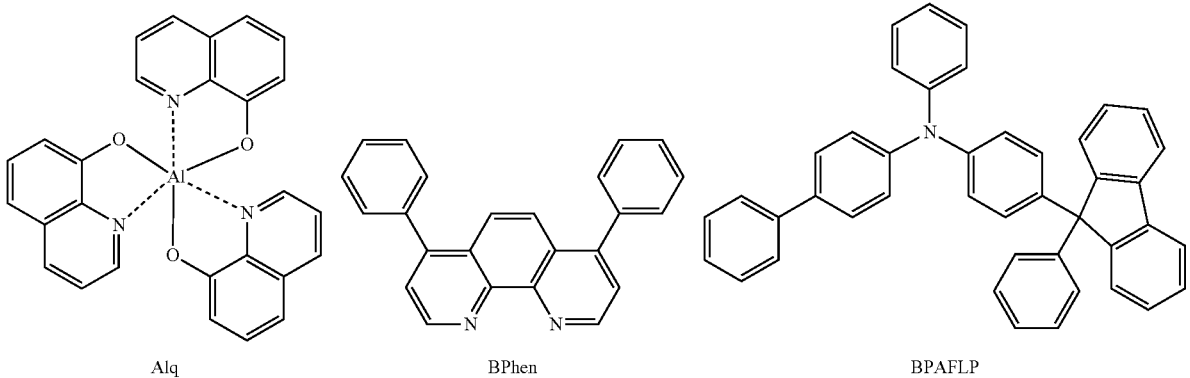

Alq　　　　　　　　BPhen　　　　　　　　BPAFLP

To begin with, a method of fabricating the light-emitting element (Light-emitting Element 1) which is one embodiment of the present invention will be described. FIG. 5 illustrates the element structure.

(Light-Emitting Element 1)

First, a glass substrate, over which an indium tin oxide containing silicon oxide (abbreviation: ITSO) film was formed to a thickness of 110 nm as the anode 401, was prepared. The periphery of a surface of the ITSO film was covered with a polyimide film so that a 2 mm square portion of the surface was exposed. The electrode area was set to 2 mm×2 mm As a pretreatment for forming the light-emitting element over this substrate, the surface of the substrate was washed with water and baked at 200° C. for one hour, and then a UV ozone treatment was performed for 370 seconds. Then, the substrate was transferred into a vacuum evaporation apparatus where the pressure was reduced to about $10^{-5}$ Pa. In a heating chamber of the vacuum evaporation apparatus, baking was performed at 170° C. for 30 minutes in vacuum. After that, the substrate was cooled down for about 30 minutes.

Next, the glass substrate provided with the anode 401 was fixed to a substrate holder provided in a film formation chamber of the vacuum evaporation apparatus such that the surface on which the anode 401 was formed was faced downward.

Then, first of all, 9-phenyl-3-[4-(10-phenyl-9-anthryl)phenyl]-9H-carbazole (abbreviation: PCzPA) and molybdenum(VI) oxide were co-evaporated over the anode 401, thereby forming the first layer 411 in which molybdenum oxide corresponding to the electron-accepting compound was added to PCzPA corresponding to the first organic compound. The evaporation was performed using resistance heating. The thickness of the first layer 411 was 50 nm. The evaporation rate was controlled such that the weight ratio of PCzPA to molybdenum(VI) oxide was 1:0.5 (=PCzPA:molybdenum(VI) oxide). Note that the co-evaporation method refers to an evaporation method in which evaporation is carried out from a plurality of evaporation sources at the same time in one treatment chamber.

After that, PCzPA alone was deposited to a thickness of 30 nm by an evaporation method using resistance heating, thereby forming the second layer 412 including PCzPA, corresponding to the second organic compound.

Next, PCzPA and N,N'-bis[4-(9-phenyl-9H-fluoren-9-yl)phenyl]-N,N-diphenylpyrene-1,6-diamine (abbreviation: 1,6FLPAPrn) were co-evaporated to form the first light-emitting layer 421 including PCzPA corresponding to the third organic compound and 1,6FLPAPrn corresponding to the first light-emitting substance which has a hole-trapping property with respect to PCzPA. The thickness of the first light-emitting layer 421 was 20 nm. The evaporation rate was controlled such that the weight ratio of PCzPA to 1,6FLPAPrn was 1:0.05 (=PCzPA:1,6FLPAPrn).

Next, 9-[4-(10-phenyl-9-anthryl)phenyl]-9H-carbazole (abbreviation: CzPA) and 1,6FLPAPrn were co-evaporated to form the second light-emitting layer 422 including CzPA corresponding to the fourth organic compound and 1,6FLPAPrn corresponding to the second light-emitting substance which has a hole-trapping property with respect to CzPA. The thickness of the second light-emitting layer 422 was 25 nm. The evaporation rate was controlled such that the weight ratio of CzPA to 1,6FLPAPrn was 1:0.05 (=CzPA:1,6FLPAPrn).

As described in the above embodiment, the hole-transport skeletons of PCzPA corresponding to the first, second, and third organic compounds and CzPA corresponding to the fourth organic compound are each anthracene. Further, the electron-transport skeletons of the compounds are each anthracene. Still, PCzPA and CzPA are different compounds, and hence a bipolar heterojunction is formed between the first light-emitting layer 421 and the second light-emitting layer 422.

After that, tris(8-quinolinolato)aluminum (abbreviation: Alq) was deposited to a thickness of 10 nm and bathophenanthroline (abbreviation: BPhen) was deposited to a thickness of 15 nm to form the electron-transport layer 413. Further, lithium fluoride was deposited to a thickness of 1 nm to form the electron-injection layer 414.

Lastly, a 200-nm-thick aluminum film was formed by an evaporation method using resistance heating, whereby the cathode 402 was formed. Thus, Light-emitting Element 1 was fabricated.

(Reference Light-Emitting Element A)

For comparison, Reference Light-emitting Element A was fabricated with another compound which replaces the organic compound (PCzPA) used for the first layer 411 and the second layer 412 of Light-emitting Element 1.

Reference Light-emitting Element A was fabricated as follows. First of all, 4-phenyl-4'-(9-pheny-9H-1fluoren-9-yl)triphenylamine (abbreviation: BPAFLP) and molybdenum(VI) oxide were co-evaporated over the anode 401 to form the first layer 411. The evaporation was performed using resistance heating. The thickness of the first layer 411 was 50 nm. The evaporation rate was controlled such that the weight ratio of BPAFLP to molybdenum(VI) oxide was 1:0.5 (=BPAFLP:molybdenum(VI) oxide).

After that, BPAFLP alone was deposited to a thickness of 10 nm by an evaporation method using resistance heating, thereby forming the second layer 412.

Next, the same layer as the first light-emitting layer 421 of Light-emitting Element 1 was formed. The second light-emitting layer 422 was formed to be similar to that of Light-emitting Element 1 except that the thickness of the second light-emitting layer 422 was 30 nm instead of 25 nm.

Furthermore, the electron-transport layer 413, the electron-injection layer 414, and the cathode 402 were the same as those of Light-emitting Element 1.

(Reference Light-Emitting Element B)

For comparison, Reference Light-emitting Element B was fabricated without forming a layer corresponding to the second layer 412 of Light-emitting Element 1.

Reference Light-emitting Element B was fabricated as follows. First, the first layer 411 was formed over the anode 401 to have the same structure as in Light-emitting Element 1. Next, without providing the second layer 412, the first light-emitting layer 421 was formed to have the same structure as in Light-emitting Element 1. The second light-emitting layer 422 was formed to be similar to that of Light-emitting Element 1 except that the thickness of the second light-emitting layer 422 was 30 nm instead of 25 nm.

Furthermore, the electron-transport layer 413, the electron-injection layer 414, and the cathode 402 were the same as those of Light-emitting Element 1.

Table 1 below summarizes the element structures of Light-emitting Element 1 and Reference Light-emitting Elements A and B, which were fabricated.

TABLE 1

| | 401 | 411 | 412 | 421 | 422 | 413 | 414 | 402 |
|---|---|---|---|---|---|---|---|---|
| Light-emitting Element 1 | ITSO 110 nm | PCzPA:MoOx (=1:0.5) 50 nm | PCzPA 30 nm | PCzPA:1,6-FLPAPrn (=1:0.05) 20 nm | CzPA:1,6-FLPAPrn (=1:0.05) 25 nm | Alq 10 nm | Bphen 15 nm | LiF 1 nm | Al 200 nm |
| Reference Light-emitting Element A | ITSO 110 nm | BPAFLP:MoOx (=1:0.5) 50 nm | BPAFLP 10 nm | PCzPA:1,6-FLPAPrn (=1:0.05) 20 nm | CzPA:1,6-FLPAPrn (=1:0.05) 30 nm | Alq 10 nm | Bphen 15 nm | LiF 1 nm | Al 200 nm |
| Reference Light-emitting Element B | ITSO 110 nm | PCzPA:MoOx (=1:0.5) 50 nm | — | PCzPA:1,6-FLPAPrn (=1:0.05) 20 nm | CzPA:1,6-FLPAPrn (=1:0.05) 30 nm | Alq 10 nm | Bphen 15 nm | LiF 1 nm | Al 200 nm |

(Evaluation of Elements)

Light-emitting Element 1 and Reference Light-emitting Elements A and B which were obtained as above were sealed so that the elements were not exposed to atmospheric air in a glove box under a nitrogen atmosphere. Then, the operating characteristics of these light-emitting elements were measured. Note that the measurement was carried out at room temperature (in an atmosphere kept at 25° C.).

Figure 17A:
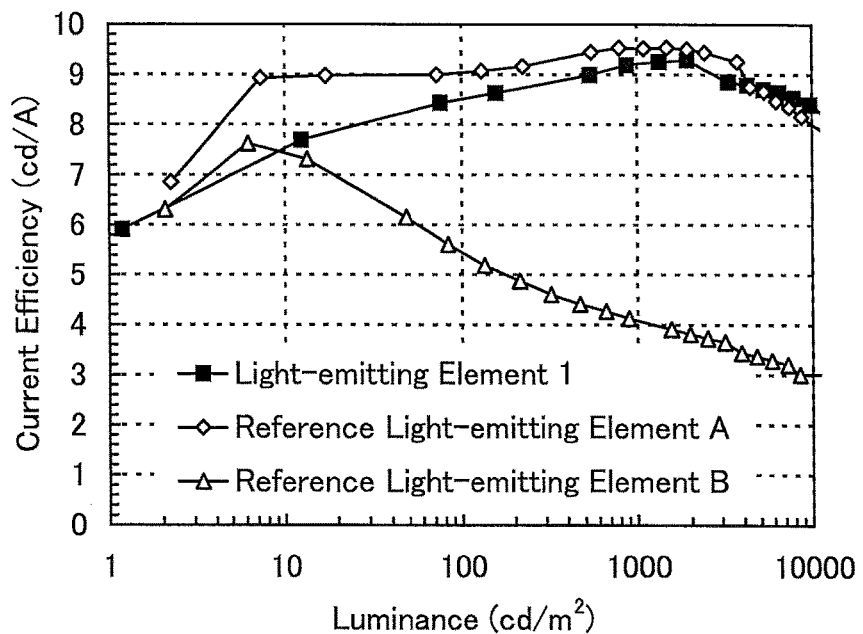
FIGS. 17A and 17B are diagrams for describing light-emitting elements according to Example.
Figure 17B:
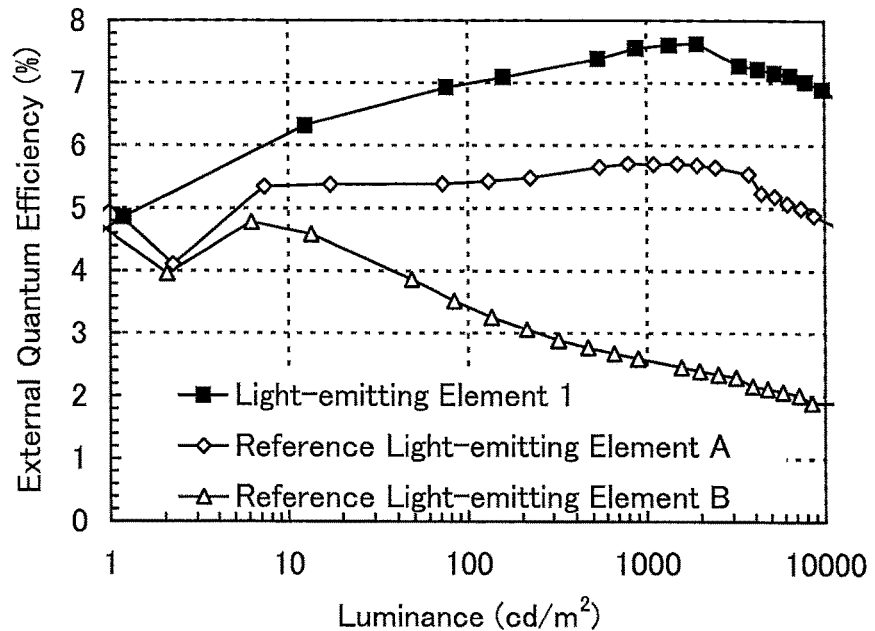
Figure 18:
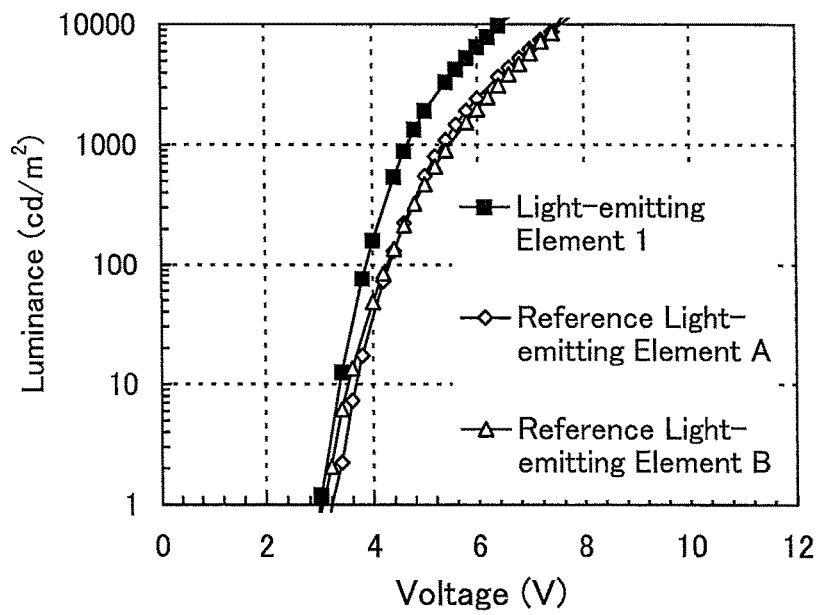
FIG. 18 is a diagram for describing light-emitting elements according to Example.
Figure 19:
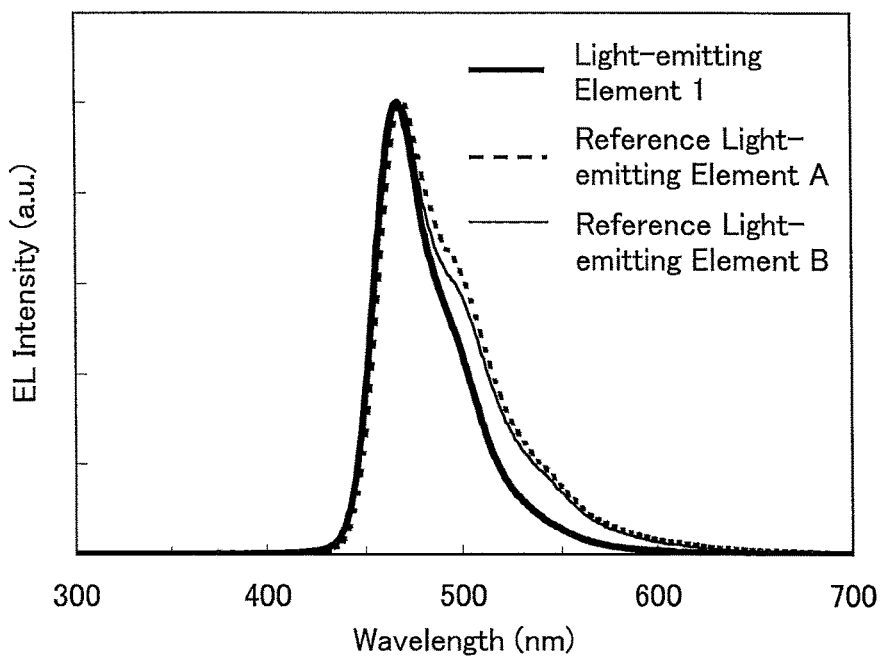
FIG. 19 is a diagram for describing light-emitting elements according to Example.

FIG. 17A shows luminance vs. current efficiency characteristics of Light-emitting Element 1 and Reference Light-emitting Elements A and B, FIG. 17B shows luminance vs. external quantum efficiency characteristics, and FIG. 18 shows voltage vs. luminance characteristics. FIG. 19 shows emission spectra when the elements were made to emit light at a current density of 25 mA/cm$^2$.

Light-emitting Element 1 exhibited excellent characteristics when it was made to emit light at a luminance of 1000 cd/m$^2$: a drive voltage of 4.6 V, a current efficiency of 9.3 cd/A, an external quantum efficiency of 7.5%, and a power efficiency of 6.3 [lm/W]. In particular, the value of the external quantum efficiency is extremely high such that conventional fluorescent elements cannot achieve this value. FIG. 19 shows a sharp emission spectrum due to 1,6-FLPAPrn in Light-emitting Element 1; pure blue light with CM chromaticity coordinates, (x, y)=(0.14, 0.18), was emitted.

As for Reference Light-emitting Element A, the external quantum efficiency remains at the 5% level, and the emission efficiency is not so much high as Light-emitting element 1. Further, the drive voltage is found to exceed that of Light-emitting Element 1. The current efficiency is high, but this is because a shoulder peak appears on the long wavelength side as apparent from FIG. 19 and the color purity decreases (CIE chromaticity coordinates, (x, y)=(0.16, 0.25)).

The possible reason why Reference Light-emitting Element A is inferior in drive voltage and emission efficiency to Light-emitting Element 1 will be given below. The HOMO level of BPAFLP used for the first layer 411 and the second layer 412 in Reference Light-emitting Element A is −5.51 eV according to CV measurement, while the HOMO level of PCzPA used for the first light-emitting layer in Light-emitting Element 1 is −5.79 eV as described in Example 1. That is, there is a hole-injection barrier of nearly 0.3 eV between the second layer and the first light-emitting layer. This might lead to the inferior characteristics.

On the other hand, Reference Light-emitting Element B exhibits relatively high external quantum efficiency and current efficiency in a low luminance region, but the efficiencies greatly decrease in a high luminance region. This may be because electrons pass to the anode side to reduce recombination efficiency in the high luminance region. Therefore the second layer 412, in which a substance having a hole-trapping property is not added, plays an important role in Light-emitting Element 1.

Figure 20A:
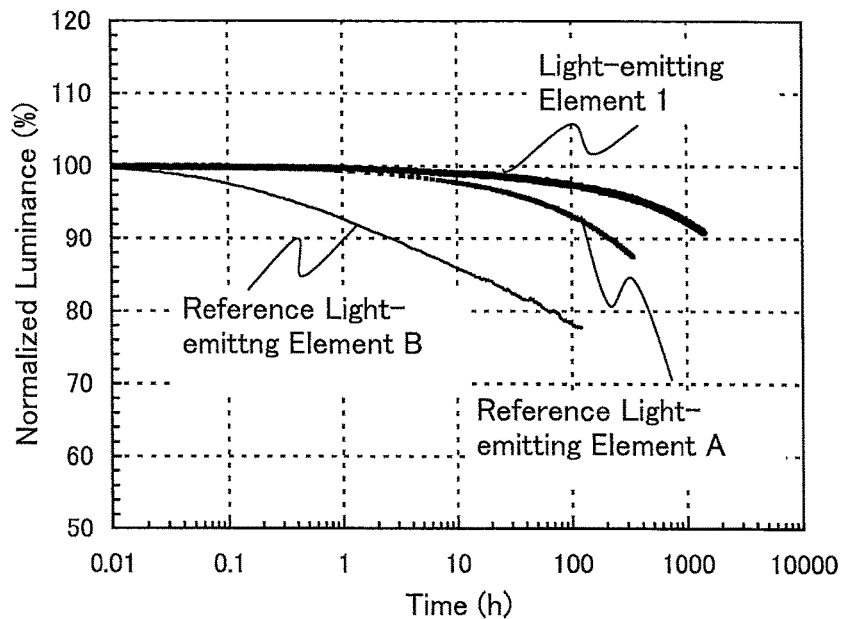
FIGS. 20A and 20B are diagrams for describing light-emitting elements according to Example.
Figure 20B:
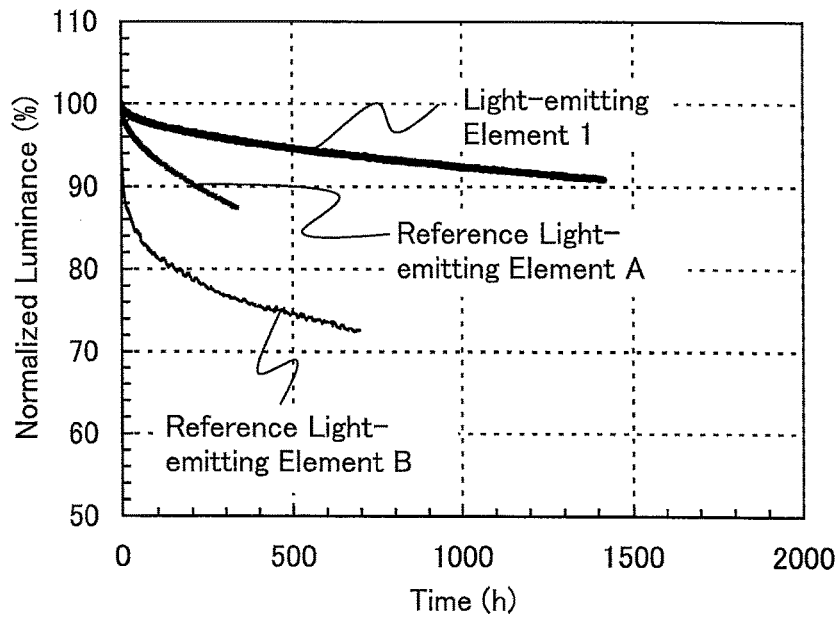

Next, tests for Light-emitting Element 1 and Reference Light-emitting Elements A and B were carried out in such a manner that the elements were driven to continue emitting light at a constant current of an initial luminance of 1000 cd/m$^2$. The results are shown in FIGS. 20A and 20B. In FIGS. 20A and 20B, the vertical axis represents normalized luminance with an initial luminance of 100% and the horizontal axis represents driving time. The horizontal axis (driving time) in FIG. 20A is a log scale, and that in FIG. 20B is a linear scale.

FIGS. 20A and 20B demonstrate that Light-emitting Element 1 kept 92% or more of the initial luminance even after 1000 hours and has a very long lifetime. On the other hand, Reference Light-emitting Element A decreases in luminance to about 90% of the initial luminance after driving for about 200 hours. This might be affected by the above-mentioned barrier to hole injection from BPAFLP to PCzPA. As can be seen from FIG. 20B, Reference Light-emitting Element B does not greatly deteriorate in the long term but has the problem of significant initial deterioration.

The above results demonstrate that Light-emitting Element 1 which is one embodiment of the present invention can achieve both very high emission efficiency and a very long lifetime.

Here, accelerated tests for the luminance of Light-emitting Element 1 were carried out to estimate the luminance half life at an initial luminance of 1000 cd/m$^2$. In the accelerated tests for the luminance, elements having the same structure as Light-emitting Element 1 were driven at a constant current by setting the initial luminance to 3000 cd/m$^2$, 5000 cd/m$^2$, 8000 cd/m$^2$, 10000 cd/m$^2$, 12000 cd/m$^2$, and 15000 cd/m$^2$. Then, the luminance half life at each luminance was determined, and from the correlation plot between initial luminance and luminance half life, the luminance half life at an initial luminance of 1000 cd/m$^2$ was estimated.

Figure 21A:
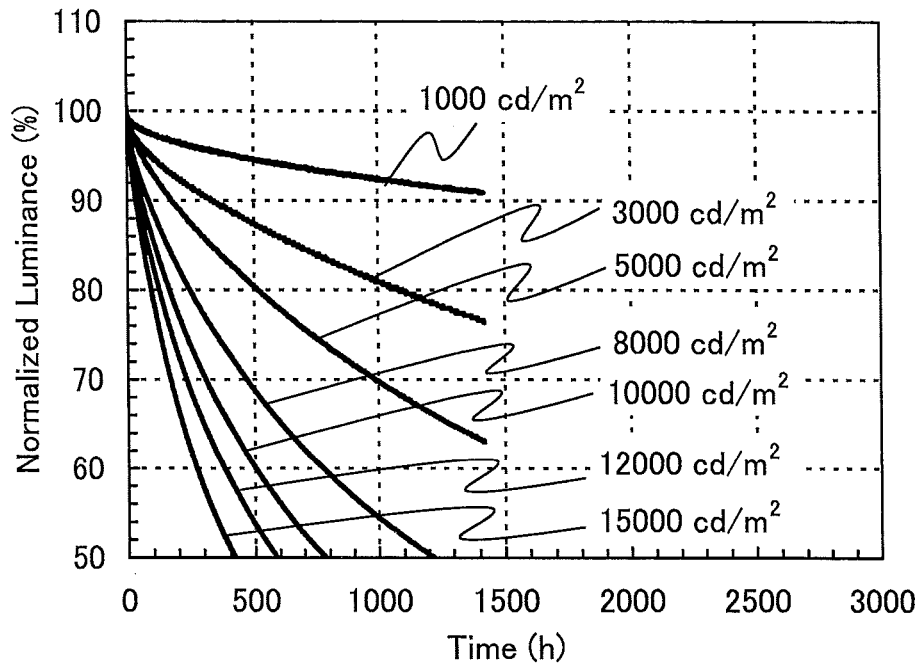
FIGS. 21A and 21B are diagrams for describing light-emitting elements according to Example.
Figure 21B:
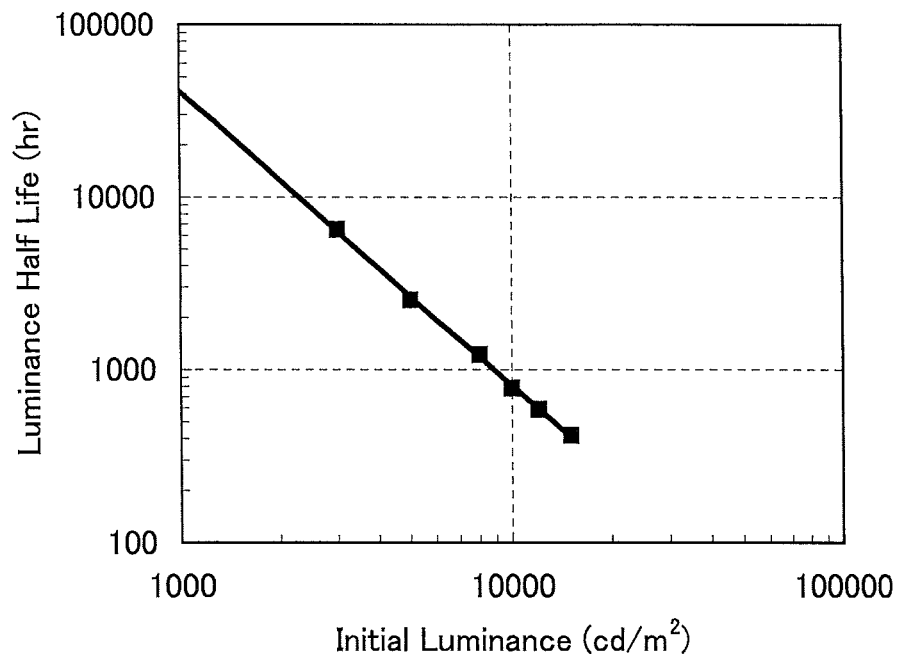

FIG. 21A shows the results of the accelerated tests for the luminance, and FIG. 21B the correlation plot between initial luminance and luminance half life. At an initial luminance of each of 3000 cd/m$^2$ and 5000 cd/m$^2$, because the luminance was not reduced to half yet, a deterioration curve was extrapolated to estimate the luminance half life. Table 2 below summarizes the results of the accelerated tests for the luminance.

TABLE 2

| Initial luminance (cd/m$^2$) | Luminance half life (Hr) |
|---|---|
| 3,000 | 6,500* |
| 5,000 | 2,600* |
| 8,000 | 1,222 |

TABLE 2-continued

| Initial luminance (cd/m$^2$) | Luminance half life (Hr) |
|---|---|
| 10,000 | 783 |
| 12,000 | 589 |
| 15,000 | 417 |

*extrapolation value

The results in Table 2 are plotted as the correlation plot between initial luminance and luminance half life in FIG. 21B. It is found that the luminance half life of Light-emitting Element 1 is inversely proportional to the 1.7th power of the initial luminance to show a strong correlation. Further, from these results, the luminance half life at an initial luminance of 1000 cd/m$^2$ is estimated as 42000 hours, which is indicative of a very long lifetime.

EXAMPLE 3

Example 3 will provide descriptions of fabrication examples and characteristics of light-emitting elements which are embodiments of the present invention together with reference examples. Structural Formulae of materials used in Example 3 are illustrated below. Note that the structural formulae of materials also used in Example 2 are omitted.

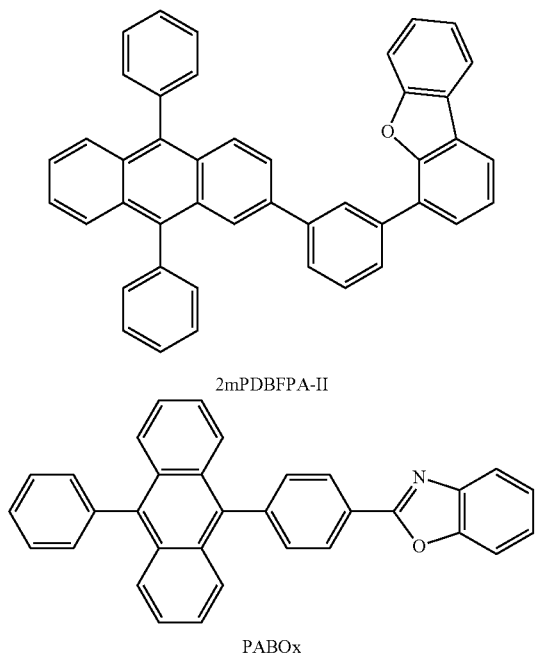

2mPDBFPA-II

PABOx

To begin with, a method of fabricating the light-emitting element (Light-emitting Element 2) which is one embodiment of the present invention will be described. FIG. 5 illustrates the element structure.

(Light-Emitting Element 2)

First, a glass substrate, over which an indium tin oxide containing silicon oxide (abbreviation: ITSO) film was formed to a thickness of 110 nm as the anode 401, was prepared. The periphery of a surface of the ITSO film was covered with a polyimide film so that a 2 mm square portion of the surface was exposed. The electrode area was set to 2 mm×2 mm. As a pretreatment for forming the light-emitting element over this substrate, the surface of the substrate was washed with water and baked at 200° C. for one hour, and then a UV ozone treatment was performed for 370 seconds. Then, the substrate was transferred into a vacuum evaporation apparatus where the pressure was reduced to about 10$^{-5}$ Pa. In a heating chamber of the vacuum evaporation apparatus, baking was performed at 170° C. for 30 minutes in vacuum. After that, the substrate was cooled down for about 30 minutes.

Next, the glass substrate provided with the anode 401 was fixed to a substrate holder provided in a film formation chamber of the vacuum evaporation apparatus such that the surface on which the anode 401 was formed was faced downward.

Then, first of all, 9-phenyl-3-[4-(10-phenyl-9-anthryl) phenyl]-9H-carbazole (abbreviation: PCzPA) and molybdenum(VI) oxide were co-evaporated over the anode 401, thereby forming the first layer 411 in which molybdenum oxide corresponding to the electron-accepting compound, was added to PCzPA corresponding to the first organic compound. The evaporation was performed using resistance heating. The thickness of the first layer 411 was 50 nm. The evaporation rate was controlled such that the weight ratio of PCzPA to molybdenum(VI) oxide was 1:0.5 (=PCzPA:molybdenum(VI) oxide). Note that the co-evaporation method refers to an evaporation method in which evaporation is carried out from a plurality of evaporation sources at the same time in one treatment chamber.

After that, 4-[3-(9,10-diphenyl-2-anthryl)phenyl]dibenzofuran (abbreviation: 2 mPDBFPA-II) alone was deposited to a thickness of 501 nm by an evaporation method using resistance heating, whereby the second layer 412 including 2 mPDBFPA-II, corresponding to the second organic compound, was formed.

Next, 2 mPDBFPA-II and N,N'-bis[4-(9-phenyl-9H-fluoren-9-yl)phenyl]-N,N'-diphenylpyrene-1,6-diamine (abbreviation: 1,6FLPAPm) were co-evaporated to form the first light-emitting layer 421 including 2 mPDBFPA-II corresponding to the third organic compound and 1,6FLPAPrn corresponding to the first light-emitting substance which has a hole-trapping property with respect to 2 mPDBFPA-II. The thickness of the first light-emitting layer 421 was 10 nm. The evaporation rate was controlled such that the weight ratio of 2 mPDBFPA-II to 1,6FLPAPrn was 1:0.05 (=2 mPDBFPA-II:1,6FLPAPrn).

Next, 9-[4-(10-phenyl-9-anthryl)phenyl]-9H-carbazole (abbreviation: CzPA) and 1,6FLPAPrn were co-evaporated to form the second light-emitting layer 422 including CzPA corresponding to the fourth organic compound and 1,6FLPAPrn corresponding to the second light-emitting substance which has a hole-trapping property with respect to CzPA. The thickness of the second light-emitting layer 422 was 25 nm. The evaporation rate was controlled such that the weight ratio of CzPA to 1,6FLPAPrn was 1:0.05 (=CzPA:1,6FLPAPrn).

As described in the above embodiment, the hole-transport skeletons of PCzPA corresponding to the first organic compound, 2 mPDBFPA-II corresponding to the second and third organic compounds, and CzPA corresponding to the fourth organic compound are each anthracene. Further, the bipolar heterojunction is formed as in Example 2.

After that, 2-[4-(10-phenyl-9-anthryl)phenyl]benzoxazole (abbreviation: PABOx) was deposited to a thickness of 10 nm and bathophenanthroline (abbreviation: BPhen) was deposited to a thickness of 15 nm to form the electron-transport layer 413. Further, lithium fluoride was deposited to a thickness of 1 nm to form the electron-injection layer 414.

Lastly, a 200-nm-thick aluminum film was formed by an evaporation method using resistance heating, whereby the cathode 402 was formed. Thus, Light-emitting Element 2 was fabricated.

(Evaluation of Element)

Light-emitting Element 2 obtained as above was sealed so that the element was not exposed to atmospheric air in a glove box under a nitrogen atmosphere. Then, the operating characteristics of Light-emitting Element 2 were measured. Note that the measurement was carried out at room temperature (in an atmosphere kept at 25° C.).

Figure 22A:
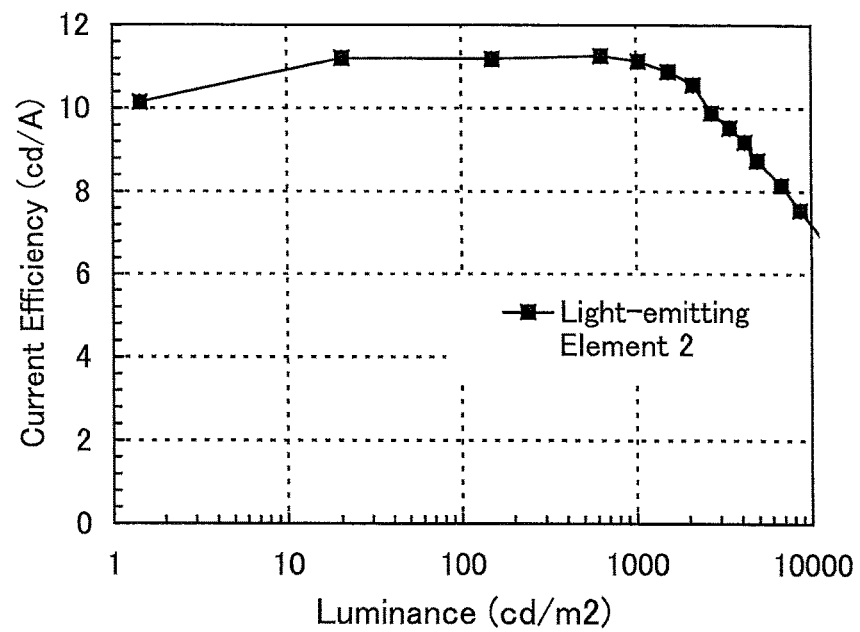
FIGS. 22A and 22B are diagrams for describing a light-emitting element according to Example.
Figure 22B:
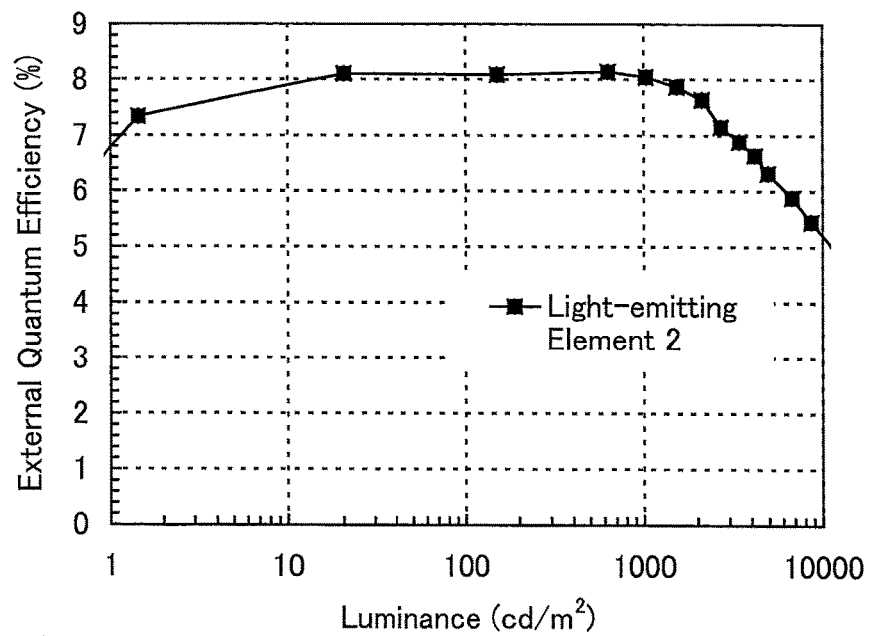
Figure 23:
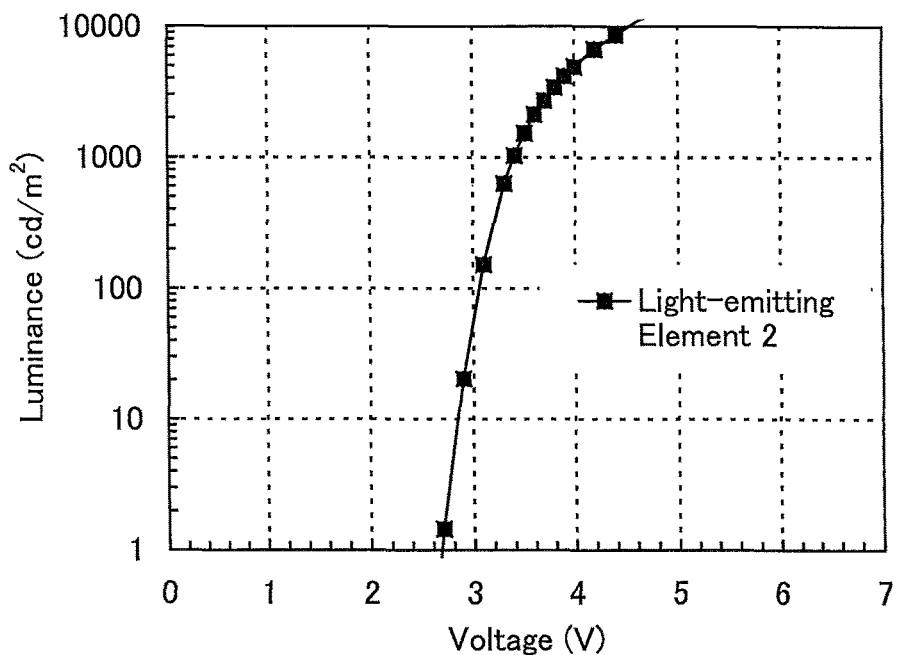
FIG. 23 is a diagram for describing a light-emitting element according to Example.
Figure 24:
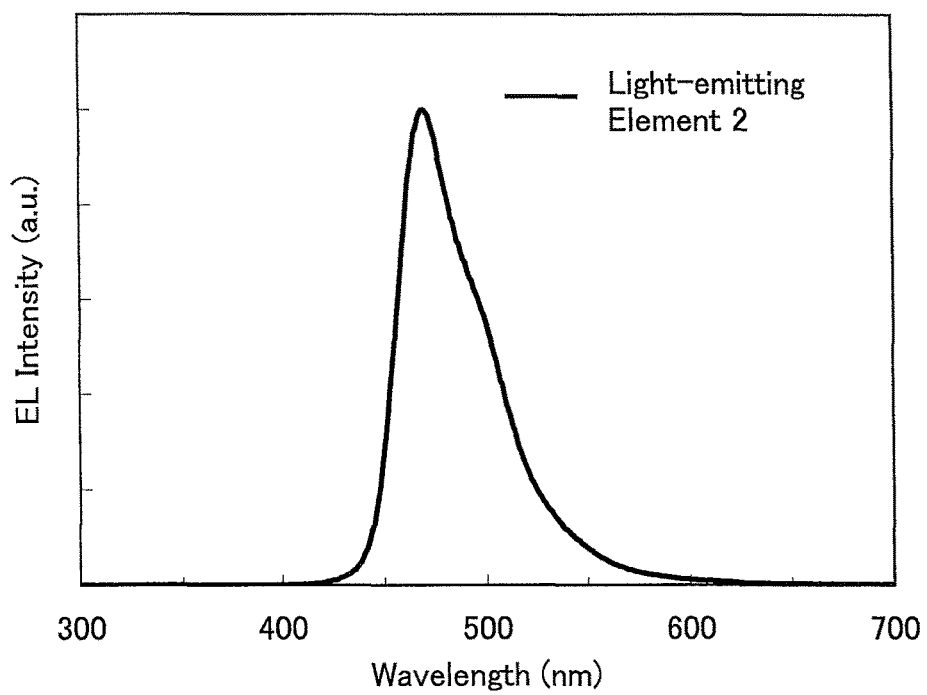
FIG. 24 is a diagram for describing a light-emitting element according to Example.

FIG. 22A shows luminance vs. current efficiency characteristics of Light-emitting Element 2, FIG. 22B shows luminance vs. external quantum efficiency characteristics, and FIG. 23 shows voltage vs. luminance characteristics. FIG. 24 shows an emission spectrum when the element was made to emit light at a current density of 25 mA/cm$^2$.

Light-emitting Element 2 exhibited excellent characteristics when it was made to emit light at a luminance of 1000 cd/m$^2$: a drive voltage of 3.4 V, a current efficiency of 11 cd/A, an external quantum efficiency of 8.0%, and a power efficiency of 10 [lm/W]. In particular, the value of the external quantum efficiency is extremely high such that conventional fluorescent elements cannot achieve this value. FIG. 24 shows a sharp emission spectrum due to 1,6-FLPAPrn in Light-emitting Element 2; blue light with CIE chromaticity coordinates, (x, y)=(0.14, 0.21), was emitted.

Figure 25:
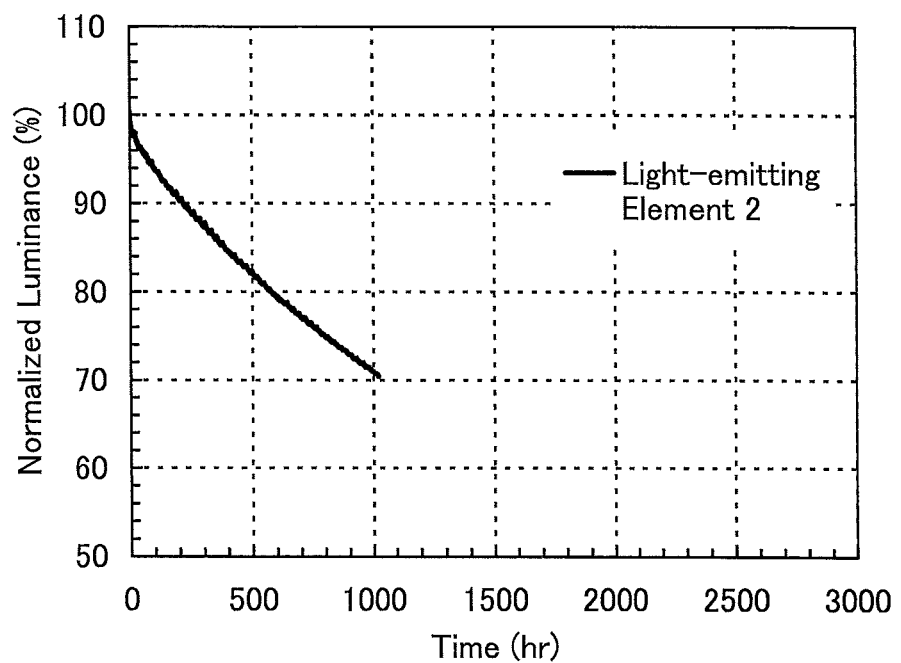
FIG. 25 is a diagram for describing a light-emitting element according to Example.

Next, tests for Light-emitting Element 2 were carried out in such a manner that the elements were driven to continue emitting light at a constant current of an initial luminance of 5000 cd/m$^2$. The results are shown in FIG. 25. In FIG. 25, the vertical axis represents normalized luminance with an initial luminance of 100% and the horizontal axis represents driving time. The horizontal axis (driving time) is a linear scale.

From FIG. 25, the luminance half life of Light-emitting Element 2 at an initial luminance of 5000 cd/m$^2$ is estimated as 2500 hours or more. This is substantially equal to the luminance half life of Light-emitting Element 1 at an initial luminance of 5000 cd/m$^2$ which is described in Example 2. Consequently, with the same accelerating factor for luminance, the luminance half life of Light-emitting Element 2 at an initial luminance of 1000 cd/m$^2$ is estimated as 40000 hours or more like Light-emitting Element 1. Thus, Light-emitting Element 2 has an extremely long lifetime.

The above results demonstrate that Light-emitting Element 2 which is one embodiment of the present invention can achieve both very high emission efficiency and a very long lifetime. In particular, the element achieves a long lifetime while having a power efficiency exceeding 10 [lm/W], and is accordingly considered to have sufficient performance as a light-emitting component which emits blue light for lighting.

EXAMPLE 4

Example 4 will provide descriptions of fabrication examples and characteristics of light-emitting elements which are embodiments of the present invention together with reference examples. Note that the structural formulae of materials also used in Examples 2 and 3 are omitted.

To begin with, a method of fabricating the light-emitting element (Light-emitting Element 3) which is one embodiment of the present invention will be described. FIG. 3 illustrates the element structure.

(Light-Emitting Element 3)

First, a glass substrate, over which an indium tin oxide containing silicon oxide (abbreviation: ITSO) film was formed to a thickness of 110 nm as the anode 101, was prepared. The periphery of a surface of the ITSO film was covered with a polyimide film so that a 2 mm square portion of the surface was exposed. The electrode area was set to 2 mm×2 mm. As a pretreatment for forming the light-emitting element over this substrate, the surface of the substrate was washed with water and baked at 200° C. for one hour, and then a UV ozone treatment was performed for 370 seconds. Then, the substrate was transferred into a vacuum evaporation apparatus where the pressure was reduced to about 10$^{-5}$ Pa. In a heating chamber of the vacuum evaporation apparatus, baking was performed at 170° C. for 30 minutes in vacuum. After that, the substrate was cooled down for about 30 minutes.

Next, the glass substrate provided with the anode 101 was fixed to a substrate holder provided in a film formation chamber of the vacuum evaporation apparatus such that the surface on which the anode 101 was formed was faced downward.

Then, first of all, 9-phenyl-3-[4-(10-phenyl-9-anthryl) phenyl]-9H-carbazole (abbreviation: PCzPA) and molybdenum(VI) oxide were co-evaporated over the anode 101, thereby forming the first layer 111 in which molybdenum oxide corresponding to the electron-accepting compound, was added to PCzPA corresponding to the first organic compound. The evaporation was performed using resistance heating. The thickness of the first layer 111 was 70 nm. The evaporation rate was controlled such that the weight ratio of PCzPA to molybdenum(VI) oxide was 1:0.5 (=PCzPA:molybdenum(VI) oxide). Note that the co-evaporation method refers to an evaporation method in which evaporation is carried out from a plurality of evaporation sources at the same time in one treatment chamber.

After that, PCzPA alone was deposited to a thickness of 30 nm by an evaporation method using resistance heating, whereby the second layer 112 including PCzPA, corresponding to the second organic compound, was formed.

Next, 9-[4-(10-phenyl-9-anthryl)phenyl]-9H-carbazole (abbreviation: CzPA) and N,N'-bis[4-(9-phenyl-9H-fluoren-9-yl)phenyl]-N,N'-diphenylpyrene-1,6-diamine (abbreviation: 1,6FLPAPrn) were co-evaporated to form the light-emitting layer 121 including CzPA corresponding to the third organic compound and 1,6FLPAPrn corresponding to the light-emitting substance which has a hole-trapping property with respect to CzPA. The thickness of the light-emitting layer 121 was 20 nm. The evaporation rate was controlled such that the weight ratio of CzPA to 1,6FLPAPrn was 1:0.05 (=CzPA:1,6FLPAPrn).

As described in the above embodiment, the hole-transport skeletons of PCzPA corresponding to the first and second organic compounds and CzPA corresponding to the third organic compound are each anthracene. Further, the bipolar heterojunction is formed as in Examples 2 and 3.

After that, CzPA was deposited to a thickness of 10 nm and bathophenanthroline (abbreviation: BPhen) was deposited to a thickness of 15 nm to form the electron-transport layer 113. Further, lithium fluoride was deposited to a thickness of 1 nm to form the electron-injection layer 114.

Lastly, a 200-nm-thick aluminum film was formed by an evaporation method using resistance heating, whereby the cathode 102 was formed. Thus, Light-emitting Element 3 was fabricated.

(Evaluation of Element)

Light-emitting Element 3 obtained as above was sealed so that the element was not exposed to atmospheric air in a glove box under a nitrogen atmosphere. Then, the operating characteristics of Light-emitting Element 3 were measured. Note that the measurement was carried out at room temperature (in an atmosphere kept at 25° C.).

Figure 32:
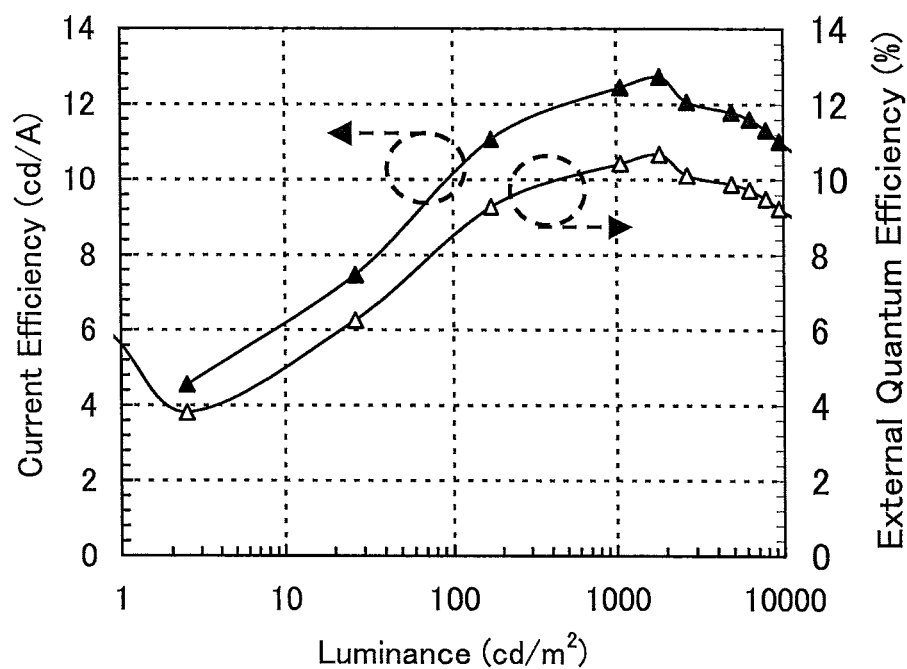
FIG. 32 is a diagram for describing a light-emitting element according to Example.
Figure 33:
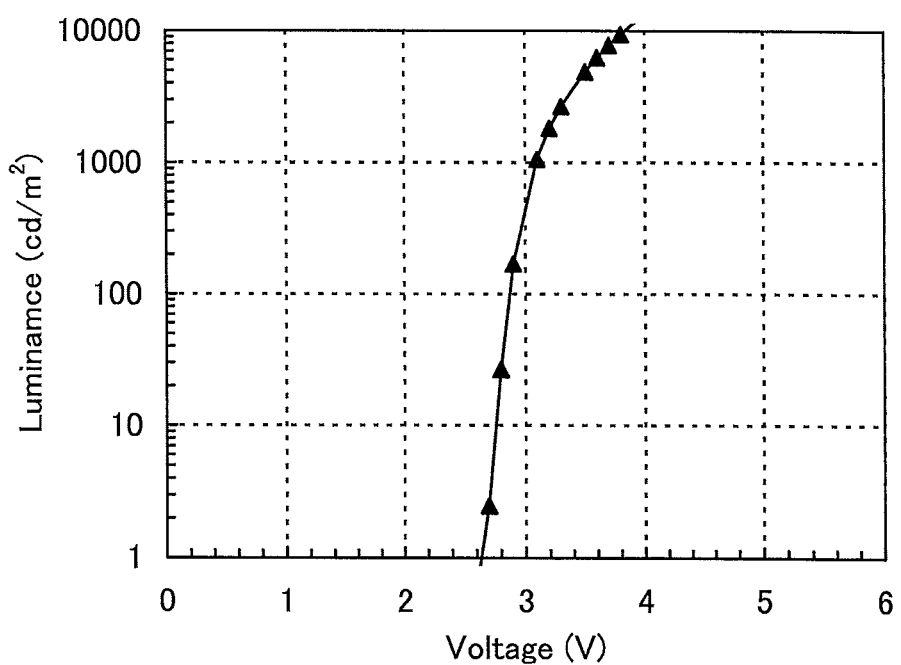
FIG. 33 is a diagram for describing a light-emitting element according to Example.
Figure 34:
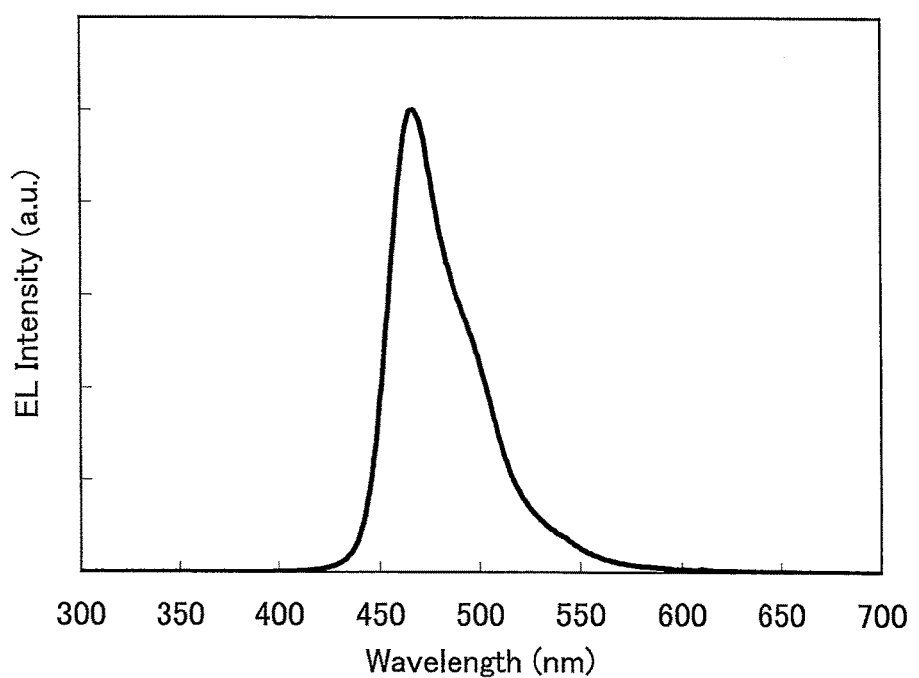
FIG. 34 is a diagram for describing a light-emitting element according to Example.

FIG. 32 shows luminance vs. current efficiency characteristics and external quantum efficiency characteristics of Light-emitting Element 3, and FIG. 33 shows voltage vs. luminance characteristics. FIG. 34 shows an emission spectrum when the element was made to emit light at a current density of 25 mA/cm$^2$.

Light-emitting Element 3 exhibited excellent characteristics when it was made to emit light at a luminance of 1000 cd/m$^2$: a drive voltage of 3.1 V, a current efficiency of 12 cd/A, an external quantum efficiency of 10.0%, and a power efficiency of 13 [lm/W]. In particular, the value of the external quantum efficiency is extremely high such that conventional fluorescent elements cannot achieve this value. According to FIG. 34, as the emission spectrum of Light-emitting Element 3, a sharp spectrum with a peak at 467 nm was obtained; blue light with CIE chromaticity coordinates, (x, y)=(0.14, 0.17), was emitted.

Next, drive tests were carried out at a constant current of an initial luminance of 5000 cd/m$^2$, whereby the luminance half life was 810 hours. Since the results in Examples 2 and 3 show that the luminance half life is inversely proportional to the 1.7th power of the initial luminance, the luminance half life at an initial luminance of 1000 cd/m$^2$ is calculated at 12000 hours.

The above results demonstrate that Light-emitting Element 3 which is one embodiment of the present invention can achieve an extremely low drive voltage, very high emission efficiency, and a very long lifetime. In particular, the element achieves a long lifetime while having a power efficiency exceeding 10 [lm/W], and is accordingly considered to have sufficient performance as a light-emitting component which emits blue light for lighting.

This application is based on Japanese Patent Application serial no. 2009-273987 filed with the Japan Patent Office on Dec. 1, 2009, the entire contents of which are hereby incorporated by reference.

What is claimed is:

1. A light-emitting element comprising:
   between an anode and a cathode, at least a stack structure including a first layer, a second layer, and a light-emitting layer, wherein the first layer is between the anode and the second layer, the second layer is between the first layer and the light-emitting layer, and the light-emitting layer is between the second layer and the cathode,
   wherein the first layer comprises a first organic compound having a first hole-transport skeleton and an electron-accepting compound,
   wherein the second layer comprises a second organic compound having a second hole-transport skeleton,
   wherein the light-emitting layer comprises a third organic compound having a third hole-transport skeleton and a light-emitting substance having a hole-trapping property with respect to the third organic compound,
   wherein the second organic compound and the third organic compound are the same, and
   wherein the first hole-transport skeleton and the second hole-transport skeleton each separately comprise a skeleton of at least any one of a π excessive heteroaromatic ring, a tricyclic condensed aromatic hydrocarbon ring, and a tetracyclic condensed aromatic hydrocarbon ring.

2. The light-emitting element according to claim 1, wherein the light-emitting substance is an aromatic amine compound or an organometallic complex.

3. The light-emitting element according to claim 1, wherein the light-emitting substance is a pyrene diamine compound or an iridium complex.

4. The light-emitting element according to claim 1, wherein a HOMO level of the first organic compound is greater than or equal to −6.0 eV and less than or equal to −5.7 eV.

5. The light-emitting element according to claim 1, comprising a plurality of the stack structures between the anode and the cathode.

6. A light-emitting device comprising the light-emitting element according to claim 1.

7. An electronic device comprising the light-emitting device according to claim 6.

8. A lighting device comprising the light-emitting device according to claim 6.

9. The light-emitting element according to claim 1, wherein the skeleton of at least any one of the π excessive heteroaromatic ring, the tricyclic condensed aromatic hydrocarbon ring, and the tetracyclic condensed aromatic hydrocarbon ring is a skeleton of at least any one of carbazole, dibenzofuran, dibenzothiophene, and anthracene.

10. A light-emitting element comprising:
    between an anode and a cathode, at least a stack structure including a first layer, a second layer, a first light-emitting layer, and a second light-emitting layer, wherein the first layer is between the anode and the second layer, the second layer is between the first layer and the first light-emitting layer, the first light-emitting layer is between the second layer and the second light-emitting layer, and the second light-emitting layer is between the first light-emitting layer and the cathode,
    wherein the first layer comprises a first organic compound having a first hole-transport skeleton and an electron-accepting compound,
    wherein the second layer comprises a second organic compound having a second hole-transport skeleton,
    wherein the first light-emitting layer comprises: a third organic compound having a third hole-transport skeleton and an electron-transport skeleton; and a first light-emitting substance having a hole-trapping property with respect to the third organic compound,
    wherein the second light-emitting layer comprises: a fourth organic compound having a fourth hole-transport skeleton and the electron-transport skeleton; and a second light-emitting substance having a hole-trapping property with respect to the fourth organic compound,
    wherein the fourth organic compound and the third organic compound are different compounds,
    wherein the second organic compound and the third organic compound are the same, and
    wherein the first hole-transport skeleton, the second hole-transport skeleton and the fourth hole-transport skeleton each separately comprise a skeleton of at least any one of a π excessive heteroaromatic ring, a tricyclic condensed aromatic hydrocarbon ring, and a tetracyclic condensed aromatic hydrocarbon ring.

11. The light-emitting element according to claim 10, wherein a hole-transport property of the third organic compound is higher than a hole-transport property of the fourth organic compound, and wherein an electron-transport property of the third organic compound is lower than an electron-transport property of the fourth organic compound.

12. The light-emitting element according to claim 10, wherein the first light-emitting substance and the second light-emitting substance are each separately an aromatic amine compound or an organometallic complex.

13. The light-emitting element according to claim 10, wherein the first light-emitting substance and the second light-emitting substance are each separately a pyrene diamine compound or an iridium complex.

14. The light-emitting element according to claim 10, wherein the first light-emitting substance and the second light-emitting substance are the same.

15. The light-emitting element according to claim 10, wherein a HOMO level of the first organic compound is greater than or equal to −6.0 eV and less than or equal to −5.7 eV.

16. The light-emitting element according to claim 10, comprising a plurality of the stack structures between the anode and the cathode.

17. A light-emitting device comprising the light-emitting element according to claim 10.

18. An electronic device comprising the light-emitting device according to claim 17.

19. A lighting device comprising the light-emitting device according to claim 17.

20. The light-emitting element according to claim 10, wherein the skeleton of at least any one of the π excessive heteroaromatic ring, the tricyclic condensed aromatic hydrocarbon ring, and the tetracyclic condensed aromatic hydrocarbon ring is a skeleton of at least any one of carbazole, dibenzofuran, dibenzothiophene, and anthracene.

21. A light-emitting element comprising:
between an anode and a cathode, at least a stack structure including a first layer, a second layer, and a light-emitting layer, wherein the first layer is between the anode and the second layer, the second layer is between the first layer and the light-emitting layer, and the light-emitting layer is between the second layer and the cathode,
wherein the first layer comprises a first organic compound having a first hole-transport skeleton and an electron-accepting compound,
wherein the second layer comprises a second organic compound having a second hole-transport skeleton,
wherein the light-emitting layer comprises a third organic compound having a third hole-transport skeleton and a light-emitting substance having a hole-trapping property with respect to the third organic compound,
wherein the second organic compound and the third organic compound are the same, and
wherein the first hole-transport skeleton and the second hole-transport skeleton separately comprise a skeleton of at least any one of an aromatic amine, a π excessive heteroaromatic ring, a tricyclic condensed aromatic hydrocarbon ring, and a tetracyclic condensed aromatic hydrocarbon ring.

22. The light-emitting element according to claim 21, wherein the light-emitting substance is an aromatic amine compound or an organometallic complex.

23. The light-emitting element according to claim 21, wherein the light-emitting substance is a pyrene diamine compound or an iridium complex.

24. The light-emitting element according to claim 21, wherein a HOMO level of the first organic compound is greater than or equal to −6.0 eV and less than or equal to −5.7 eV.

25. The light-emitting element according to claim 21, comprising a plurality of the stack structures between the anode and the cathode.

26. A light-emitting device comprising the light-emitting element according to claim 21.

27. An electronic device comprising the light-emitting device according to claim 26.

28. A lighting device comprising the light-emitting device according to claim 26.

29. The light-emitting element according to claim 1, wherein the first organic compound, the second organic compound and the third organic compound are the same.

30. The light-emitting element according to claim 10, wherein the first organic compound, the second organic compound and the third organic compound are the same.

31. The light-emitting element according to claim 21, wherein the first organic compound, the second organic compound and the third organic compound are the same.

* * * * *

UNITED STATES PATENT AND TRADEMARK OFFICE
CERTIFICATE OF CORRECTION

PATENT NO. : 9,698,354 B2  
APPLICATION NO. : 13/941827  
DATED : July 4, 2017  
INVENTOR(S) : Satoshi Seo et al.

Page 1 of 2

It is certified that error appears in the above-identified patent and that said Letters Patent is hereby corrected as shown below:

In the Specification

Column 12, Line 33; Change "minimized In" to --minimized. In--.

Column 13, Line 54; Change "2 mPDBFPA" to --2mPDBFPA--.

Column 13, Line 61; Change ", 1'1"]quaterphenyl" to --, 1'"]quaterphenyl--.

Column 14, Line 25; Change "of is to" to --of 1s to--.

Column 14, Line 57; Change "2 mPDBFPA" to --2mPDBFPA--.

Column 14, Line 59; Change "2 mPDBFPA" to --2mPDBFPA--.

Column 16, Line 28; Change "NnN-diphenyl" to --N,N-diphenyl--.

Column 17, Line 13; Change "2 mPDBFPA" to --2mPDBFPA--.

Column 17, Line 18; Change "2 mPDBFPA" to --2mPDBFPA--.

Column 18, Line 8; Change "diphenylstilbene" to --N, N'-diphenylstilbene--.

Column 18, Line 41; Change "FLPAPm)," to --FLPAPrn),--.

Column 20, Line 51; Change "2 mPDBFPA" to --2mPDBFPA--.

Column 20, Line 55; Change "2 mPDBFPA" to --2mPDBFPA--.

Signed and Sealed this  
Third Day of October, 2017

Joseph Matal  
*Performing the Functions and Duties of the*  
*Under Secretary of Commerce for Intellectual Property and*  
*Director of the United States Patent and Trademark Office*

CERTIFICATE OF CORRECTION (continued)
U.S. Pat. No. 9,698,354 B2

Column 20, Line 67; Change "[l, 1':2',1":2"]" to --[l, 1':2', 1":2", 1'"]--.

Column 27, Line 2; Change "2 mPDBFPA" to --2mPDBFPA--.

Column 28, Line 48; Change "FLPAPm," to --FLPAPrn,--.

Column 31, Line 48; Change "pyrazolypborate" to --pyrazolyl)borate--.

Column 31, Line 59; Change "aluminum(lll)" to --aluminum(III)--.

Column 37, Line 8; Change "A-N" to --A-A'--.

Column 38, Line 27; Change "(R, Q, and B)" to --(R, G, and B)--.

Column 51, Line 12; Change "mm As" to --mm. As--.

Column 51, Line 46; Change "N,N-diphenylpyrene" to --N,N'-diphenylpyrene--.

Column 52, Lines 26 thru 27; Change "(9-pheny-9H-lfluoren-9-yl)" to --(9-phenylfluoren-9-yl)--.

Column 53, Line 39; Change "CM chromaticity" to --CIE chromaticity--.

Column 56, Line 29; Change "2 mPDBFPA" to --2mPDBFPA--.

Column 56, Line 30; Change "501 nm" to --50 nm--.

Column 56, Line 32; Change "2 mPDBFPA" to --2mPDBFPA--.

Column 56, Line 34; Change "2 mPDBFPA" to --2mPDBFPA--.

Column 56, Line 36; Change "FLPAPm)" to --FLPAPrn)--.

Column 56, Line 37; Change "2 mPDBFPA" to --2mPDBFPA--.

Column 56, Line 40; Change "2 mPDBFPA" to --2mPDBFPA--.

Column 56, Line 43; Change "2 mPDBFPA" to --2mPDBFPA--.

Column 56, Line 43; Change "(=2 mPDBFPA" to --(=2mPDBFPA--.

Column 56, Line 57; Change "2 mPDBFPA" to --2mPDBFPA--.